(12) United States Patent
Qiu et al.

(10) Patent No.: US 6,911,891 B2
(45) Date of Patent: Jun. 28, 2005

(54) BISTABLE ACTUATION TECHNIQUES, MECHANISMS, AND APPLICATIONS

(75) Inventors: Jin Qiu, Cambridge, MA (US); Alexander H. Slocum, One Merrill Crossing Bow, NH (US); Jeffrey H. Lang, Sudbury, MA (US); Ralf Struempler, Gebenstorf (CH); Michael P. Brenner, Needham, MA (US); Jian Li, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 295 days.

(21) Appl. No.: 10/052,667

(22) Filed: Jan. 18, 2002

(65) Prior Publication Data

US 2003/0029705 A1 Feb. 13, 2003

Related U.S. Application Data

(60) Provisional application No. 60/263,057, filed on Jan. 19, 2001.

(51) Int. Cl.[7] .......................... H01H 37/52; H01H 37/54
(52) U.S. Cl. .............................. 337/53; 337/36; 337/16; 337/365; 60/529
(58) Field of Search ............................. 337/14, 16, 36, 337/52, 53, 85, 89, 139, 140, 333, 362, 365; 251/129.02; 60/527–529

(56) References Cited

U.S. PATENT DOCUMENTS

| | | | | |
|---|---|---|---|---|
| 5,029,805 A | * | 7/1991 | Albarda et al. | 251/11 |
| 5,058,856 A | * | 10/1991 | Gordon et al. | 251/11 |
| 5,325,880 A | * | 7/1994 | Johnson et al. | 137/1 |
| 5,536,963 A | * | 7/1996 | Polla | 257/417 |
| 5,619,061 A | * | 4/1997 | Goldsmith et al. | 257/528 |

(Continued)

OTHER PUBLICATIONS

Vangbo, "An analytical analysis of a compressed bistable buckled beam," Sensors and Actuators A, vol. 69, No. 3, pp. 212–216, Sep. 15, 1998.

Qiu et al., "A Centrally–Clamped Parallel–Beam Bistable MEMS Mechanism," Proceedings: IEEE Workshop on Micro Electro Mechanical Systems, pp. 353–356, Interlakken, Switzerland, Jan. 21–25, 2001.

Brenner et al., "Optimum Design of a MEMS Relay Switch," Proceedings: Fifth International Conference on Modeling and Simulation of Microsystems (MSM2002), pp. 214–217, San Juan, PR, Apr. 22–25, 2002.

Qiu et al., "A High–Current Electrothermal Bistable MEMS Relay," Proceedings: IEEE Workshop on Micro Electro Mechanical Systems, pp. 64–67, Kyoto, Japan, Jan. 19–23, 2003.

Li et al., "DRIE–Fabricated Curved–Electrode Zipping Actuators With Low Pull–in Voltage," Proceedings: Transducers '03, pp. 480–483, Boston, MA Jun. 8–12, 2003.

(Continued)

Primary Examiner—Anatoly Vortman
(74) Attorney, Agent, or Firm—Theresa A. Lober

(57) ABSTRACT

A bistable structure provided by the invention is characterized as including a deflection element that has mechanically constrained end points and a compliant span between the end points that is substantially free to deflect between two stable positions when a force is applied at a point along the span. The deflection element span is provided, as-fabricated, curved in one of the two stable positions and in a mechanically unstressed condition along the length of the span. The as-fabricated curve of the deflection element span includes a curve maxima at a point along the span length that is at least about ¼ of the span length from the end points of the span. The deflection element span is constrained to substantially prohibit development of a second bending mode that is characteristic for the span as the element deflects between the two stable positions.

28 Claims, 27 Drawing Sheets

U.S. PATENT DOCUMENTS

| | | | | |
|---|---|---|---|---|
| 5,619,177 | A | * | 4/1997 | Johnson et al. .............. 337/140 |
| 5,638,946 | A | * | 6/1997 | Zavracky .................... 200/181 |
| 5,659,171 | A | * | 8/1997 | Young et al. ................ 250/289 |
| 5,954,079 | A | * | 9/1999 | Barth et al. ................... 137/13 |
| 5,984,258 | A | * | 11/1999 | Knebel et al. ................. 251/11 |
| 6,100,477 | A | * | 8/2000 | Randall et al. ............. 200/181 |
| 6,133,807 | A | * | 10/2000 | Akiyama et al. ............ 333/101 |
| 6,188,301 | B1 | * | 2/2001 | Kornrumpf et al. ......... 333/262 |
| 6,239,685 | B1 | * | 5/2001 | Albrecht et al. ............ 337/365 |
| 6,303,885 | B1 | | 10/2001 | Hichwa et al. |
| 6,472,962 | B1 | * | 10/2002 | Guo et al. ................... 333/262 |
| 6,513,939 | B1 | * | 2/2003 | Fettig et al. ................ 359/847 |
| 6,691,977 | B2 | * | 2/2004 | Knebel et al. ................ 251/11 |
| 6,703,916 | B2 | * | 3/2004 | Charvet et al. ............. 337/141 |
| 2002/0167374 | A1 | * | 11/2002 | Hunt et al. ................. 333/186 |
| 2003/0006125 | A1 | * | 1/2003 | Hallbjorner ................... 200/36 |
| 2004/0012062 | A1 | * | 1/2004 | Miyajima et al. ........... 257/419 |

OTHER PUBLICATIONS

Brenner et al., "Optimal Design of a Bistable Switch," PNAS, vol. 100, No. 17, pp. 9663–9667, Aug. 19, 2003.

Qiu et al., "A Curved–Beam Bistable Mechanism," Journal of Microelectromechanical Systems, vol. 13, No. 2, pp. 137–146, Apr. 2004.

Brenner et al., "Optimum Design of an Electrostatic Zipper Actuator," Technical Proceedings of the 2004 NSTI Nanotechnology Conf. and Trade Show, vol. 2, Chapter 7, pp. 371–374, 2004.

* cited by examiner

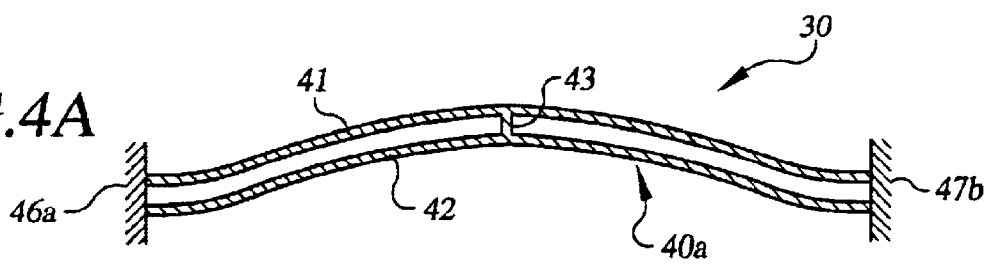
FIG.4A
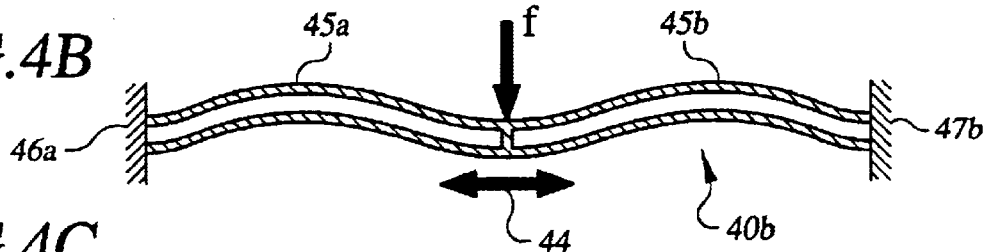
FIG.4B
FIG.4C
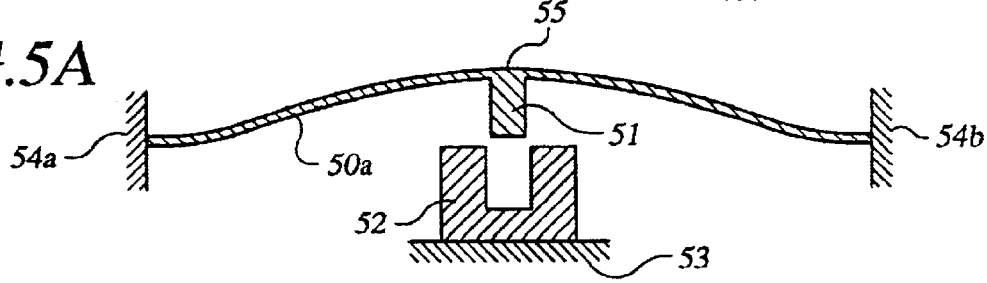
FIG.5A
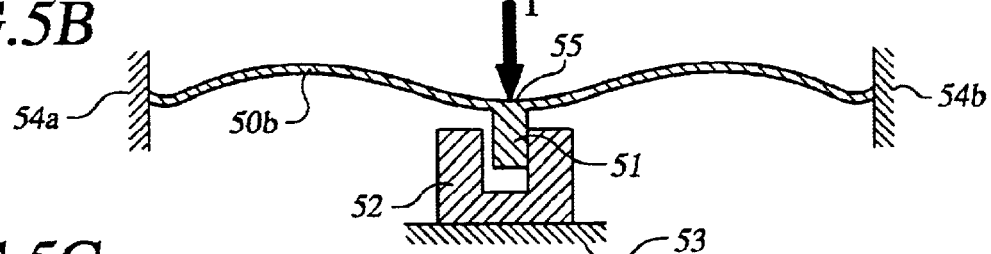
FIG.5B
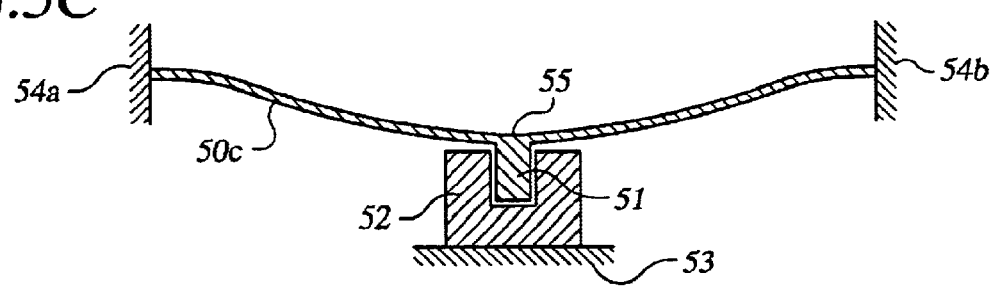
FIG.5C

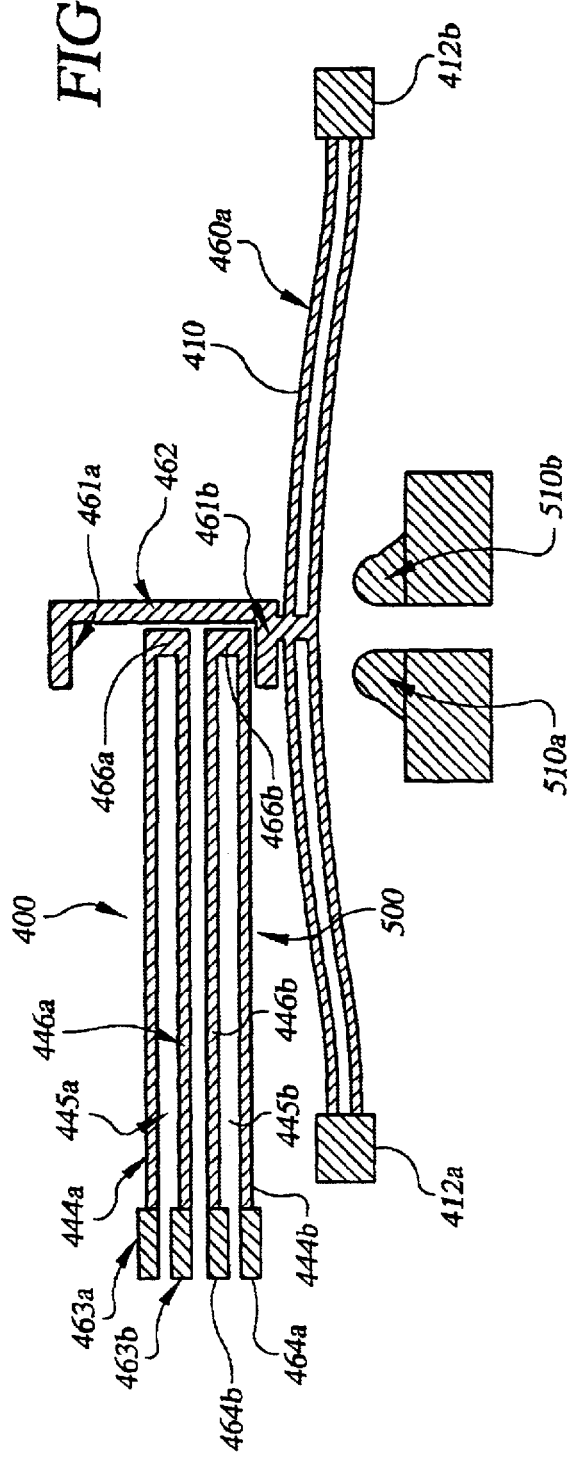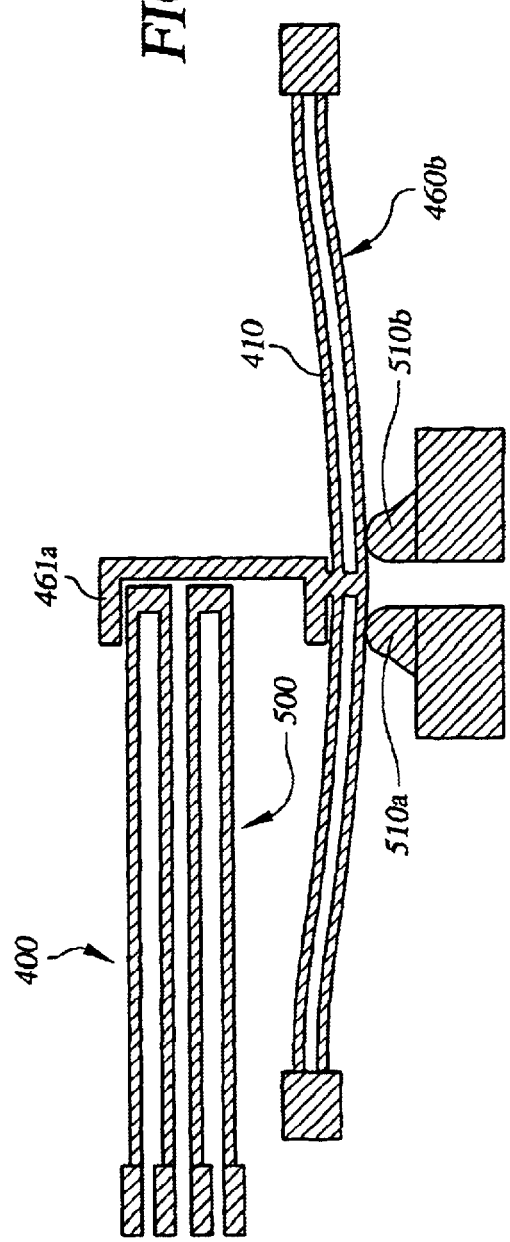

BISTABLE ACTUATION TECHNIQUES, MECHANISMS, AND APPLICATIONS

RELATED APPLICATIONS

This application claims the benefit of U.S. patent application Ser. No. 60/263,057, filed Jan. 19, 2001, the entirety of which is hereby incorporated by reference.

BACKGROUND OF THE INVENTION

This invention relates to electromechanical actuation mechanisms, and more particularly relates to mechanically-bistable actuation mechanisms.

Mechanically-bistable mechanisms are important for enabling a wide range of electromechanical systems. Such bistable mechanisms, having two positions of displacement that are both mechanically stable, are particularly well-suited for two-position actuation applications, such as relays, valves, threshold switches, memory cells, clasps, grippers, and other applications. The natural actuation stiffness of bistable mechanisms inherently are well-suited to binary applications that require two conditions such as open/closed, up/down, etc. An important advantage provided for such applications is the inherent hysteresis in the bistable force-displacement characteristic, which enhances the robustness and immunity of bistable mechanisms to external disturbances.

Bistable mechanisms have been proposed for applications in all size regimes, including that of microelectromechanical systems (MEMs), which typically are fabricated on the scale of millimeters or microns. Many actuator applications require the size and precision of MEMs, and such are becoming increasingly common for actuation components as well as systems. There have been proposed a range of MEMs structures that meet component and system design criteria by providing bistable actuation displacement. For example, there has been proposed a buckled-beam mechanism that incorporates latches for enabling actuation between two stable positions. Similarly, there has been proposed a hinged, multi-segment mechanism that relies on hinging action to enable stable actuation between two positions. While operational, these two designs suffer in that they require very particular latch or hinge configurations and corresponding actions; these requirements tend to severely limit the design parameters of an associated actuation system.

There further has been proposed the design of MEMs structures having bistability imposed not by a mechanical configuration but by a selected condition of axial preloading implemented as, e.g., compressive stress. FIG. 1A is a schematic representation, shown in side view, of such a structure, here a single suspended beam 10, having a clamped boundary 12 and a sliding boundary 13. The beam is characterized by a prescribed level of residual compressive stress imposed during fabrication of the beam. The view of FIG. 1A illustrates an initial, un-actuated, uncurved and stable condition of the beam. FIG. 1B is a schematic side view of the single beam when displaced, following a displacement profile that is dictated by the residual compressive stress in the beam, here schematically represented as an axial preload 14 applied at one end. Positions 11a and 11c are two symmetric and stable positions. Position 11b is an unstable equilibrium position, which has an S-shape. Thus the application of an axial preload by the inclusion of residual stress results in a displacement profile that includes two stable positions of the suspended beam structure.

Similarly, FIG. 2A provides a schematic representation, shown also in side view, of a double beam actuator 20 in its initial condition, and having imposed on the structure some prescribed level of residual compressive stress. The double beam actuator 20 is composed of two straight beams 22 and 24 clamped at both boundaries 25 and 26, with a central clamp member 23 connecting the two straight beams. Note that the quiescent state of the beams is a straight, uncurved geometry; the beams are provided as-fabricated in this straight, uncurved geometry. FIG. 2B is a schematic side view of the double beam structure when displaced; the compressive residual stress imposed on the structure being represented by an axial preload 27 applied at one end. Displacement positions 21a and 21c are two symmetric, stable positions while position 21b is an unstable equilibrium position. Thus, like the single beam described above, bistable actuation can be imposed on this double-beam structure by the inclusion of residual compressive stress in the beams of the structure.

It is found that in practice it can be extremely difficult to implement the residual compressive stress required to enable bistable actuation of the single and double beam structures just described. More specifically, it is difficult to implement the compressive stress preloading in a precise, reproducible manner that is sufficiently robust to be deployed in large scale manufacturing operations such as commercial microfabrication. Indeed, it can be particularly difficult, if not impossible, to attain precise preloading in micro-scale structures such as those employed in MEMs actuation applications. One common technique for mechanically preloading a MEMs structure is the provision of residual compressive stress from fabrication processes, e.g., material coating, doping, or structural feature provision. But such techniques are found to be hard to control precisely and repeatably, and over time, the precision required of fabrication equipment to reliably provide a specified stress is difficult to control.

Beyond the limitations of such fabrication techniques, it is found that accurate and reliable provision of a pre-specified residual stress in or preloading of a structure is difficult by any technique and for any size regime. As a result, commercial deployment of actuators having bistable operation imposed by material stress conditions has been severely limited. Complicated and often constraining mechanical components, such as the latches and hinges described above, are thus typically required for producing bistable actuation. But many applications cannot accommodate the additional complexity required of such componentry. The deployment of bistable actuation systems has thus been significantly limited, overly complicated, or excessively unreliable.

SUMMARY

The invention provides a class of bistable structures that exhibit bistable displacement, with the bistability imposed by the structure's geometry as-fabricated, without a requirement of external or internal preloading, residual stress, and/or hinges, latches, or other mechanical mechanism. In general, a bistable structure provided by the invention is characterized as including a deflection element that has mechanically constrained end points and a compliant span between the end points that is substantially free to deflect between two stable positions when a force is applied at a point along the span. The deflection element span is provided, as-fabricated, curved in one of the two stable positions and in a mechanically unstressed condition along span length. The as-fabricated curve of the deflection element span includes a curve maxima at a point along the span length that is at least about ¼ of the span length from the end points of the span. The deflection element span is constrained to substantially prohibit development of a second bending mode that is characteristic for the span as the element deflects between the two stable positions.

This bistable structure configuration eliminates the unpredictability of a bistable condition imposed by mechanical stress in the structure as-fabricated, and enables a wide range of adaptations for addressing microelectromechanical applications. For example, the deflection element can be provided as a beam, or as two beams connected together at a point along the spans of the beams by an interconnecting clamp that prohibits development of a second bending mode that is characteristic for the spans as the element deflects between the two stable positions. The deflection element can also be provided as, e.g., a plate, a diaphragm, or another selected geometry that accommodates the required end point conditions and curvature of the structure.

The end points of the deflection element span can be constrained through a wide range of configurations. For example, the constrained end points of the span can be clamped, hinged, or provided in another configuration, e.g., as torsional spring elements. The deflection element span can be provided as, e.g., aluminum, silicon, or other selected material that meets the operational requirements of a selected application. Microfabrication can be a preferred manufacturing technique for many materials and applications. Here the curve of the deflection element span corresponds to a lithographic mask that defines the curve as-fabricated. Specifically, a lithographic mask can be provided to define an etch mask pattern for etching the curve of the deflection element span.

The as-fabricated curve of the deflection element span can take on a wide range of trajectories. For example, the curve can be provided as a trajectory along the span length that corresponds to a first bending mode characteristic for the span. In one example, the curve is provided as a trajectory along the span length that is defined as $$\frac{\bar{d}(1-\cos(2\pi x/l))}{2},$$

where $\bar{d}$ is the curve maxima value and x is the distance along the span length between 0 and l. For many applications, it can be preferred to provide the maxima of the curve of the deflection element span at substantially the center of the span.

The wide range of bistable structures provided by the invention can be adapted to address various applications. For example, a bistable structure provided by the invention can be employed to close and open an electrical relay. Here electrically conductive relay contacts are provided, disposed at positions that are separated from the deflection element by a separation distance. The separation distance is selected such that an electrical connection is provided between the relay contacts when the deflection element is in one of the two stable positions. The electrical connection provided between the relay contacts can be imposed by a range of configurations, e.g., by mechanical contact of each relay contact with an electrically conducting cross bar that is compliantly connected to the deflection element.

The invention contemplates a wide range of actuation techniques and mechanisms for actuating the bistable structures of the invention between their two stable positions. In general, there is to be provided a force generation actuator including a mechanical force applicator that is disposed relative to the deflection element of the bistable structure to apply a force to the deflection element span. The force generation actuator is connected to receive an electrical stimulus for applying the force to the bistable structure. This electrical stimulus can be imposed as, e.g., an electrostatic actuation voltage, a thermal actuation voltage, or other selected stimulus.

The bistable structures provided by the invention generally are found to enable the ability to accurately and repeatable provide a prespecified amount of force and/or displacement, to produce, e.g., a prespecified position, volume, energy, or other parameter of a system. Other features and advantages of the invention will be clear from the following description, and from the claims.

BRIEF DESCRIPTION OF THE DRAWINGS

The invention will now be described with reference to the accompanying drawing in which:

FIGS. 4A–4C are schematic views of an initially curved and mechanically unstressed double beam bistable structure provided by the invention, shown in its initially curved, unstressed first stable position, in a deflected position, and in its second stable position, respectively;

FIGS. 5A–5C are schematic views of an initially curved and mechanically unstressed single beam bistable structure provided by the invention, shown in its initially curved, unstressed first stable position, in a deflected position, and in its second stable position, respectively;

FIGS. 31–32 are schematic views of schematic views of a bistable double beam structure provided by the invention, actuated by a force applied from a thermally-controlled pseudo-bimorph mechanism as in FIGS. 16A–C, here with a bi-directional actuation mechanism, showing the initial unstressed stable position, and the second stable position, respectively;

DETAILED DESCRIPTION OF THE INVENTION

Figures 3A, 3B:
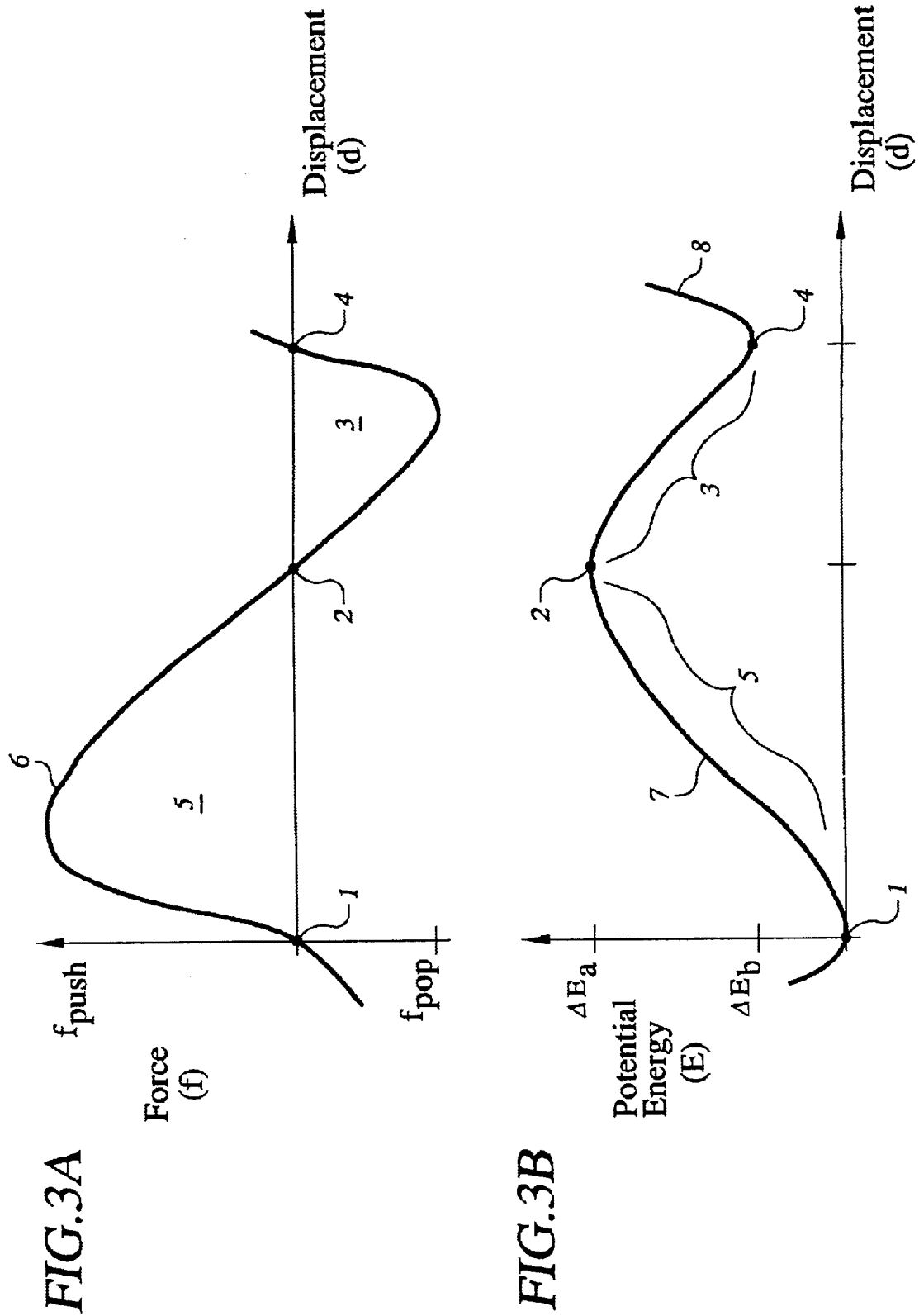
FIGS. 3A–3B are plots of force and potential energy, respectively, as a function of displacement, for the class of bistable mechanisms provided by the invention.

To better describe the features and characteristics of the class of bistable structures provided by the invention, first is here presented a discussion of the generic characteristics of such bistable mechanisms. FIG. 3A is a plot of a curve 6 that prescribes an applied force, f, as a function of displacement, d, of a moveable member, or deflection element, of a bistable mechanism as-provided by the invention. The curve identifies an initial, stable displacement position point 1, a deflection zone of displacement 5, an unstable, middle-equilibrium displacement position point 2, a second deflection zone of displacement 3, here referred to as a "snap-through" zone due to the nature of the displacement through that zone, and a second stable position 4. The force-displacement relationship of the plot of FIG. 3A is characteristic of the class of bistable structures provided by the invention; two stable displacement positions 1, 4 are enabled, thereby providing an automatic mechanism for actuation between the two positions in a manner that is efficient and repeatable.

FIG. 3B is a plot of a 7 that prescribes applied potential energy, E, stored in a bistable mechanism, as a function of displacement, d, for producing the force-displacement relationship of the plot of FIG. 3A; in the usual manner, the force-displacement curve is the mathematical derivative of the energy-displacement curve. Substantially zero potential energy is stored in the mechanism at the first stable displacement position point 1, which is at the bottom of a first potential energy well. In the first deflection zone of displacement 5, in order to produce positive displacement of the structure sufficient energy must be provided to overcome a potential energy barrier at the top of which is the unstable, middle-equilibrium displacement position point 2. The peak force required to be applied to reach the top of the energy barrier is given in the plot of FIG. 3A as $f_{push}$, i.e., the force required to push structure to its unstable "snap-through" position.

Once this unstable displacement point 2 is reached, any additional energy input pushes the bistable structure through the "snap-through" deflection zone 3. This region of displacement is characterized by an energy downturn, rather than an energy barrier, and thus does not require the application of external force; i.e., once pushed beyond the middle-equilibrium unstable point 2, the structure automatically continues its displacement by "snapping-through" the energy downturn to reach the second stable displacement position 4. This second stable displacement position is characterized as the bottom of a potential energy well formed by the "snap-through" zone 3 and a second potential energy barrier 8 that must be overcome to continue displacement of the structure beyond the second stable position. To return the bistable structure from its second stable position back to the first, the structure must be pushed back to the middle equilibrium unstable position by application of a force, shown as $f_{pop}$, for "popping" the structure back to its initial stable position.

With this energy-displacement characteristic, a stable position of displacement is here defined as a position to which the structure will return when a small perturbation force is applied to the structure so long as the perturbation does not exceed the potential barriers bordering that position. An unstable position of displacement is here defined as a position from which the structure will move in the presence of a small perturbation force. Each of the stable displacement positions 1, 4 plotted in FIGS. 3A–3B are associated with a local potential energy minimum. Thus, significant energy must be supplied to produce displacement from these positions. A small perturbation force would not typically be sufficient to overcome the potential energy barriers associated with the positions. Conversely, the middle-equilibrium unstable "snap-through" position plotted in FIGS. 3A–3B is associated with a local potential energy maximum. Even a small perturbation force would be sufficient to enable a change in displacement from this point; the point is therefore not stable.

The invention provides a class of structures having geometric and other parameters that together result in bistable structure displacement as a function of force and energy like that of the plots of FIGS. 3A–3B. At least two locally stable displacement positions are defined, each stable position being associated with a local potential energy minimum. This displacement characteristic enables precise bistable structure operation between two stable actuation positions, in the manner described in detail below. In accordance with the invention, no stress preloading or complicated external componentry are required to enable bistable actuation. Instead, the invention relies entirely on bistable structure geometry as-fabricated to impose the bistability criteria.

To provide specificity at this point in the discussion, FIGS. 4A–C provide schematic side view representations of a double-beam structure 30 provided by the invention that exhibits the bistability characteristics of the plots of FIGS. 3A–3B. The double beam structure is suspended in that it is free to move up and down in the plane of the paper. The double beam structure includes two beams 41, 42 that are each provided in an initially curved configuration; i.e., a condition in which the beams are curved as-fabricated, i.e., at the end of fabrication, the beams are curved. FIG. 4A illustrates the configuration of the double beam structure 30 at a first stable position 40a that is imposed as the beams are fabricated.

Referring to FIG. 4B, when a force, f, is applied to the double-beam structure, e.g., at its midpoint, the structure is displaced in that it deflects in the plane of the paper, forming a deflected trajectory 40b that maintains the midpoint of the beams in a substantially horizontal orientation during deflection—horizontal is defined in the figure in a left-right direction 44 on the page—by the clamp member 43. At some point in the deflection trajectory due to the force application, the double beam structure "snaps through" to a second stable position 40c. Once the displacement point at which "snap-through" occurs is reached, no further force need be applied to reach the second stable position 40c and no force need be applied to maintain the structure in this second stable position; the structure will remain in the second stable position until an opposing force is applied to move the structure back to the first stable position 40a.

Figure 1A:
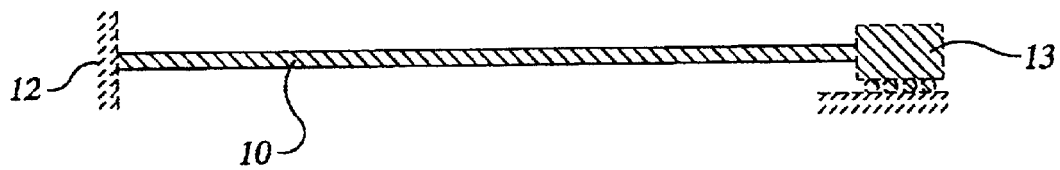
FIGS. 1A–1B are schematic side views of a prior art single beam structure, in its initial condition, and when displaced, respectively, exhibiting bistability due to preloading of the beam to provide a mechanically stressed beam condition.
Figure 1B:
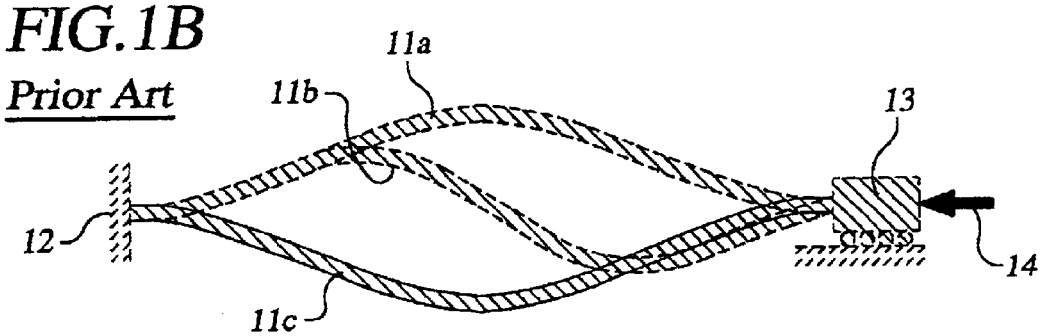
Figure 2A:
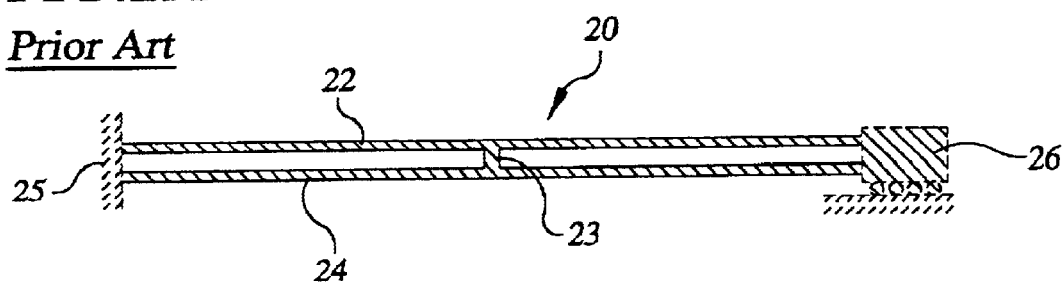
FIGS. 2A–2B are schematic side views of a prior art double beam structure, in its initial condition, and when displaced respectively, exhibiting bistability due to preloading of the double beam to provide mechanically stressed beam conditions.
Figure 2B:
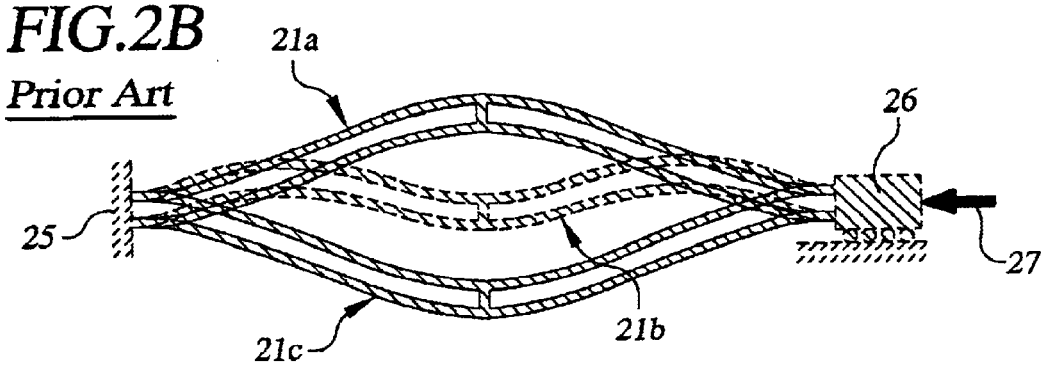

Focusing on the curved geometry of the double beam structure of FIGS. 4A–C, the invention provides a discovery that the selection of initial structure geometry can be employed to tailor bending modes of the structure that are developed during its displacement, and that this tailoring of bending modes, along with geometric parameters of the structure, in turn tailor the potential energy characteristic of the structure, enabling the bistable energy characteristic of FIG. 3B. For a statically indeterminate beam structure like that of FIG. 4, the first bending mode is a curved concave-convex-concave contour having a central "hump" region like that shown in FIG. 4A. The second bending mode is a double-curved contour having a "positive hump" region and a "negative hump region" like the trajectory 11b in the prior art structure of FIG. 1B.

It has been discovered in accordance with the invention that for many applications, the fabrication of a structure's geometry with a curve along the length of the deflectable region of the structure, and with the maxima of the curve at a relatively central region of the structure, operates to substantially prevent the development of that structure's second bending mode during deflection of the structure. Only the first and third bending modes are substantially developed during deflection; higher order modes are also developed but at insignificant amplitudes. As explained in detail below, with the selection of a structure's first bending mode as its initial geometry, optimization of that geometry can be carried out in accordance with the invention to optimize the operating parameters of the bistable mechanism. As explained in detail below, the curve provided to the structure as-fabricated can take on a wide range of trajectories. Whatever trajectory is taken, the invention requires that the maxima of the curve along the trajectory be located at a point along the length of the deflectable structure that is at least about one-quarter of the length from the ends of the structure.

The existence of the first bending mode during the structure's deflection is found to produce an energy barrier between two stable structural positions, corresponding to the position points 1 and 4 in the plots of FIGS. 3A–3B. Allowability of a large component of the second bending mode would remove this energy barrier, resulting in an energy characteristic that would monotonically increase, resulting in only one stable position, position point 1 of the plots, with position point 4 eliminated. Therefore, in accordance with the invention, the second bending mode of the structure is preferably substantially prohibited such that an energy barrier is formed to define two local energy minima that correspond to stable positions. As explained in detail below, for some actuation applications, it can be preferred to accommodate some amount of second mode bending to somewhat lower the energy barrier between the two stable positions. The invention thus contemplates for some applications the accommodation of a relatively small second mode bending component; for most applications, such is preferably prohibited.

As explained above, the invention prescribes that in the deflection of the structure of FIGS. 4A–4C the third bending mode be developed along with the first bending mode. The development of the third bending mode during deflection is preferred in that the third bending mode somewhat lowers the energy barrier between the two bistable positions, thereby requiring only a reasonable energy and force input to displace the structure between the two positions. If the third bending mode were not to be developed, it would not be possible as a practical matter to move between the two stable positions. Bending modes higher than the third, generally being developed to only insignificant amplitudes when the first and third modes are more significantly developed, do not impact the potential energy barrier between the two stable positions and thus can be accommodated.

For a selected structural material, the invention thus prescribes an initial structural geometry that manifests the first, third, and selected higher bending modes as explained in detail below, and substantially prohibits the second bending mode of the structure as the structure is displaced. This yields an energy-displacement characteristic that includes an energy barrier between two local energy minima defining two stable structural positions. In the example of the double beam structure of FIGS. 4A–4C, it is found that an initially curved configuration like that shown in FIG. 4A can be preferred for enforcing this structural bistability. By curved is here meant a trajectory along beam length that exhibits a maxima at a point that is at least about one-quarter of the beam length from the ends of the beam. The curve of the beams in FIG. 4a generally follows a concave-convex-concave contour, such as that given by a cosine shape.

The cosine shape is found to be particularly well-suited for the double beam curvature due to its likeness to the first bending mode of the structure. In accordance with the invention, it can be preferred to impose an initial curve that is substantially similar to the first bending mode shape for the structure. A perfect implementation of the first bending mode shape is not required, however, to enforce bistability; e.g., a perfect cosine shape is not required for the double beam structure of FIG. 4A, and as will be discussed below, it is recognized that for various applications, it can be preferred to tailor the concave and convex regions of a curve in a manner that adjusts the force-displacement characteristic of the structure to suit particular application requirements. It is preferred that the trajectory point between each of the distinct contour regions of a curve be of continuous slope, i.e., be a smooth connection. It is not to be expected that a random beam trajectory that only globally follows a concave-convex-concave path or other curve trajectory will be operative; the trajectory preferably is designed, in the manner described below, to directly produce the desired bistability.

The beam structure of FIGS. 4A–4C includes a generally-central clamp member 43 connected between the two beams 41, 43. This clamp member is one particular implementation of the requirement by the invention that the structure be constrained such that the second bending mode of the structure is substantially suppressed. It is found that the clamp member prevents rotation of the center of the beams and thereby enforces a flat condition at the center of the beams during beam deflection. In FIG. 4B this is indicated as a horizontal condition 44 at the center of the beams. The enforcing of flatness at the center of the structure permits the development of bending modes that would be flat at that location during deflection and suppresses the development of bending modes that would not be flat at that location during deflection. The clamp therefore favors the development of the first and third bending modes, which are generally flat at the center of the structure, and suppresses the occurrence of the second bending mode, which is not flat at the center of the structure. If the clamp location were shifted to a location at which the beams would be flat in the second bending mode, the clamp would not prevent the second mode from developing. Therefore, location of the clamp is preferably selected to enable the first and third modes to be developed while suppressing the second mode. In this way the bistable behavior of the structure is further enforced.

The invention is not limited to the clamp member and the double beam structure of FIGS. 4A–4C. Rather, the invention contemplates a wide range of structures in a class of structures distinguished by a feature or features that enforce the first and third bending modes of the structure while substantially suppressing the second bending mode of the structure. For example, FIGS. 5A, 5B, and 5C are schematic views of an initially curved, unpreloaded single beam 55, having a generally centrally-located post 51 on the beam that can be guided into a slot 52 having a clamped boundary 53. FIG. 5A illustrates a first stable position 50a of the structure, illustrating that the single beam structure includes clamped boundaries 54a and 54b.

When a force, f, is applied to the beam to deflect the beam, the post 51 is guided into the slot 52 as the beam deflects in the plane of the page. During this deflection, the middle of the beam is maintained in a generally horizontal position by the post 51; specifically, the post, by virtue of its constraint in the slot 52, prevents rotation of the beam as the beam deflects, in the manner explained above in which the clamp member of the double beam structure prevents rotation of the double beams as they deflect. As a result of this horizontal condition at the center of the beam, only the first, third, and higher bending modes of the beam are accommodated during beam deflection; the second bending mode is substantially suppressed. Thus, the energy-displacement characteristic of the beam is like that of FIG. 3B, with two points of bistability defined. At a point in the beam deflection, the top of the energy barrier between the two stable points is reached and the beam thereafter "snaps-through" to the second stable position 50c, shown in FIG. 5C. As explained above, once the "snap-through" point is reached, no further force need be applied to reach the second stable position, and no force need be applied to maintain the structure in the second stable position—an opposing force can be applied to move the structure back to the first stable position.

As explained above, the invention is not limited to a single or double beam structure. Plates, shells, diaphragms, cylinders, and other such structures can be designed in accordance with the invention to operate as bistable mechanisms. The invention provides a technique for designing such bistable mechanisms. For clarity, the example design discussion below will be directed to an actuator mechanism including a deflectable beam of a uniform thickness. As will be shown, however, that this design technique can be applied to a wide range of structures for producing bistability in the structures.

In this design technique, it is assumed that an actuation force is to be applied at the center of a structure, perpendicular to the structure. In general, it is preferred that the force be applied in a perpendicular manner, but such is not generally required. The force can be applied in a nonperpendicular manner, and can be applied away from the center of the structure. It is to be recognized, however, that the structure is generally for most applications most strong at its center. Alternatively, as described below, a distributed force can be applied across the structure length.

To design a bistable beam structure in accordance with the invention, first is defined the structural geometry required to substantially prohibit the development of the second bending mode of the structure during deflection of the structure. For example, for the double beam structure of FIGS. 4A–C, a central clamping member is provided to maintain horizontal planarity of the midsection of the structure, thereby aiding in the prohibition of the second bending mode of the structure. For the single beam structure of FIGS. 5A–C, a post-slot configuration is provided to similarly maintain horizontal planarity of the midsection of the beam, thereby aiding in the prohibition of the second bending mode of the structure. With this design in place, the geometry of the structure can be determined to meet the particular operational requirements of an application while providing bistable actuation.

As explained above, it is recognized in accordance with the invention that the provision of a particular initial shape of a structure can be employed to tailor the bending modes of the structure. This enables the production of a bistable structure without the need for residual compressive stress in the structure, i.e., as-fabricated, the beam length is in a mechanically unstressed condition. Instead, the structure is preferably fabricated in a configuration, or shape, that includes a curve having a maxima that is at least about one-quarter of the length of the beam from the beam ends. This condition aids in prohibiting the development of the second bending mode during structure deflection, to thereby produce bistability in the structure deflection.

The initially curved shapes provided for the beams of FIGS. 4A and 5A are examples of initial conditions that impose bistability, specifically by imposing the first bending mode on the shape of the structures as-fabricated. As explained above, the curved shape of this first bending mode can be conveniently represented as a cosine function for design purposes relating to a beam structure. Then, the initial shape of a beam having this curve can be represented as an initial shape function, $\bar{w}(x)$ as:

$$\bar{w}(x) = \bar{d}[1 - \cos(2\pi x/l)]/2 \tag{1}$$

where $\bar{d}$ is the amplitude of the maxima of the initial shape of the beam; here occurring at its center point, and x is the distance along the beam, between 0 and the beam length, l. This initial shape function prescribes the trajectory of the beam and gives the distance of the beam from a straight line connecting its two boundaries. Note that this cosine shape function is here prescribed because it is the first bending mode of the beam structure under analysis; this will not in general be the case for all bistable structures. In general then, the selected initial curve of a structure is modeled, and if desired, the selected initial curve is set as that of the first bending mode of the structure.

This initial shape function condition is imposed on the structure to produce bistability in the structure's deflection. The following analysis is then carried out to determine the geometric parameters of the structure. In the analysis, the impact of the initial condition and the geometric parameters are captured in a normalized quality constant, Q, given as:

$$Q = \bar{d}/t; \tag{2}$$

where t is the thickness of the beam, illustrated as the beam dimension in the plane of the paper.

As a lateral force f is applied to the center of the beam, at x=l/2, i.e., as a force is applied at a side of the beam in FIG. 5B or the beams in FIG. 4B to displace the beams laterally, in the plane of the page, the center maxima of the beam or beams deflects from its starting position, $\bar{d}$, by an amount δ that is a function of the applied force. The total length of the beam, l, also changes as the lateral force is applied, giving rise to an axial compressive force p developed within the beam. Thus, during the beam deflection, the beam shape changes in response to these factors. This changing beam shape can be expressed as a superposition of an infinite set of the possible beam bending modes, having mode shapes that are determined by the bending equation of an initially straight beam with the prescribed boundary conditions. For this analysis, it will be assumed that clamped-clamped boundary conditions are provided for the beam, whereby:

$$w(0) = w(l) = 0; \; w'(0) = w'(l) = 0; \tag{3}$$

where $w'(0)$ and $w'(l)$ are the first derivatives of the shape function at the end points of the beam. The invention contemplates a range of alternative boundary conditions, however, as discussed below; clamped-clamped boundary conditions are not universally required by the invention. To enable the bistable motion of the invention, mechanically constrained end points of the beam are what is required.

With this boundary requirement, and the example of clamped boundary conditions given here, the normalized shape function, W(X), of the beam at a given time and given force application during beam deflection can be represented as the summation of the shape functions of all bending modes developed at that time, as:

$$W(X) = \sum_{j=0}^{\infty} A_j W_j(X); \tag{4}$$

where $A_j$ is the amplitude of the shape of the $j^{th}$ bending mode at the center point of the beam, and $W_j(X)$ is the shape function of the $j^{th}$ bending mode, where j=0 defines the first bending mode. Here the distance parameter X and the shape function W(X) have been normalized for clarity as:

$$X = x/l; \text{ and} \tag{5}$$

$$W(X) = w(Xl)/\bar{d}. \tag{6}$$

The shape functions of the bending modes, $W_j(X)$, in expression (4) above are given as:

$$W_j(X) = 1 - \cos(N_j X) \atop N_j = (j+2)\pi \Bigg\} j = 0, 2, 4 \ldots ; \qquad (7)$$

for the first, third, fifth, and other odd-numbered modes, and:

$$W_j(X) = 1 - \cos(N_j X) - 2[N_j X - \sin(N_j X)]/N_j \atop N_j = 2.89\pi, 4.92\pi \ldots \Bigg\} j = 1, 3 \ldots ; \qquad (8)$$

for the second, fourth, sixth, and other even-numbered modes. Recall that the second mode is disallowed due to the initial beam geometry and the shape. $N_j$ is a normalized shape mode parameter for defining the mode shape of mode j.

For example, the normalized summation beam shape function of expression (4) above can then represent for the initial beam shape, $\overline{W}(X)$, as:

$$\overline{W}(X) = \overline{A}_0 W_0(X); \overline{A}_0 = 0.5 \qquad (9)$$

where $\overline{A}_0$ is the initial amplitude of the first mode shape, at the center of the beam, normalized by $\overline{d}$, the amplitude of the initial deflection of the beam at its maxima, also here occurring at the center point. Note that only the first mode is present in the initial beam shape, as prescribed by the cosine shape function of expression (1) above.

As the beam deflects due to application of a force, f, at the beam's centerpoint, the j=4, 8, 12, 16 . . . mode shapes join with the first mode, j=0, to minimize the stored mechanical energy of the beam for a given applied force. More specifically, the amplitude of each bending mode's shape at the center of the beam is set by a condition that the stored mechanical energy of the beam be minimized in response to an applied force. This shape changing and energy minimization is in part driven by the axial compression, N, developed along the beam in response to the applied force, as:

$$N^2 = p/(EI/l^2); \qquad (10)$$

where p is the developed axial force leading to the axial compression; E is Young's modulus for the selected beam material; and I is the moment of inertia of the beam, $bt^3/12$, where b is the width of the beam, into the page in FIGS. 4A–C and 5A–C, and t is the thickness of the beam in the plane of the page.

As the beam deflects and modes other than the first mode are developed, one of the modes not developed will be the first to buckle. That is, one of the modes j=1, 2, 3, 5, 6, 7, 9, 10, 11, 13 . . . will be that mode at which the beam buckles. The mode that buckles is the lowest mode that is not disallowed. Thus, for this design, in which the second mode, j=1, is prohibited, the third mode, j=2, will buckle. Once a mode has buckled, no higher modes can be developed. This mode buckling arises at a point where a critical level of the axial compression N has been reached. That is, when a given mode buckles, the internal stress of the beam does not continue to increase. This relationship can be expressed in general, for any beam buckling mode, as:

$$(N^2 - N_k^2)A_k = 0, k = 1, 2, 3, 5, 6, 7 \ldots ; \qquad (11)$$

where $N_k$ is here the normalized axial compressive stress resulting in buckling mode k, for corresponding shape parameter $N_{j=k}$, where $A_k$ is the amplitude at the beam's centerpoint of the shape of the buckling mode k, and k is the index of possible buckling modes. Thus, during beam deflection, $N^2$ increases from zero to $N_k^2$ for the lowest permissible k. Its value than remains at $N_k^2$ due to the free development of the corresponding $A_k$. Other than the case $N^2 = N_k^2$, $A_k$ is always zero, also as indicated by expression (11).

For the design constraints here, given that the second bending mode is prohibited, the first mode of the beam to buckle will be the third bending mode, j=2, whereby for the design constraints here, k is fixed at 2 in expression (11) above.

Given that the material selected for the beam substantially obeys Hooke's Law, whereby the Young's modulus, E, of the material is constant, the energy minimization criterion and criterion for bending mode compressive stress results in the following expressions:

$$\frac{4}{N_0^2}\left[1 + \sum_{j=1}^{\infty} \frac{N_0^2(N^2 - N_0^2)^2}{N_{4j}^2(N^2 - N_{4j}^2)^2}\right]F^2 - 2\overline{A}_0 N_0^2 F + \left[\frac{N^2(N^2 - N_0^2)^2}{12Q^2} - \frac{\overline{A}_0^2 N_0^2(N^4 - 2N^2 N_0^2)}{4}\right] = 0 \qquad (12)$$

for normalized axial compressive stress, N, that is less than the normalized axial compressive stress for the buckling mode, $N_{k=2}$, and:

$$\sum_{j=0}^{\infty} \frac{4}{N_{4j}^2(N_k^2 - N_{4j}^2)^2}F^2 - \frac{2\overline{A}_0 N_0^2}{(N_k^2 - N_0^2)^2}F + \left[\frac{N_k^2}{12Q^2} - \frac{\overline{A}_0^2 N_0^2(N_k^4 - 2N_k^2 N_0^2)}{4(N_k^2 - N_0^2)^2} + \frac{A_k^2 N_k^2}{4}\right] = 0 \qquad (13)$$

for the case where the normalized axial compressive stress, N, is set at the buckling stress, $N_{k=2}$.

In expressions (12) and (13), $N_0$ is the normalized stress of the first mode, $N_{4j}$ is the normalized axial compressive stress of the $4j^{th}$ mode, and F is the normalized applied force, given as a function of the applied force, f, as:

$$F = f/(EI\overline{d}/l^3). \qquad (14)$$

Expressions (12) and (13) are employed to determine the force-displacement characteristics of the beam, and hence to optimize parameters for meeting the operational requirements of a selected application while enabling bistable actuation. The geometric parameters to be selected include the beam length, l, the beam thickness, t, and the initial curve maxima, here the centerpoint deflection, $\overline{d}$, of the beam in the prescribed initial cosine or other curve. Operational parameters to be selected include the maximum displacement obtained by the beam deflection, the force required for the selected application, and the maximum level of stress that can be sustained by the beam during its deflection.

In picking the parameters by analysis of expressions (12) and (13), it is noted that both expressions include the quality factor term, Q, which is $\overline{d}/t$. It has been discovered empirically that to preserve bistability, the quality factor, Q is given as:

$$Q > 2.35. \qquad (15)$$

For the specific example here of an initial curve that is given by the cosine function of expression (1) above, any quality factor Q value less than about 2.35 causes bistability of the beam to be lost, while bistability is preserved for Q values greater than about 2.35. Thus, in analysis of expressions (12) and (13) a quality factor Q value of 2.35 is preferably employed, with the thickness and amplitude terms of the quality factor adjusted within that constraint.

To determine the beam and operational parameters, first expression (12) is analyzed for selected values of the axial compressive stress N up to that value expected for the first expected buckling mode. In other words, the expression is evaluated for N between $N_0$ and $N_2$, given that the third mode is constrained by this design to be the buckling mode.

With a selected Q value and a selected N value, the corresponding normalized force, F, is given by expression (12). This in turn enables a determination of the beam centerpoint amplitude, $A_0$, of the first mode, and the centerpoint amplitude, $A_{4j}$, of each of the j=4, 8, 12, etc. modes present for the specified conditions, as:

$$A_0 = -\bar{A}_0 \frac{N_0^2}{N^2 - N_0^2} + \frac{4F}{N_0^2(N^2 - N_0^2)}; \text{ and} \tag{16}$$

$$A_{4j} = \frac{4F}{N_{4j}^2(N^2 - N_{4j}^2)}, j = 1, 2, 3 \ldots. \tag{17}$$

With these amplitudes, the superposition expression (4) above can be evaluated to determine the beam shape for the corresponding force, F, for the selected N value with which expression (12) was evaluated. Then the normalized deflection of the centerpoint of the beam, $\Delta$, is given as a function of the starting deflection, as:

$$\Delta = \delta/\bar{d} = \overline{W}(1/2) - W(1/2) = \Delta = 2\bar{A}_0 - 2\sum_{j=0}^{\infty} A_{4j} \tag{18}$$

With this deflection value, $\Delta$, a point on the force-displacement curve for the beam has been determined. This evaluation of parameters is continued, employing expression (12) above with different values of compressive stress, N, from $N_0$ up to $N_2$.

Once the beam is deflected to a point where $N=N_2$, the compressive stress remains at the value $N_2$ and expression (12) above no longer holds. At this point, expression (13) above is then analyzed, again for a quality factor Q value that is preferably at least about 2.35. In making the analysis of expression (13), the value of $N_k$ is fixed at $N_2$, reflecting the design constraint here in which the third mode will buckle, and the value of $A_k$ is varied over the course of several iterations in which the value of the normalize force, F, is computed.

Because expression (13) is quadratic in the force term, F, in order to produce a real solution for F it is found that the following condition must be satisfied, where it is assumed that the geometry of the structure prohibits the second mode from developing and it is assumed that the third mode is the lowest buckling mode:

$$\text{Max}(A_1^2) = 0.062 - 0.333/Q^2. \tag{19}$$

With the value of the applied force, F, determined for a selected $A_k$, then expressions (16)–(18) above can be analyzed to determine a displacement point corresponding to the force, for producing a point of the corresponding force-displacement characteristic.

As expressions (12) and (13) are analyzed to produce a corresponding force-displacement characteristic, it is preferred that the maximum strain developed by the beam for the selected parameters be evaluated to ensure that the maximum strain supportable by the beam is not surpassed. The normalized maximum strain of the beam, $\Sigma_{max}$ as a function of the maximum strain, $\epsilon_{max}$, is given as:

$$\Sigma_{max} = \epsilon_{max}/(t\bar{d}/2l^2). \tag{20}$$

The maximum strain is estimated to be the bending strain due to the first bending mode plus the axial compression strain at the boundaries of the beam. Thus, $$\Sigma_{max} = \max[W''(X)] + N^2/6Q^2 \approx W''(0) + N^2/6Q^2. \tag{21}$$

If the maximum developed strain meets the strain capabilities of the material selected for use, and if the force-displacement characteristics generated by evaluation of expressions (12) and (13) indicate bistable actuation and adequate force-displacement characteristics then the parameters employed in the evaluation can be accepted for the design. Otherwise, the geometric parameters are iteratively adjusted until all criteria are met and the strain capabilities of the beam material are accommodated. For many applications, it can be preferred to design a beam width, b, into the paper plane that is larger than the thickness, t, of the beam, to ensure that during the "snap-through" beam action the beam does not buckle in a plane orthogonal to the "snap-through" motion, i.e., in a plane into the paper plane.

It is found in accordance with the invention that for the particular example given above where the initial curve is provided as the cosine function of expression (1) above, then when the value of the quality factor, Q, is 6 or larger, the geometric parameters of the beam are asymptotic to constants, where $$f_{push} \approx 758EI\bar{d}/l^3 \quad \delta_{push} \approx 0.03\bar{d} \tag{22}$$

$$f_{pop} \approx -384EI\bar{d}/l^3 \quad \delta_{pop} \approx 1.99\bar{d} \tag{23}$$

$$\delta_{zero} \approx 1.33\bar{d}; \tag{24}$$

$$\epsilon_{max} \approx 2450\% \, t\bar{d}/l^2; \tag{25}$$

where $f_{push}$ and $f_{pop}$ are the peak forces required to be applied to achieve "snap-through" from the first to the second stable position and from the second back to the first stable position, respectively, as defined in the plot of FIG. 3A; $\delta_{push}$ and $\delta_{pop}$ are the corresponding centerpoint beam deflections at which these forces occur; $\delta_{zero}$ is the deflection at which the force is zero, at the unstable, "snap-though" point; and $\epsilon_{max}$ is the maximum strain experienced by the beam during its entire travel. Thus, if the travel of the beam, i.e., the initial maxima deflection at the centerpoint, $\bar{d}$, can be made large relative to the beam thickness, or if a thin beam, relative to the centerpoint deflection, can be accommodated for a selected application, then the concise expressions (22)–(25) can be employed, significantly reducing the computational requirements of the design. For other design scenarios, where the quality factor, Q, is less than 6, the design analysis given above for evaluation of expressions (12) and (13) is preferred for determining the geometric and operational parameters of the structure.

The design analysis above can be efficiently carried out by employing, e.g., MATLAB, of The MathWorks, Natick, Mass., to determine points of a force-displacement characteristic and thus to determine acceptable geometric parameters for a given application. Appendix A presents MATLAB code for carrying out the analysis.

Illustrating the impact on bistability of the quality factor, Q, FIGS. 6A, 6B, 6C and 6D are plots of force-displacement characteristics of beam structures designed with an initial as-fabricated first mode bending curve like that of expression (1) above, and with a quality factor, Q, of 2, 3, 6, and 10, respectively. Curves 61a, 61b, 61c and 61d, denoted with triangles, are the force-displacement characteristics of beam structures that have not been provided with an initial configuration or constraining feature that prohibits development of the second bending mode, i.e., the structures corresponding to these curves can develop the second bending mode during their deflection. Curves 60a, 60b, 60c and 60d, denoted by circles, are the force-displacement characteristics of beam structures that have been constrained, by both an initial curvature and by a central clamp, such that development of the second bending mode is prohibited.

From the plots, it is shown that a beam is bistable if a region of its force-displacement characteristic is negative, i.e., if there exists a region of displacement over which the force is negative. For the case of an unconstrained beam, there is no substantial region of displacement over which the force is negative, for any value of Q, and hence the unconstrained beam cannot be bistable. However, for a constrained beam having a Q value greater than about 2.35, namely, the plots 60b, 60c, and 60d, a negative force is exhibited over a usefully wide region, and so the corresponding beams are bistable. Note further that for beams having a Q value greater than or equal to about 6, as in curves 60c and 60d, the corresponding force-displacement characteristics reach the asymptotic relations of expressions (22)–(25) above.

Figure 7:
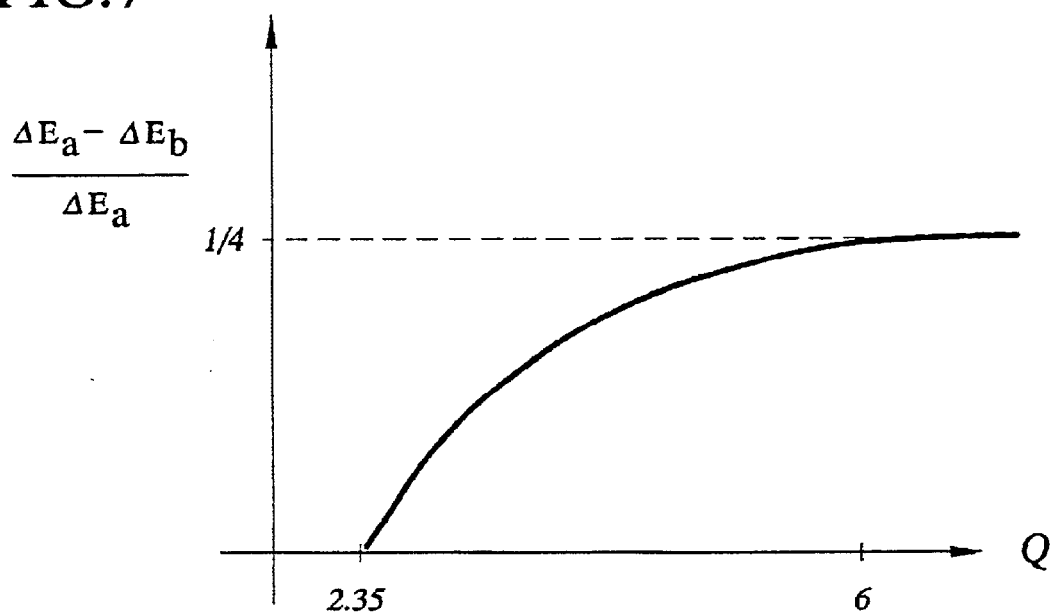
FIG. 7 is a plot of a ratio of energy barriers defined in FIG. 3B as a function of Q, a geometric quality factor.

Referring to FIG. 7, the impact of the value of Q on the bistability of a structure is more clearly shown. In the plot of the figure, the ratio of $(\Delta E_a - \Delta E_b)/\Delta E_a$, where $E_a$ and $E_b$ are the potential energy barriers of the plot of FIG. 3B, is given as a function of the quality value, Q. For a Q value less than 2.35, the ratio is undefined. Above a Q value of about 2.35, the ratio asymptotically increases to a value of $\frac{1}{4}$, at which point Q is about 6.

Based on the design analysis just given, it is clear that to achieve bistable actuation, the invention does not rely on axial preloading of a structure; no residual stress need be provided to enable the bistable actuation. Geometric parameters alone, which are imposed as the beam is fabricated, are employed to produce a bistable configuration. It is recognized, however, that for a given bistable design produced in accordance with the invention, axial preloading or the provision of residual stress can additionally be accommodated by the structure while maintaining the bistable characteristics of the structure. If residual stress in the structure can be very well controlled, the inclusion of such may for some applications enable a shorter structure or a smaller required initial curve apex, i.e., maxima, or may enable a reduction in actuation force or other enabling characteristic. It is recognized, however, that the cost savings, efficiency, and reliability enabled by elimination of a need for residual stress can be most beneficial, and therefore preferred, for many applications.

Figure 6A:
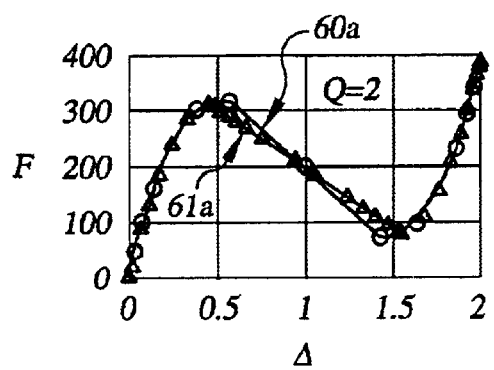
FIGS. 6A–6D are plots of force-displacement characteristics of varying beam geometries.
Figure 6B:
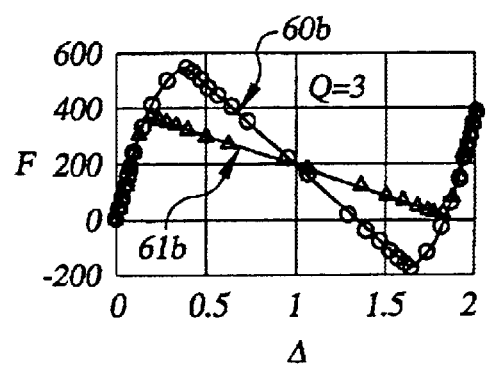
Figure 6C:
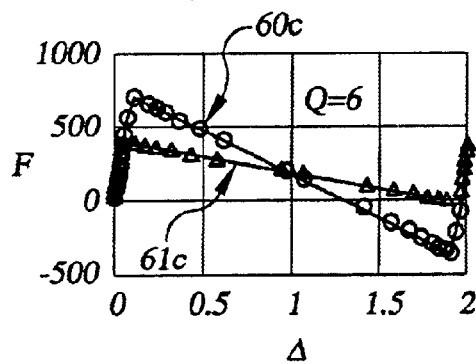
Figure 6D:
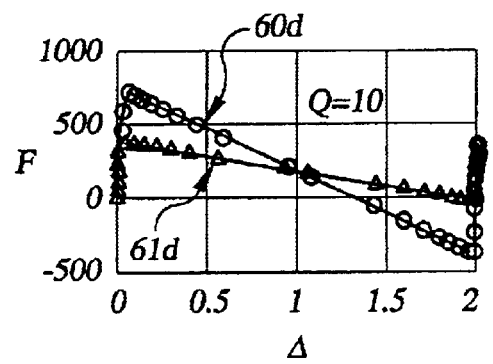

The invention provides a technique for optimizing the bistable structures of the invention, described above as well as below. Referring back to FIG. 3A, and to FIGS. 6C–6D, showing the force-displacement characteristics of bistable structures, recall that to deflect a bistable structure from the first stable position to the second requires the application of a force, $f_{push}$, that is sufficient to deflect the structure to its unstable middle equilibrium, or "snap-through" position. Once at its second stable position, deflection back to the first stable position requires application of a force, $f_{pop}$, that is sufficient to get back to the unstable middle equilibrium position.

From the design analysis presented above, and from FIGS. 3A and 6C–D, it is seen that for a bistable beam structure having a uniform thickness profile across the length of the beam, the force required to deflect the structure from the first stable position to the second is about twice the force required to deflect the structure from the second stable position back to the first, i.e., $f_{push}$ is about twice $f_{pop}$. For an example design employing a quality value, Q, of about 6 or greater, expressions (22) and (23) illustrate numerically this inequality in forces.

The efficiency, R, of a bistable structure provided by the invention can be expressed in terms of these two required forces as:

$$R = \frac{f_{push}}{f_{pop}}. \tag{26}$$

A typical application requires that the second force threshold, $f_{pop}$, be above some actuation threshold; e.g., an electrical relay switch application could require that $f_{pop}$ be above about 50 mN, to ensure that the relay remains "closed" even under some amount of inadvertent force application. Conversely, for many applications it is preferred that the first force threshold, $f_{push}$, be minimized to reduce the force required for actuation, e.g., minimizing the force required to move to a "closed" relay configuration.

As a result of these two operational design goals, it is in general desirable to minimize the force ratio R. Such a force minimization optimally meets two additional criteria, namely, minimization of structural geometry, and preservation of operational stress levels below the yield stress of the structural material. For most applications, this condition of operation below the yield stress is a requirement.

To enable a minimization of the required force ratio, R, it is therefore required to relate the forces of the ratio to geometric factors that can be correspondingly optimized. This can be accomplished by first recognizing that the required applied force, f, when normalized, as F, as given in expression (14) above, can be expressed over the linear region of the force-displacement characteristic between the two peak forces, $f_{push}$, and $f_{pop}$, as:

$$F(\Delta) = 4N_{j=2}^2(\Delta_{zero} - \Delta); \tag{27}$$

where $N_{j=2}$ is the third shape function of the beam bending mode, as given by expression (7) above, $\Delta_{zero}$ is the normalized peak deflection of the beam at the point of zero force, i.e., the unstable "snap-through" point, and A is the normalized peak deflection at a given applied force. This expression assumes a beam structure having clamped boundary conditions, following the parameters of the design example above.

Evaluating this expression at the two extremes, where the normalized peak deflection is either zero or is twice the peak of the initial stable condition, and substituting the resulting expression into the force ratio expression (26) gives:

$$R = \frac{\Delta_{zero}}{\Delta_{zero} - 2}. \tag{28}$$

When the normalized peak deflection is represented in terms of the normalized shape mode parameters, in the manner of expression (18) above, then the force ratio, R, is given as:

$$R = \frac{(N_2/N_0)^2}{(N_2/N_0)^2 - 2}. \quad (29)$$

In accordance with the invention, the force ratio, R, here given as a function of shape modes, is optimized by picking geometric parameters that move R as close as possible to unity within the constraints of the given application, i.e., picking of geometric parameters that equalize $f_{push}$ with $f_{pop}$ as much as possible within the other constraints given above. With this expression for R in (29), R can be optimized by selecting the beam thickness profile as a function of length, t(x), that adjusts the shape modes to produce an R as close to unity as possible for a given application's constraints.

Changes in the beam thickness profile are manifested in the shape function bending modes of the bistable beam structure in accordance with expression (7) above. Based on expression (29) above, when the ratio of $N_2/N_0$ is maximized, the force ratio, R tends to a value of unity. To determine the lengthwise beam thickness profile that obtains this maximization, the differential of this ratio is determined, as:

$$d\left(\frac{N_2}{N_0}\right) = \frac{1}{N_0}dN_2 - \frac{N_2}{N_0^2}dN_0 \quad (30)$$

$$= \frac{1}{N_0}E\frac{\int \delta I W_2''^2 dX}{\int W_2'^2 dX} - \frac{N_2}{N_0^2}E\frac{\int \delta I W_0''^2 dX}{\int W_0'^2 dX}$$

where E is Young's modulus of the material of the beam and $W_0$ and $W_2$ are the shape functions of the bending modes as given by expression (7). The moment of inertia, I, of the beam, can then be equated here as follows:

$$dI \propto \frac{1}{N_0}E\frac{W_2''^2}{\int W_2'^2 dX} - \frac{N_2}{N_0^2}E\frac{W_0''^2}{\int W_0'^2 dX}. \quad (31)$$

With this relationship, then to maximize $$\frac{N_2}{N_0},$$

a starting condition of the maximization operation is defined as a beam with constant thickness and therefore constant moment of inertia, I. The initial curve of the beam, as-fabricated, is specified by the design process described above; the centerline of the beam follows the desired curve, e.g., the cosine function of expression (1), and the starting condition of the optimization process is set as a constant-thickness beam. With this starting condition, the expression above is then solved for the shape function parameters $W_0$, $W_2$, $N_0$, $N_2$. Then the beam thickness profile is incremented, i.e., the thickness of the beam is modulated around the centerline of the beam as a function of beam length, thereby incrementing the moment of inertia, I, as I=I+dI, and the expression is again evaluated. With the resulting $$\frac{N_2}{N_0}$$

ratio, the force ratio, R, is evaluated for its closeness to a value of unity. Based on this evaluation, the beam thickness profile is then further incremented, and the force ratio, R, reevaluated. This iterative process is thus continued until the force ratio R is sufficiently close to unity for the requirements, and given the constraints, of a given application. This optimization process can be particularly efficiently implemented in software, e.g., MATLAB, from The Math Works, of Natick, Mass. Appendix B is a listing of MAT-LAB code for carrying out the optimization process.

Figure 24:
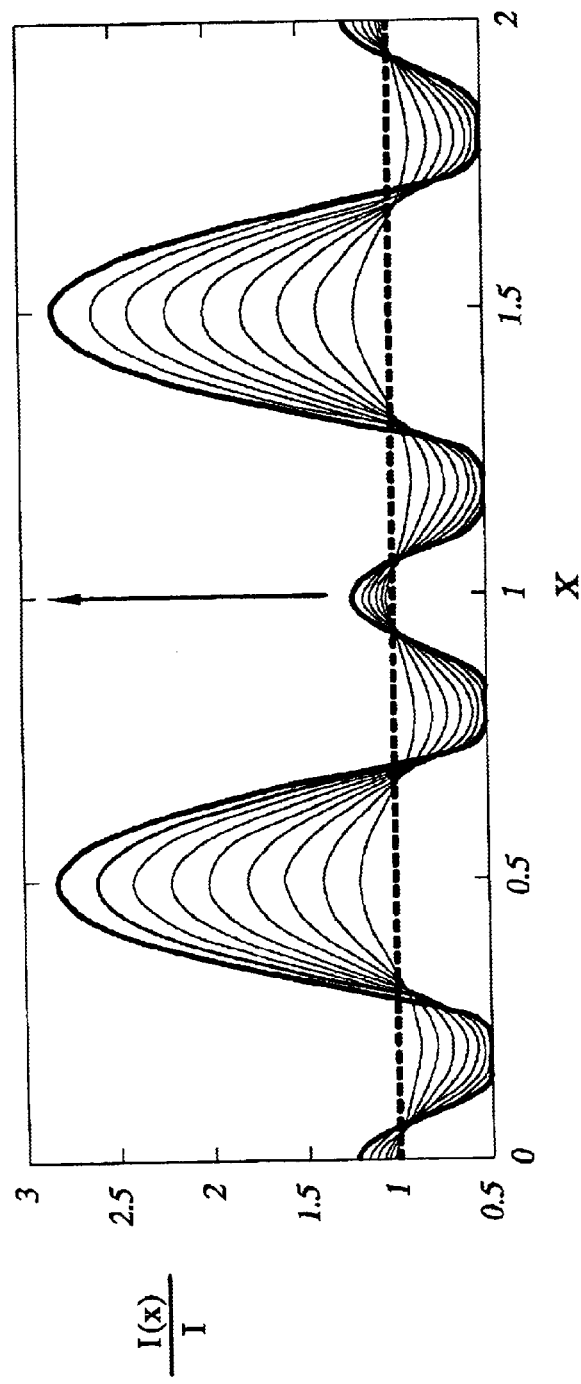
FIG. 24 is a plot of iterations of calculated beam moment of inertia as a function of beam length, normalized to a constant moment of inertia, provided by the optimization technique of the invention.
Figure 25:
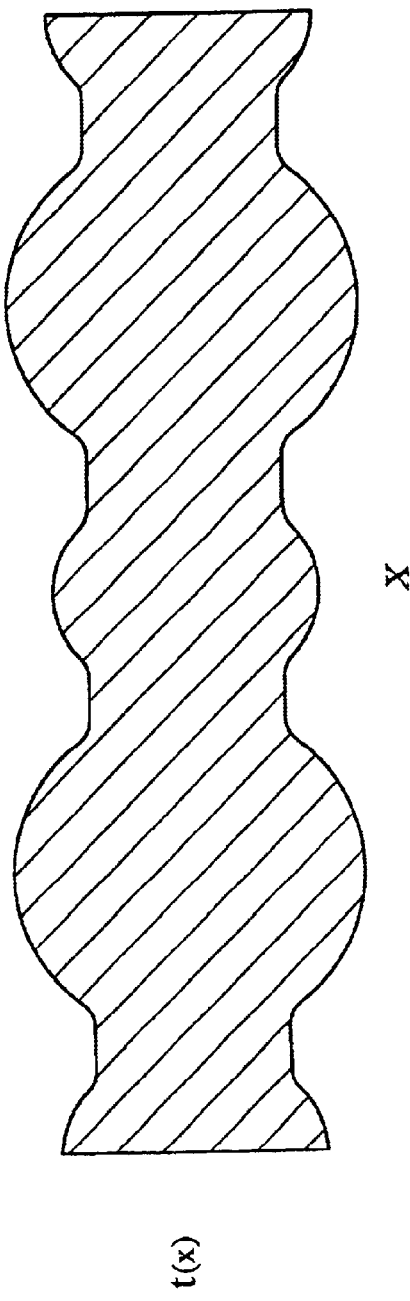
FIG. 25 is a plot of beam thickness as a function of beam length corresponding to the final optimized curve in the plot of FIG. 24.
Figure 26:
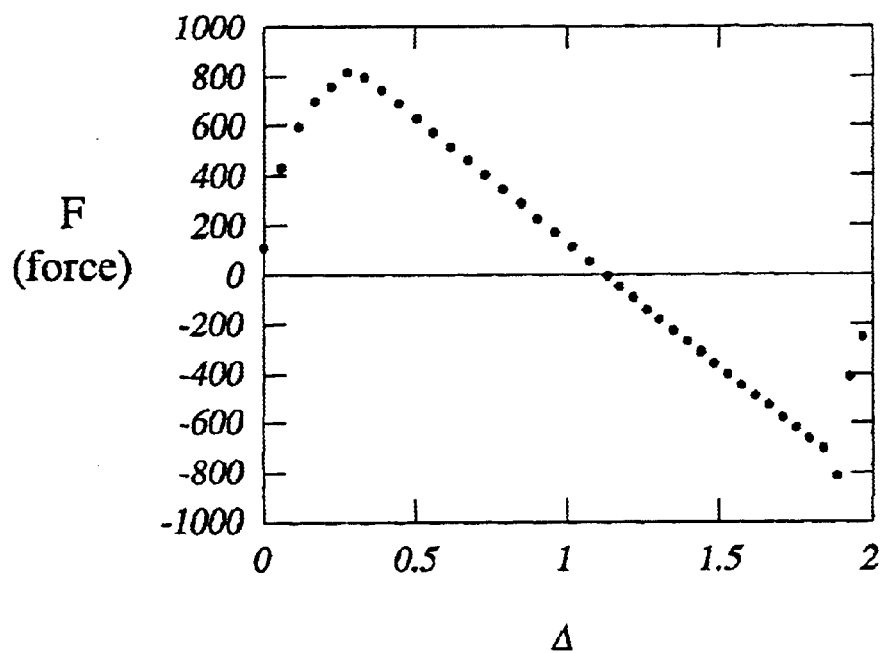
FIG. 26 is the force-displacement characteristic for a bistable beam structure of the invention as-optimized in accordance with the beam thickness profile of FIG. 25.

FIG. 24 is a plot of beam moment of inertia, normalized to the constant-profile moment of inertia, as a function of position along beam length, for ten iterations of the optimization expression given above. The straight dashed line represents a uniform-thickness beam, the starting condition, and the solid line is the final optimized moment of inertia. FIG. 25 is a plot of the actual beam thickness profile, t(x) for this final optimization. Note that this optimized beam thickness profile retains the beam curve that was initially specified to impose bistability; the undulating profile modulates the thickness of the beam along that original curve. FIG. 26 is a plot of the force-displacement characteristic for this optimized beam profile. This plot demonstrates that the optimized thickness profile enables beam shape modes that result in equating of the "push" and "pop" forces required to actuate the bistable structure between its first and second stable positions.

Turning now to the wide range of design alternatives contemplated by the invention, bistable beam structures provided in accordance with the invention can be formed of substantially any material. It can be preferable to employ a material that obeys Hooke's law; i.e., any material that has a substantially constant Young's modulus, E, but such is not required. Preferably the material is structurally resilient so that deflection of the structure can be repeatable. Example preferable materials include silicon, steel, aluminum, and other such materials. The invention also contemplates the use of composite as well as layered material configurations.

One, two, or more beams can be included in the structure, so long as each of the beams is configured to substantially prohibit development of that beam's second bending mode during deflection of the structure. Where two or more beams are included, the beams need not be identical; e.g., each can be of a distinct length, thickness, and width. The sidewalls of the beams, along their width and along their thickness, need not be perfectly straight; some degree of sidewall taper is acceptable. The number of the beams included in the structure can be greater than two; for any number of beams, each are to be configured, e.g., with a central clamp, to prohibit the second bending mode during structural deflection.

Each side of the structure between a central clamp member and a boundary can include a distinct number of beams; e.g., one side of the structure can include two beams with the other side of the structure including three or more beams. The more rigid the selected structure material, the thinner the clamp member can be while preserving bistability of the structure. Similarly, the more rigid the selected structure material, the wider the gap between the beams that can be accommodated, i.e., the longer the clamp member can be while preserving bistability. The lower limit to the gap between the beams is a slit, which can be operative for some applications. For some applications, the clamp member can be provided as multiple, side-by-side clamp members; e.g., as two or more parallel clamp members.

In addition, the boundary conditions of bistable beam structures produced in accordance with the invention can take on a range of conditions. In the design example given above, the bistable beam design is provided with clamped boundaries. For this condition, it is preferable but not necessary that the beam be substantially perpendicular to the boundaries. Normal machining tolerance errors in the rigidity of the boundarys' clamps and the perpendicularity of the boundaries are acceptable, and for some applications, even larger departures from rigid clamping and perpendicular clamping can be acceptable. Further, the two boundary edges need not be exactly aligned vertically with each other, i.e., one boundary can be offset from the other boundary, this offset taken in the plane of the page.

In general, the invention does not require clamped boundary conditions. Rather, the boundary conditions must impose a mechanical constraint at the ends of a span to be deflected between two stable positions. Rotational, hinged, and other such boundary conditions can be employed. Torsional spring elements can be provided at the boundaries. FIGS. 22A–D are schematic side views of bistable structures provided by the invention and having alternative boundary conditions. In the example shown in FIG. 22A, one boundary, here the left boundary 61, of a clamped double beam structure 62 is provided in a configuration that is mechanically unconstrained, i.e., free to deflect, while the second, right boundary 64 is clamped in the manner described above. It is found that the mechanical freedom provided at one of the boundaries reduces the "snap-through" force required to be applied to the structure below that "snap-through" force which would be required for the case in which both boundaries are clamped. Preferably, a constraining feature 66, e.g., a wedge structure, is provided at the location of the free boundary to enable constraint of that boundary after actuation of the structure, in the manner described below.

Figure 22C:
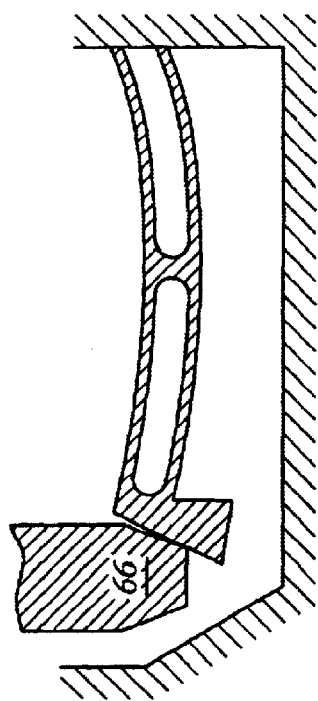
FIGS. 22A–22D are schematic views of a bistable double beam structure provided by the invention, here in a configuration in which one of the beam boundaries is softened or released during actuation of the structure, showing the first stable position, a position during deflection, the second stable position, and the first stable position including a thermally-expandable boundary region, respectively.
Figure 22D:
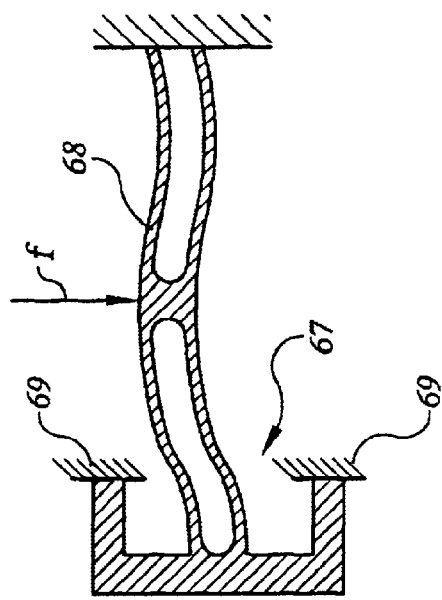
Figure 22A:
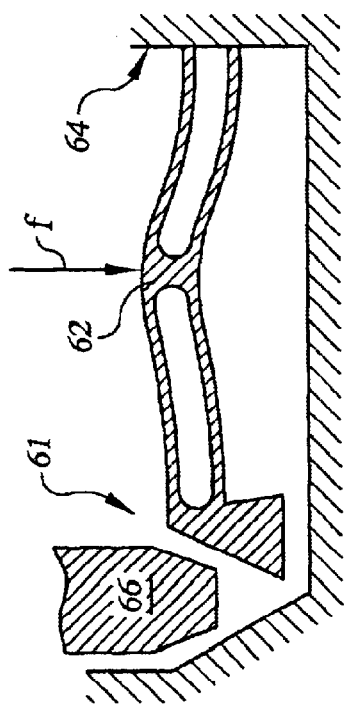
Figure 22B:
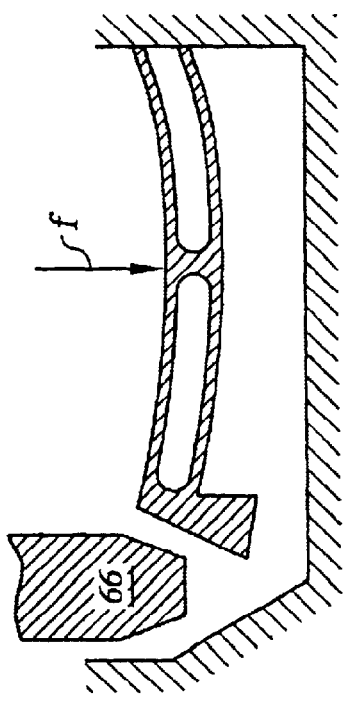

As shown in FIGS. 22A–B, the free boundary 60 is maintained in a configuration of mechanical freedom as a force, f, is applied to actuate the structure. The constraining feature 64 is configured such that when, as shown in FIG. 22C, the structure deflects to the second stable position, the constraining feature fixes the previously-free boundary. Now having a rigid boundary at both beam edges, the structure will stably remain in the position shown.

FIG. 22D is a schematic side view of a further boundary condition. Like the fixed-free configuration of the structure of FIGS. 22A–C, this alternative condition reduces the force required to actuate the double beam structure through the "snap-through" point between the two stable positions. In this example, the left boundary 67 of a centrally-clamped double beam 68 structure is connected to ground 69 in a fashion that enables actuation of the structure by thermal expansion. In operation, application of an actuation force, f, on the structure is carried out as the left boundary region 67 is heated, causing this boundary region to mechanically expand. Specifically, as the boundary region 67 is heated, this region expands, causing a change in the beam dimensions. This adjustment in beam dimensions in turn enables actuation at a force lower than that which would be required for fixed boundaries.

Figure 8A:
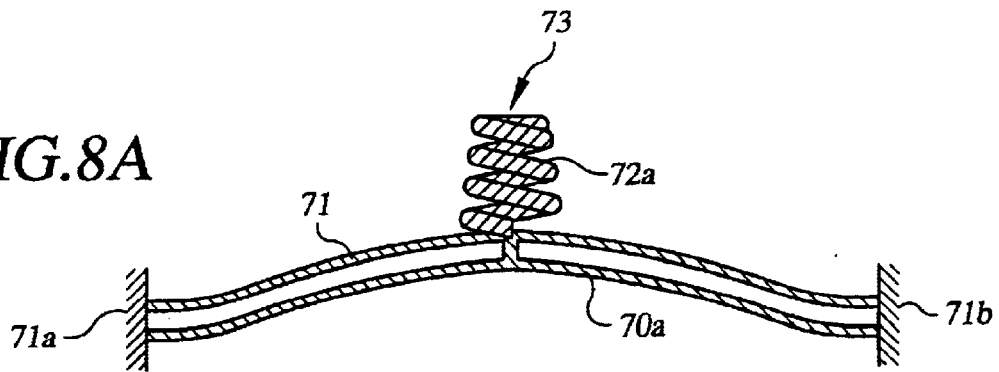
FIGS. 8A–8C are schematic views of a bistable double beam structure provided by the invention, here provided in a configuration in which the actuation force is applied to the structure via a soft spring in a manner that adjusts the required actuation force displacement characteristics of the structure, in accordance with the invention, showing the initial unstressed stable position, a deflection position, and the second stable position, respectively.
Figure 8B:
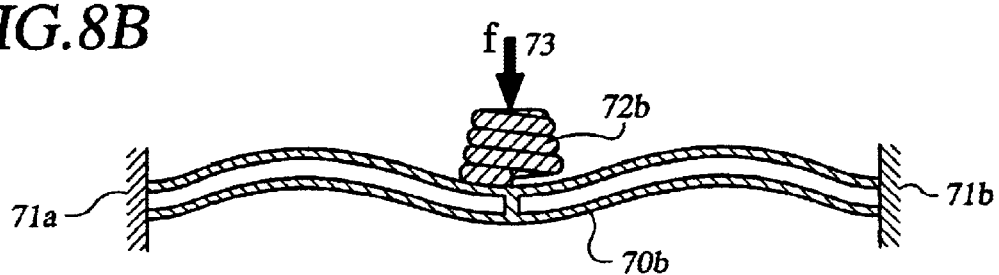
Figure 8C:
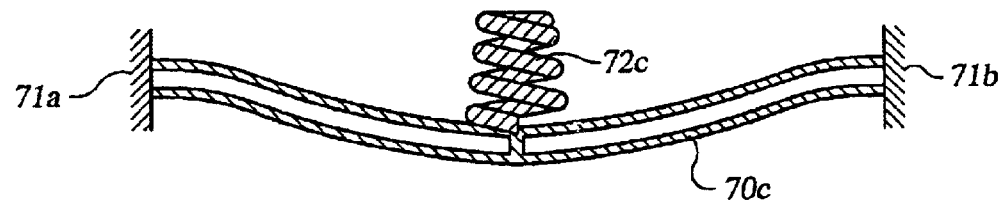

In addition to these boundary configurations, the invention contemplates a range of design alternatives for tailoring the force-displacement characteristic of a bistable structure such as a single or double beam structure. The force-displacement curve of the structures of the invention can be tailored in accordance with the invention by, e.g., providing a flexible member on the structure at the location at which force is applied to the structure. FIGS. 8A, 8B, and 8C are schematic side views of a such a configuration, here a bistable double beam structure 71 being actuated through a soft spring 73.

As shown in FIG. 8A, in this example, the double beam structure is provided with clamped boundary conditions 71a and 71b. In an initial condition, both the soft spring 73 and the double beam 71 take on unstressed configurations, 72a, 70a, respectively. As shown in FIG. 8B, a force, f, 73 applied at the soft spring will compress the spring to a compressed configuration 72b, and will also deflect the double beam in a deflection 70b, at some point in the force application causing the beam structure to "snap-through" to a second stable position shown in FIG. 8C as 70c. Such a soft spring arrangement can change the actuation force-displacement requirement for the double beam structure to enable a more symmetric force-displacement curve.

Figure 9A:
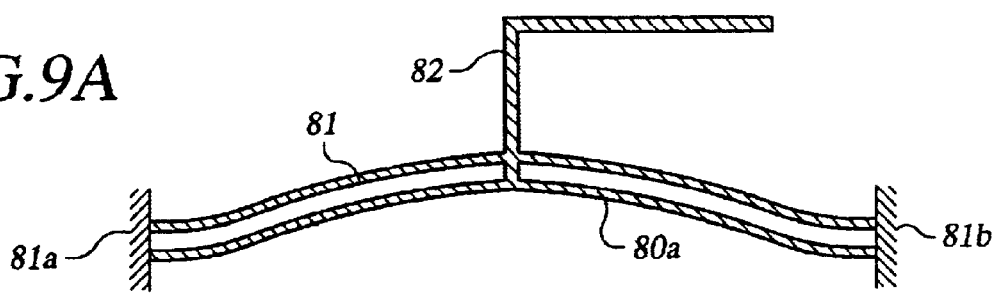
FIGS. 9A–9C are schematic views of a bistable double beam structure provided by the invention, here provided in a configuration in which the actuation force is applied not through the center of the double beam structure but instead through the end of a lever arm, in accordance with the invention, showing the initial unstressed stable position, a deflection position, and the second stable position, respectively.
Figure 9B:
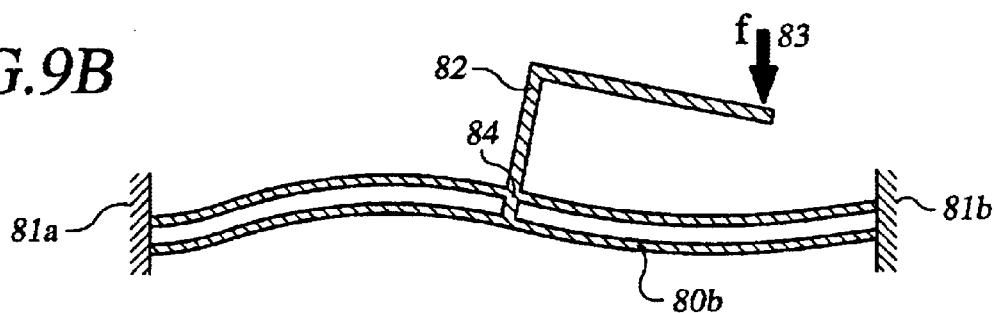
Figure 9C:
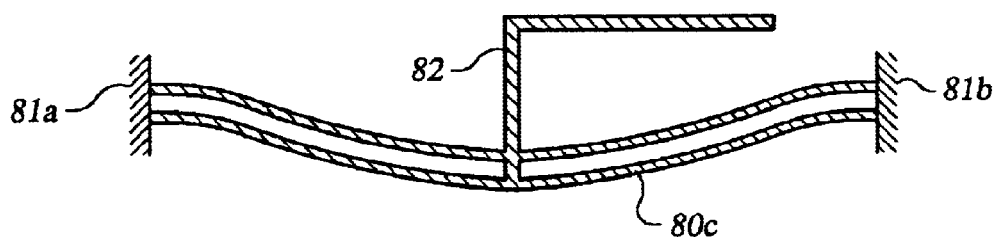

The invention contemplates the use of a range of force- and/or moment-transmitting structures, like the soft spring of FIGS. 8A–C, for applying an actuation force to the structure. FIGS. 9A, 9B, and 9C are schematic side views of a bistable double beam structure provided by the invention that can be actuated through a force/moment-transmitting structure 82. The double beam structure is provided with clamped boundary conditions 81a and 81b, as shown in FIG. 9A. The force/moment-transmitting structure 82 is here provided as a lever-like angled arm that is connected to a point between the ends of the beam structure, e.g., near to the center of the double beam structure. An actuation force, f, 83 is applied near or at the end of the lever structure 82 to impart an actuation force to the double beam structure.

With this configuration, the center portion 84 of the double beam structure experiences both force and moment. The applied moment causes a twisting of the structure, resulting in the structure shape 80b shown in FIG. 9B, which includes some component of the second bending moment. This second bending moment twisting in turn acts to slightly lower the potential energy barrier between the two stable positions 80a in FIG. 9A and 80c in FIG. 9C, but does not destroy the bistability. As a result of these conditions, this configuration enables a tailoring of the actuation force-displacement requirements for the double beam structure. The invention contemplates the customization of the lever arm geometry to provide tailoring of the force-displacement characteristic as-desired for a given application.

Figure 10A:
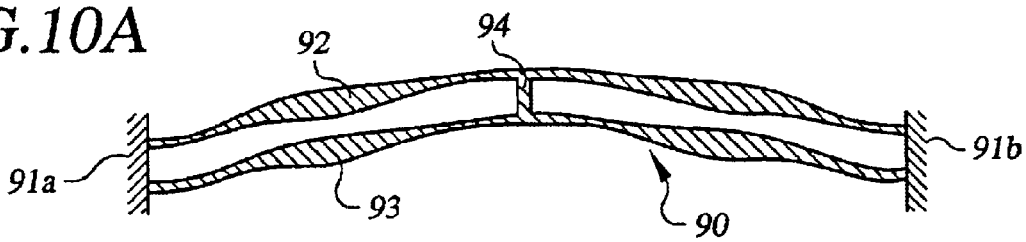
FIGS. 10A–10B are schematic views of a double beam structure of the invention, here including a beam thickness that is tailored as a function of beam length, in accordance with the invention, to enable tailoring of the force-displacement curve characteristic of the structure.

The invention contemplates additional techniques for tailoring the force-displacement characteristic of the bistable structures of the invention. FIG. 10A is a schematic side view of a double beam bistable structure 90 provided by the invention, here in which the thicknesses of the two beams are each tailored as a function of beam length, modulating an initially-selected curve in the manner of the optimization technique described above. The structure 90 is provided with clamped boundary conditions 91a and 91b. As shown in FIG. 10A, a clamping member 94 connects the beams at a point between their boundaries. In the example shown, the thicknesses of both the top beam 92 and the bottom beam 93 are varied along the beams' lengths; the invention further contemplates thickness variation of one, rather than both, beams.

In the example shown, the beams are thin at points near to the boundaries 91a, 91b and near to the clamp 94, relative to the region between the clamping member and the boundaries. This particular beam thickness tailoring acts to modify the bistable force-displacement curve of the structure in the manner described above, specifically by causing the ratio of force required for actuation to be reduced relative to force during movement between stable points, and thereby improving the efficiency, R, of the structure. It is found that the technique of tailoring the force-displacement curve by adjusting the beam thickness is very sensitive to the precise thickness configuration; e.g., it is found that the force-displacement curve adjustments resulting from raising the upper plane of a beam to thicken the beam are different from the force-displacement curve adjustments resulting from dropping the lower plane of the beam to thicken the beam. It is therefore recognized that the effect of the nature of a thickening or thinning technique must be considered.

Figure 10B:
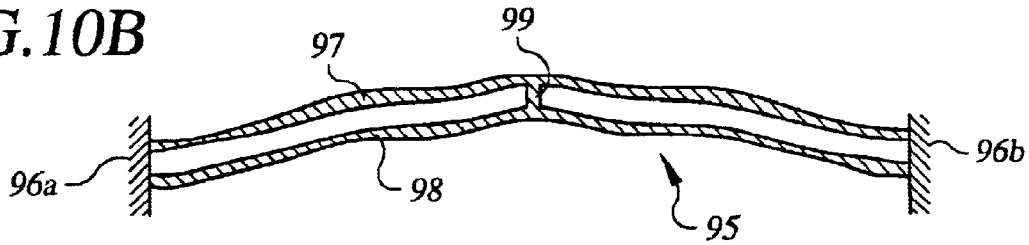

In a further example of a technique provided by the invention for tailoring the force-displacement curve of a bistable structure provided by the invention, the initial curve of the structure is itself tailored as a function of length. FIG. 10B schematically represents an example of such, here employing an initial curve that is not a pure cosine shape but rather is a higher order shape. The double beam structure 95 has clamped boundary conditions 96a and 96b. A clamping member 99 connects the beams at a point between the boundaries, e.g., near to the center of the structure. In accordance with the invention, the initial curve of the beams 97, 98 is characterized by a maxima, here located at about the center of the beams, at the location of the clamp. With this configuration, bistability of the structure is imposed in accordance with the invention. Although this rather generalized curve exhibits symmetry about the center point of the beams, such is not required; the curve of the beam can be asymmetric. Thus, in general, the prescribed curve of the beam, as-fabricated, can take on a wide range of trajectories so long as a maxima of the trajectory is located at least about one-quarter of the beam length from an end of the beam, and so long as the beam is constrained to substantially prohibit development of the second mode bending of the beam.

Figure 11A:
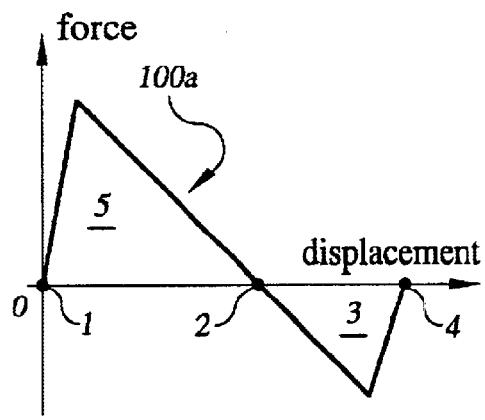
FIGS. 11A–11E are plots force displacement characteristics of a bistable structure of the invention that is adapted to alter the characteristics in the manner shown.

The impact of the various structural tailoring techniques described above on the force-displacement characteristic of a bistable structure is highlighted in the plots of FIGS. 11A–11E. FIG. 11A is a plot of the force-displacement characteristic 100a of a bistable double beam structure of the invention having uniform beam thickness and an initial cosine curve beam shape, with no structural tailoring; this corresponds to the generic bistable plot of FIG. 3A. As explained above, points 1 and 4 are the two stable positions, while point 2 is the unstable middle-equilibrium position. Also as explained above, for this configuration, the force required to move from the first stable position 1 to the unstable position 2, i.e., the force required to reach the "snap-through" point, through the first deflection zone 5, is larger than the force required to move back from the second stable position to the "snap-through" point, through the second deflection zone 3. This inequality in forces reflects the difference in energy barrier of deflection zones 3 and 5, as shown in the plot of FIG. 3B, as explained above.

Figure 11B:
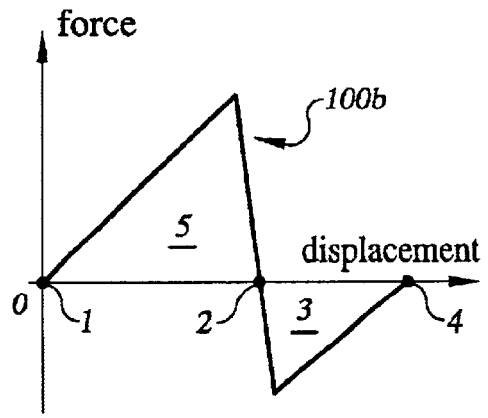
Figure 11C:
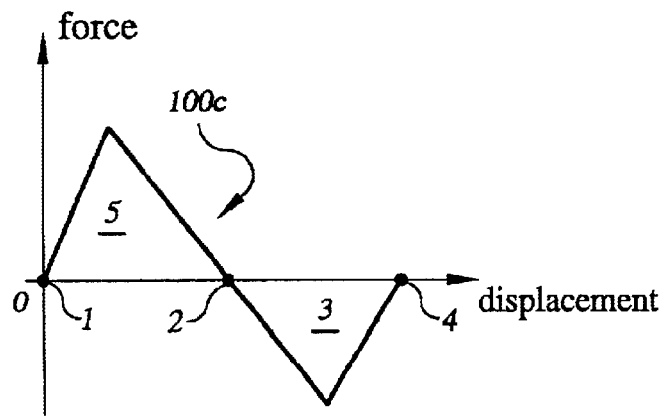

FIG. 11B is a plot of the force-displacement characteristic 100b of a bistable double beam structure like that of FIGS. 8A–8C that is "softened" by the inclusion of a spring at the point of actuation. It is seen that this feature acts to increase the distance in the first deflection region 5 over which the displacement force required to achieve "snap-through" can be applied effectively. FIG. 11C is a plot of the force-displacement characteristic 100c of a bistable double beam structure of the invention in which the thicknesses of the beams are tailored over their lengths, in the manner of FIG. 10A. It is seen that this thickness tailoring acts to lower the peak force required to deflect the structure from the first stable point through the first deflection zone 5 for achieving "snap-through" to the second stable point, relative to the peak force required to deflect the structure from the second stable point through the second deflection zone 3 for achieving "snap-through" back to the first stable point. This preferable condition is described in more detail below.

Figure 11D:
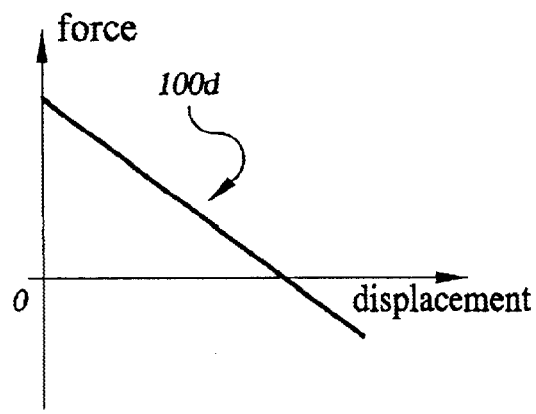
Figure 11E:
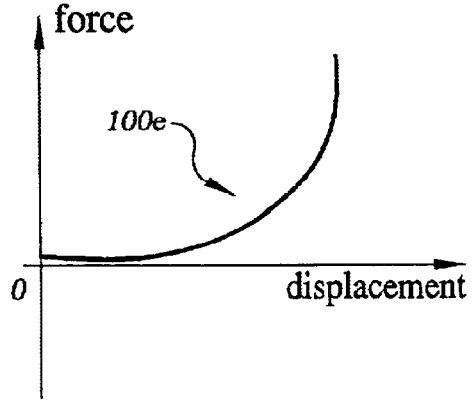

A wide range of techniques can be employed for actuating the bistable structure of the invention. Considering first the effect of a selected actuation technique on the force-displacement characteristic of a structure, FIG. 11D is a plot of the force-displacement characteristic 100d associated with thermally-actuated structures generally, and FIG. 11E is a plot of the force-displacement characteristic 100E associated with electrostatically-actuated structures generally, modeled on a configuration of parallel plates that can move toward each other to close an intermediate gap normal to the plates. Comparing the various plots of FIGS. 11A–E, it can be seen that the bistable actuator associated with the characteristic of FIG. 11A is best suited for an actuation mechanism requiring a force-displacement characteristic like that represented for thermal actuation as in FIG. 11D. Conversely, the bistable actuator associated with the characteristic of FIG. 11B is best suited for an actuation mechanism that requires a force-displacement characteristic like that represented for electrostatic actuation as in FIG. 11E. A particular advantage of the class of actuators provided by the invention is their adaptability for meeting a wide range of actuation requirements while at the same time providing bistability.

The class of bistable structures provided by the invention can be actuated by many different methods; that is, the structures can actuated from one stable position to the other, and back again, by many different methods. In essence, an actuation technique must apply a force to the bistable structure so as to move the deflectable member of the structure from its first stable, or rest position to just beyond the unstable middle-equilibrium point defined in the plots of FIGS. 3A–B. Beyond that point, the structure automatically "snaps-through" to the other stable, or rest position. The actuation method can, however, continue to apply a force to the structure after the "snap-through" action has begun, although it need not. Thus, in general, actuation of the bistable structures of the invention requires simply the ability to push on the structure, imparting a pushing force that is sufficient to cause "snap-through" of the structure between the stable positions.

For the single and multi-beam structures described above, an actuation force can be applied at the center of a beam, at a point off-center, or as a distributed force along the length of the beam. The exact point of application is preferably selected based on the requirements of a given application, but in general, the force is generally most preferably applied at a point near to or at the beam center because the beam slope remains zero at that location, whereby the actuator need not twist to match the slope. It is recognized in accordance with the invention, however, that application of a force at a point off-center can be preferred for some applications to suppress buckling of the beam by somewhat reducing overall applied actuation force.

The bistable beam structures of the invention can be actuated by a mechanism that is integrated with the beam structure and that operates manually, electrically, thermally, or magnetically, all as described in detail below. As an example of a point-wise applied force, a beam structure provided by the invention can be actuated, e.g., manually, by an external probe applied to the beam to push on the beam. As an example of a distributed force application mechanism, a magnetic field actuation technique can be employed, as described in detail below. For many applications, an integrated or automatic actuation mechanism can be preferred. Such an actuation mechanism can include moving members that swing or extend into contact with the beam structure and then push or pull the beam from a first stable position through a given deflection zone to the "snap through" condition for actuation to the other stable position. A first actuation mechanism can be employed to actuate the structure in one direction, with a second identical or distinct mechanism employed to actuate the structure beam in the opposite direction. Alternatively, a single mechanism can be configured to actuate the structure in both directions. The invention does not dictate on which side of the bistable structure an actuation mechanism is located, actuation mechanisms can be provided on one or both sides, depending on the requirements of a given application.

Figure 12A:
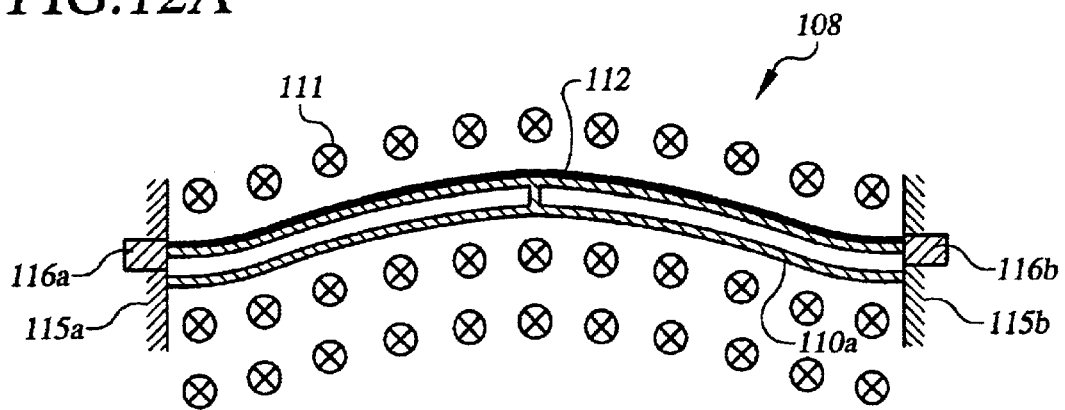
FIGS. 12A–12F are schematic views of a bistable double beam structure provided by the invention, actuated by application of a magnetic force in accordance with the invention, showing the initial unstressed stable position, a deflection position, the second stable position, an unstressed stable position relative to relay contacts, a deflection position relative to relay contacts, and the second stable position, closing relay contacts, respectively.
Figure 12B:
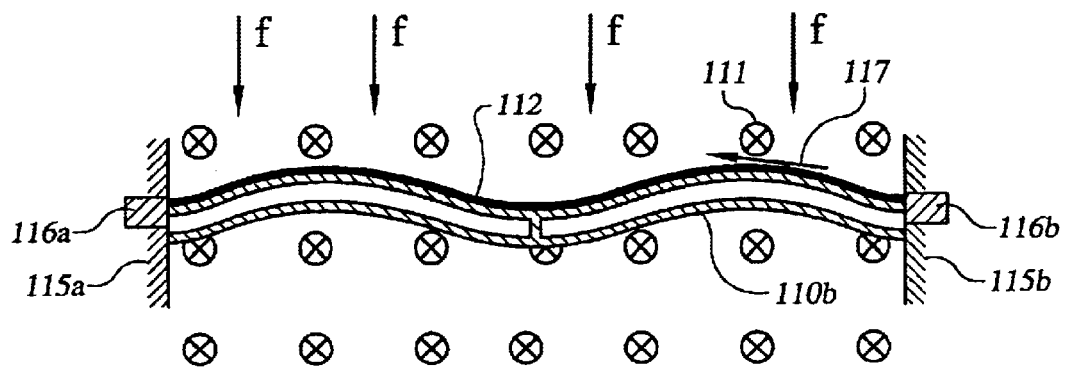
Figure 12C:
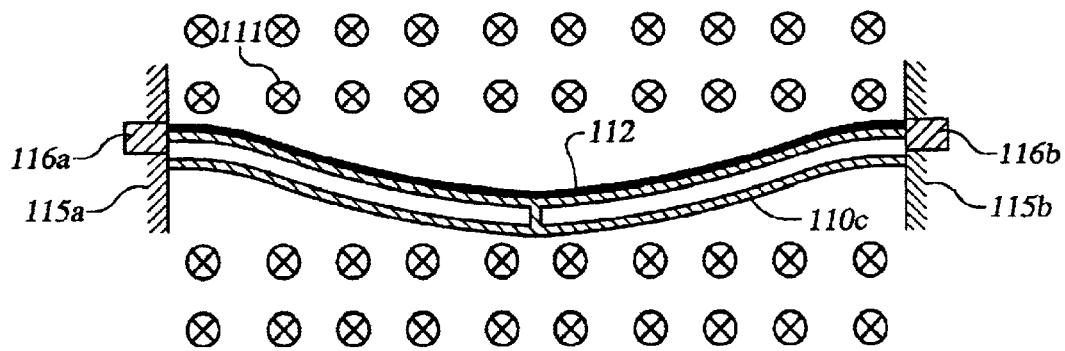

Turning to the specifics of a first actuation example, FIGS. 12A, 12B, and 12C are schematic side views of an initially curved, unpreloaded double beam structure 108 provided by the invention and actuated by a magnetic actuator. The double beam structure here has clamped boundaries 115a and 115b. A metal layer 112 is provided at one side of the double beam structure and is electrically connected to two electrical terminals 116a and 116b. Alternatively, the double beam structure itself can be provided as conducting, e.g., as an aluminum structure. A permanent magnet is provided in the vicinity of the structure such that the structure is exposed to a magnetic field 111 in the direction shown, and particularly, such that the metal layer is within the magnetic field 111. FIG. 12A illustrates the structure in its first stable position 110a, having a curve prescribed by the design analysis given above.

Referring to FIG. 12B, to enable actuation, a current 117 is passed through the metal layer 112 in the direction shown, or is passed through the beam itself, if such is provided as conducting, thereby producing a downward force, f, on the structure due to the direction of the applied magnetic field 111 in the vicinity of the structure. The structure in turn deflects, following a deflection trajectory given as 110b. After the "snap-through" position is reached due to the force generation by the magnetic field, the structure moves to the second stable position 110c as shown in FIG. 12C. The structure can be actuated back to its initial stable position 110a by application of a magnetic force produced by an electrical current 117 that is reversed in direction from that applied to achieve the original actuation. With this operation, it is found that the force generated by the magnetic field is applied to the beam structure in a distributed manner along the length of the beam. This actuation technique can therefore be preferred for applications where such distributed actuation is optimal.

Figure 12D:
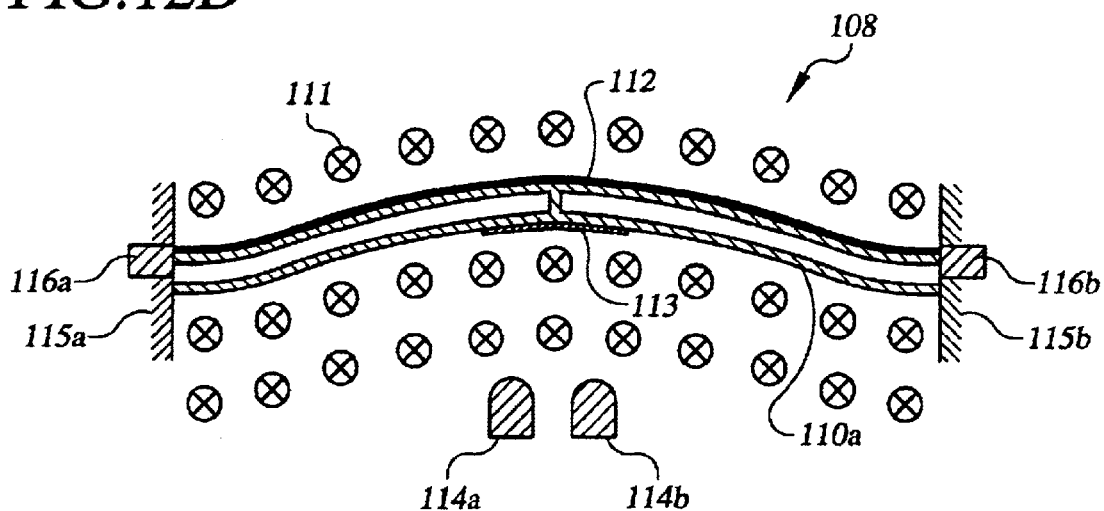
Figure 12E:
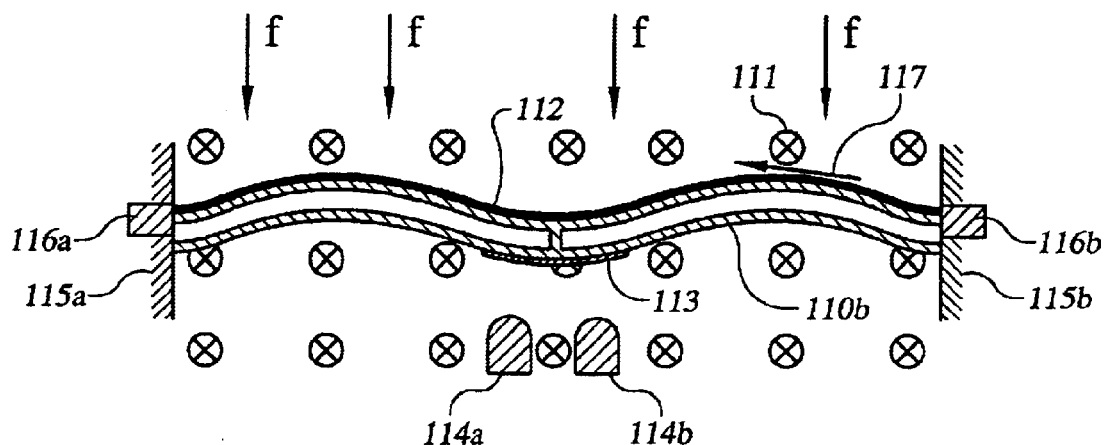
Figure 12F:
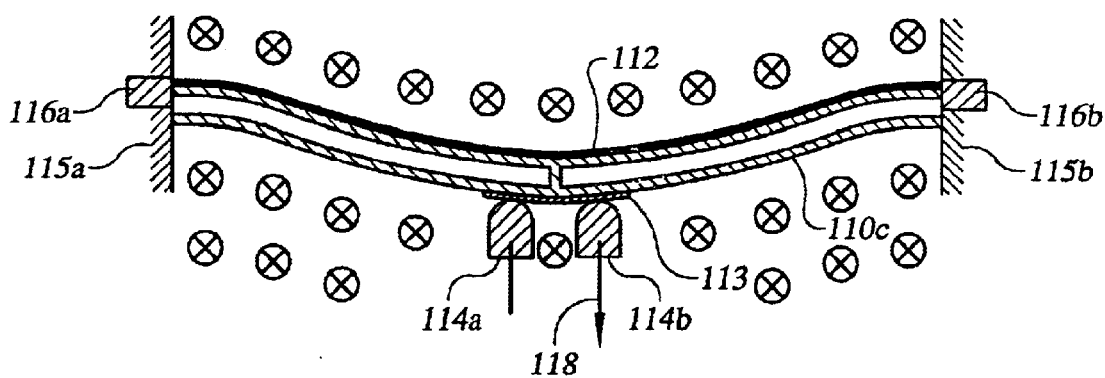

FIGS. 12D, 12E and 12F are schematic views of the initially curved, unpreloaded double beam structure 108 of FIGS. 12A–C, here configured for operation in an application as an electrical relay, and actuated by a magnetic field-generated distributed force in the manner described above. A first metal layer 112, as described above, is provided on a first side of the structure. On the opposite side of the structure is provided a second metal layer 113, along with two corresponding electrical contacts 114a, 114b, forming the relay contacts. FIG. 12D illustrates the structure in its first stable position. A permanent magnet is provided to produce a magnetic field 111 in the vicinity of the structure in the direction shown, such that application of a current 117 to the first metal layer 112 in the direction shown produces a distributed actuation force, f, pushing the structure toward the relay contacts 114a, 114b, in the manner of the curve 110b shown in FIG. 12E.

Figure 13A:
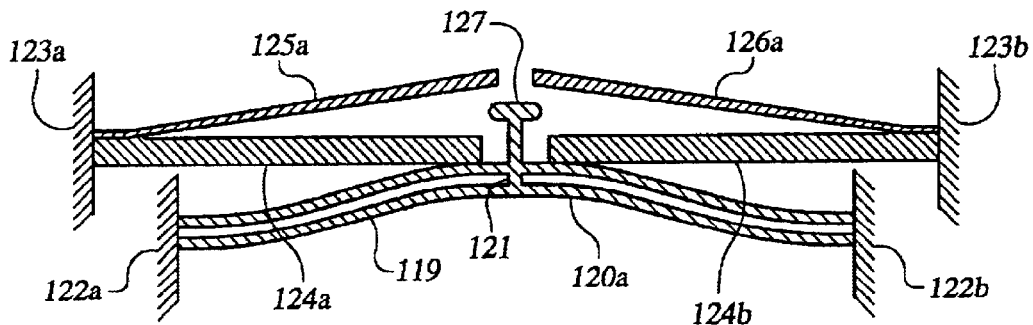
FIGS. 13A–13F are schematic views of a bistable double beam structure provided by the invention, actuated by application of electrostatic force in accordance with the invention; showing the initial unstressed stable position, a deflection position, the second stable position, an unstressed stable position relative to relay contacts, a deflection position relative to relay contacts, and the second stable position, closing relay contacts, respectively.
Figure 13B:
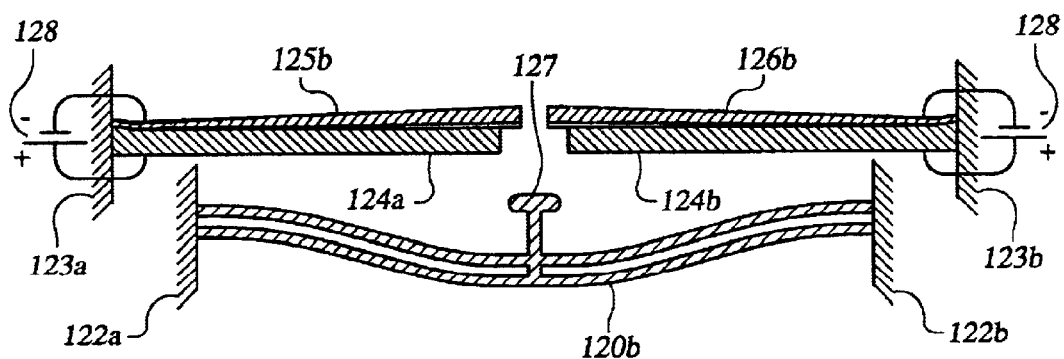
Figure 13C:
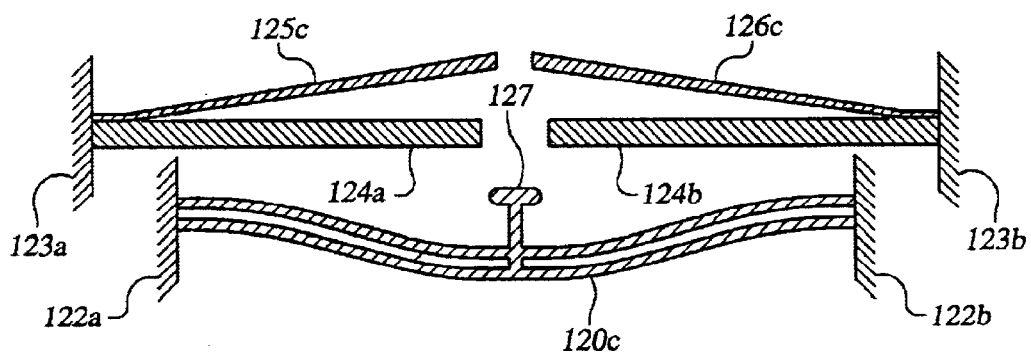

Once the "snap-through" position is reached, the structure automatically moves into contact with the relay contacts, specifically with the second metal layer 113 in a position of mechanical contact with both relay contacts 114a, 114b, as shown by the structural curve of FIG. 12F. With this configuration, conduction of a working current 118 is enabled through the second metal layer 113 from a first relay contact 114a to the second relay contact 114b. To break the relay connection and interrupt working current flow between the relay contacts, the actuation current 117 is reversed in the manner described above Turning to a further actuation example, FIGS. 13A, 13B, and 13C are schematic side views of an initially curved, unpreloaded double beam structure of the invention as-actuated by an electrostatic tapered "zipper actuator," so-called due to a "zippering" of actuation along the length of the zipper actuator that is enabled by electrostatic forces. The double beam structure 119 is in this example provided with clamped boundaries 122a and 122b, and an initial unstressed curve 120, as shown in FIG. 13A, that aids in prohibition of the second bending mode. A generally central clamp member 121 is provided between the two beams to further prohibit development of the second bending mode.

Two tapered-shape zipper actuation beams 125a, 126a are provided on one side of the double beam structure; these zipper actuation beams are free to deflect in the plane of the page. Provided below the two actuation beams are two corresponding rigid attraction beams 124a, 124b. The actuation and attraction beams 125a, 125b, 124a, 124b, are all clamped at one boundary 123a or 123b, with the other boundary of the actuation beams free to deflect. The beams are initially provided in spaced apart configurations 125a, 1126a. A thin electrical isolation layer is preferably provided on either or both the actuation beams and the rigid attraction beams to prevent electrical shorting between the beams when the actuation beams are actuated into contact with the rigid attraction beams in the manner described below.

Referring to FIG. 13B, when a voltage 128 is applied between the actuation beams and the rigid attraction beams, the tapered, relatively thinner outer region of the actuation beams tends to deflect toward the attraction beams. This decrease in beam spacing leads to an increase the electrostatic field strength between the beams, whereby the actuation beams "zipper" with the attraction beams along the beams' lengths, zippering from the outer, thinner regions down to opposite thicker ends, and resulting in the closed actuators 125b, 126b. The tapered shape design of the actuation beams, from thin at the boundaries to thicker at the free ends, ensures that the beams will start bending at the outer ends with a relatively small effort, in this case with a relatively small amount of electrostatic force, thereafter "zippering" along the beam length. This "zipper" actuation technique can be preferred for applications where more conventional electrostatic actuation configurations cannot produce sufficient actuation force for a given application. The reduced actuation gap produced by the initial deflection of the tapered outer actuation beam region enables an increase in electrostatic force.

When the beams are in positions 125b and 126b they in turn push the double beam structure down by pushing on a T-shaped force application structure 127 attached at, e.g., the mid-point of the double beams. With this downward pressure on the T-shaped structure, the double beam structure "snaps-through" to the second stable position 120b. As shown in FIG. 13C, the actuation beams are then returned to their initial positions 125c and 126c with the voltage 128 removed. The double beam structure remains in a curve 120c corresponding to the second stable position. The double beam structure can then be actuated back to its initial stable position 120a by employing an actuation and rigid attraction beam configuration, or other selected configuration, located on the opposite side of the double beam structure, or by employing a suitable "pulling" actuation mechanism on the same side.

Figure 13D:
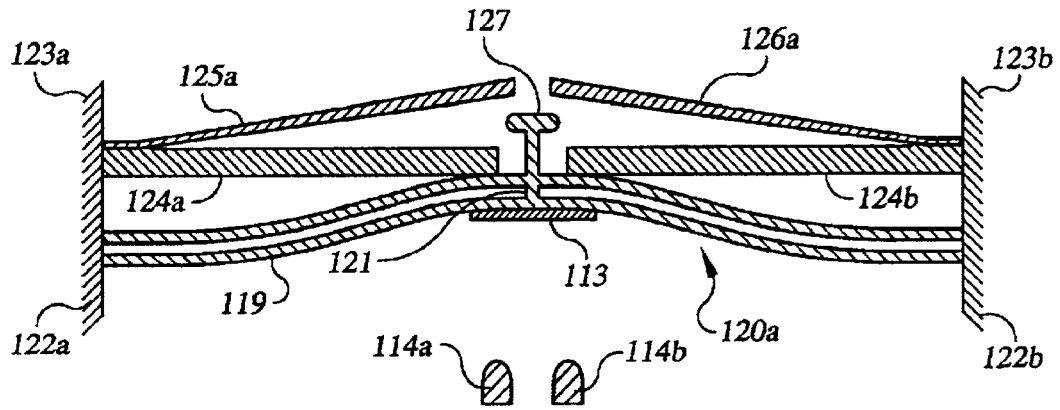
Figure 13E:
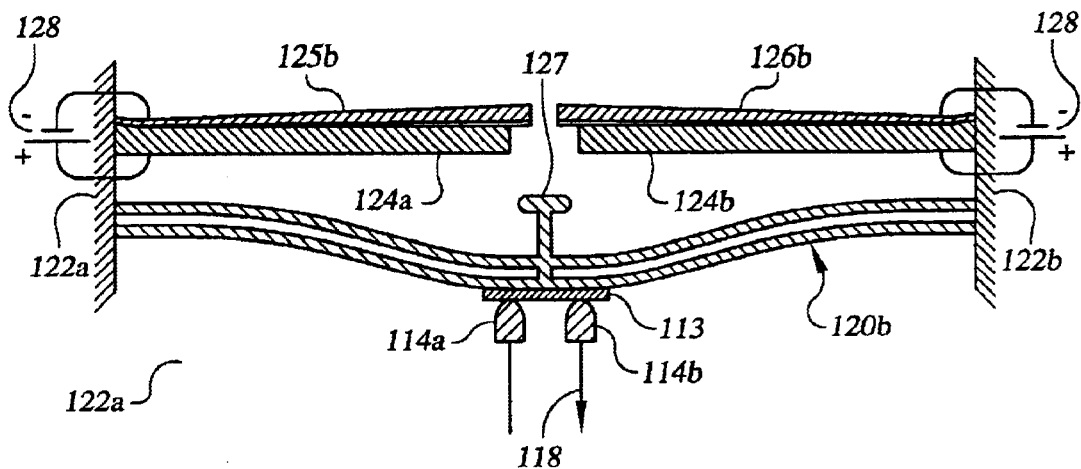
Figure 13F:
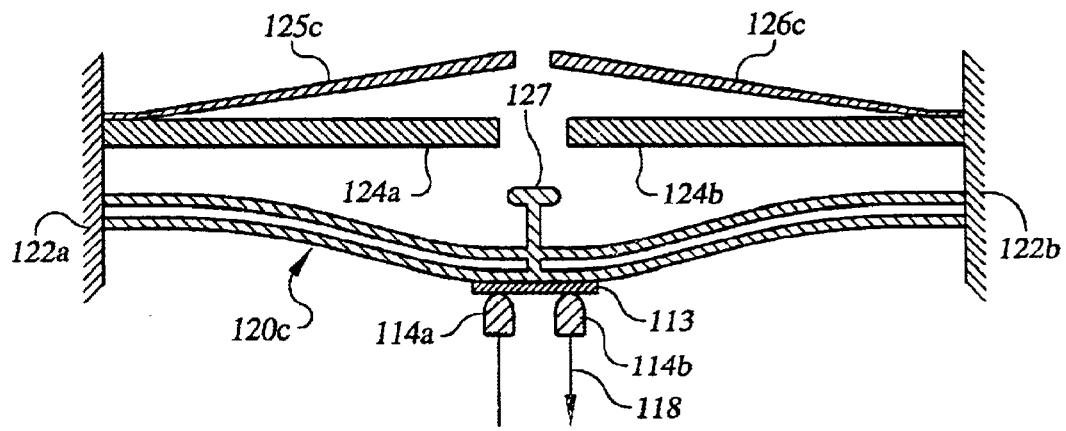

FIGS. 13D, 13E, and 13F are schematic views of an initially curved, unpreloaded double beam structure of the invention like that of FIGS. 13A–C, here configured as a relay and actuated by a tapered electrostatic zipper actuator in the manner just described. As in the previous example, two electrical relay contacts 114a, 114b, are here provided. A metal layer 113, provided on one side of the structure, enables conduction of a working current 118 between the relay contacts when the structure is in its second stable position 120b, as shown in FIGS. 13E–F. As shown in FIG. 13D, initially the double beam structure 119 is in a first stable, curved position 120a, and the actuation beams are in a separated configuration 125a, 126a from the attraction beams 124a, 124b.

Then as shown in FIG. 13E, when a voltage 128 is applied between the actuation and attraction beams, the actuation beams "zipper" over to the attraction beams, to a zippered position 125b, 126b, pushing on the push bar 127 and causing the double beam structure to "snap-through" to the second stable position 120b, connecting the metal layer 113 to both relay contacts 114a, 114b, for conducting the working current 118 through the relay contacts. With the voltage removed, the double beam structure then remains in the closed relay position, as shown in FIG. 13F. The relay can then be opened by a suitable actuation mechanism provided on the corresponding side of the structure or configured with the actuation mechanism shown.

The invention contemplates a wide range of alternatives in configurations for achieving zipper actuation of a bistable beam structure. In a first example alternative configuration 300, shown in FIGS. 23A–E, a double beam structure 3 is provided with clamped boundaries 304a, 304b, and a generally central clamp 3 for prohibiting development of the second bending mode of the structure during deflection. As in the example above, two actuation beams 308a, 308b are provided on one side of the double beam structure, each having one clamped boundary 309a, 309b, respectively, and a free boundary that interacts with a double push bar 311. The double push bar 311 is connected to the center point of the double beam structure, thereby to operated as a force applicator to the double beam structure. In this example, two rigid attraction electrodes 310a, 310b are provided adjacent to the actuation beams. It is again preferred that an electrically insulating layer be provided on the actuation beams, attraction electrodes, or both. At the outer end of each rigid attraction electrode is provided a compliant, deflectable beam 312a, 312b. In an initial condition, the double beam structure 302 is curved in a desired shape that aids in prohibition of the second bending mode. In this condition, there exists a gap 314a, 314b, between the actuation beams 308a, 308b, and the attraction electrode beams 312a, 312b. The inner free ends of the actuation beams here are not pushing in either direction on the push bar 311.

Figure 23A:
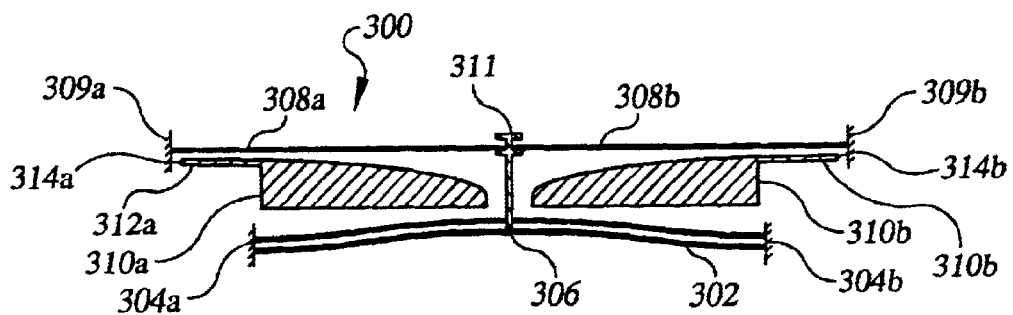
FIGS. 23A–23C are schematic views of a bistable double beam structure of the invention, actuated by an electrostatic "zipper" actuation mechanism, showing the structure in its first stable, and unstressed position, a position in which actuation is initiated, a position during actuation; a position in the second stable position, and a position in the second stable position after reset of the actuation mechanism, respectively.
Figure 23B:
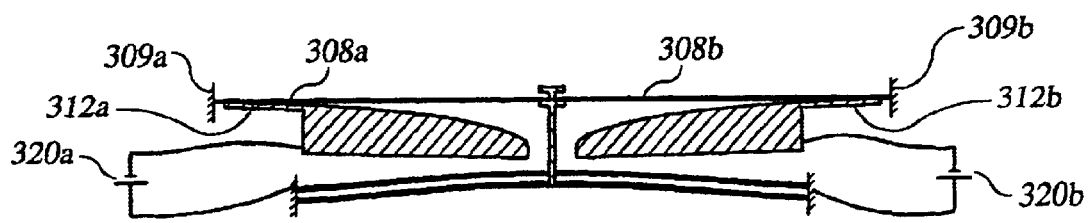
Figure 23C:
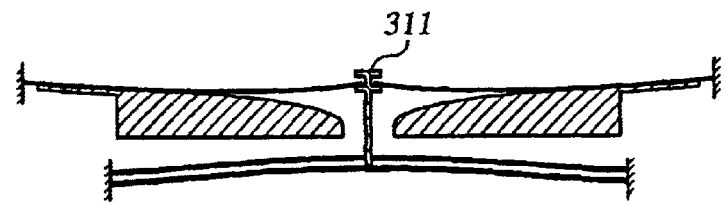

Referring to FIG. 23B, when a voltage 320a and 320b is applied between the attraction electrodes and the actuation beams, the attraction electrode beams 312a, 312b deflect toward and eventually mechanically contact the actuation beams 308a, 308b in the region of their clamped boundaries 309a, 309b. Once such contact is made, the electrostatic force in the gaps 314a, 314b, between the actuation beams and the rigid actuation electrodes becomes quite large, causing actuation beams to "zipper" along the edge of the rigid attraction electrodes. Two stages of this zippering are shown in FIGS. 23C and 23D.

Figure 23D:
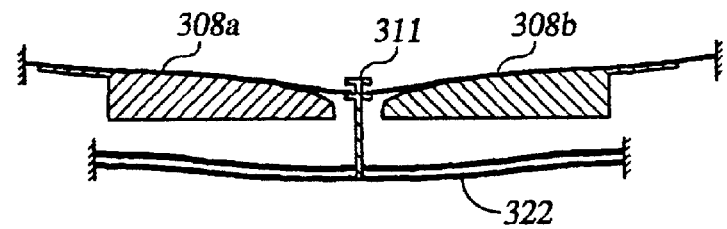
Figure 23E:
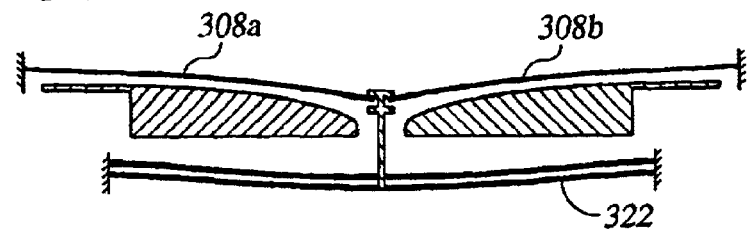

As the actuation beams "zip" along the rigid electrodes, the free ends of the beams, adjacent the push bar 311, push on a corresponding side of the push bar, causing the double beam structure to correspondingly deflect and "snap-through" to the second stable position 322 as shown in FIG. 23D. When the actuation voltage is removed, as in FIG. 23E, the actuation beams "unzip" from the rigid electrodes and push back on the push bar as they return to their initial position; the double beam structure maintains its second stable position 322, however. The double beam structure can then be actuated back to its initial stable position by employing an actuation and rigid attraction beam configuration like that shown but located on the opposite side of the double beam structure, or by other suitable mechanism, e.g., a "pulling" actuation mechanism provided on the same side of the structure.

Figure 27A:
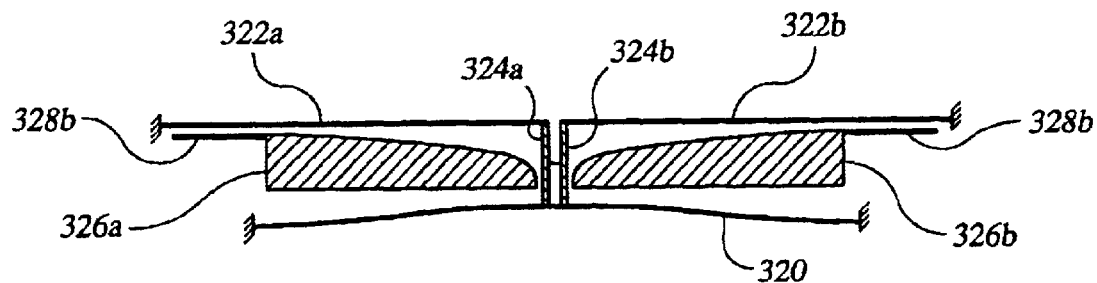
FIGS. 27A–27B are schematic views of a bistable single beam structure provided by the invention, actuated by an electrostatic "zipper" actuation mechanism, showing the structure in its first stable, and unstressed position, and in the second stable position, respectively.
Figure 27B:
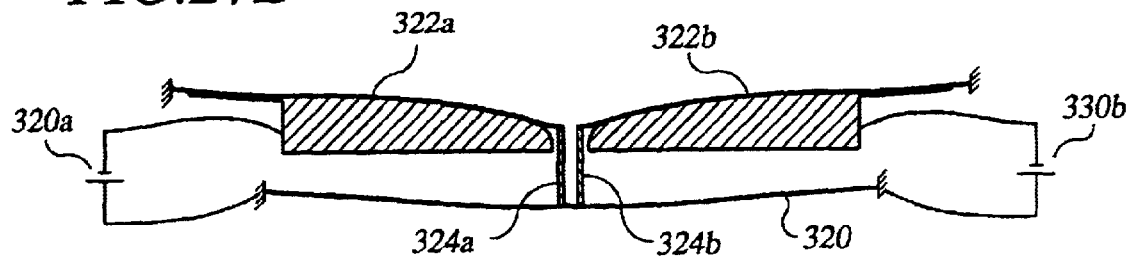

The invention contemplates a wide range of alternatives for this design. For example, as shown in FIGS. 27A–B, a bistable single beam structure 320 can be actuated by an electrostatic "zipper" configuration. Here two actuation beams 322a, 322b are connected to the single beam structure by way of orthogonal connecting beams 324a, 324b. The opposing ends of the actuation beams are clamped. Rigid attraction electrodes 326a, 326b are again provided, having deflectable electrode beams 328a, 328b. In an initial condition, as shown in FIG. 27A, the single beam 320 is curved in a first stable position and the actuation beams are separated from the attraction electrode beams.

Then, as shown in FIG. 27B, when voltages 330a, 330b are applied between the attraction electrodes and the actuation beams, the outer free ends of the electrode beams deflect toward the actuation beams, whereby the actuation beams then "zipper" along an edge of the attraction electrodes due to substantially increased electrostatic force. As this "zippering" occurs, the actuation beams push on the single beam structure 320 through the two orthogonal connecting beams 324a, 324b. The connecting beams therefore preferably are sufficiently rigid to transmit this pushing action. Once the pushing action causes the single beam structure to reach its "snap-through" point, the single beam structure automatically moves to its second stable position.

When the actuation voltages 330a, 330b are removed, the two actuation beams 322a, 322b separate from the rigid electrodes and apply some opposing force to the single beam structure as they move. However, it is preferred that the actuation beams be provided relatively thinner and longer than the single beam such that the force they exerted during this separation is very small compared to the force of the single beam when operating in an intended application in its second stable position. For example, in a relay application, it is preferred that the design parameters of the actuation beams render the force exerted by those beams much less than the contact force on the single beam structure when in a relay-closed position. As a result of this design preference the single beam structure maintains its second stable position even after the actuation voltage is removed. The single beam structure can then be actuated back to its initial stable position with a second actuation beam structure or other suitable mechanism.

Figure 28A:
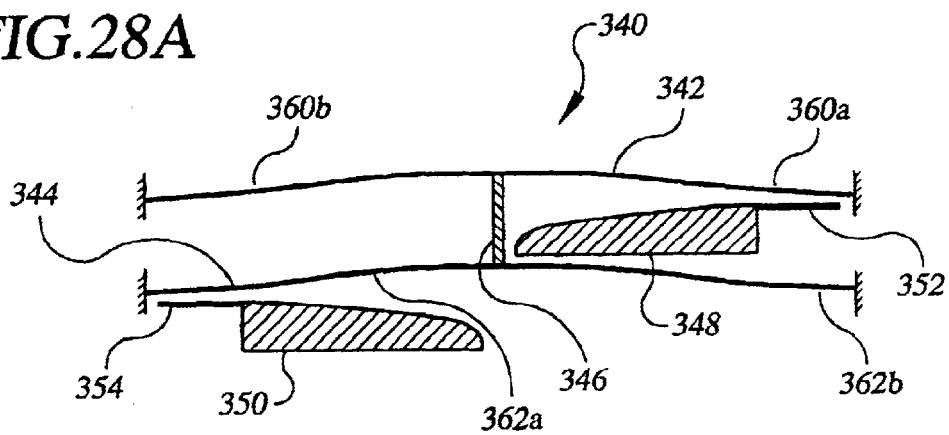
FIGS. 28A–28B are schematic views of an alternative bistable single beam structure provided by the invention, actuated by an electrostatic "zipper" actuation mechanism, showing the structure in its first stable, and unstressed position, and in the second stable position, respectively.
Figure 28B:
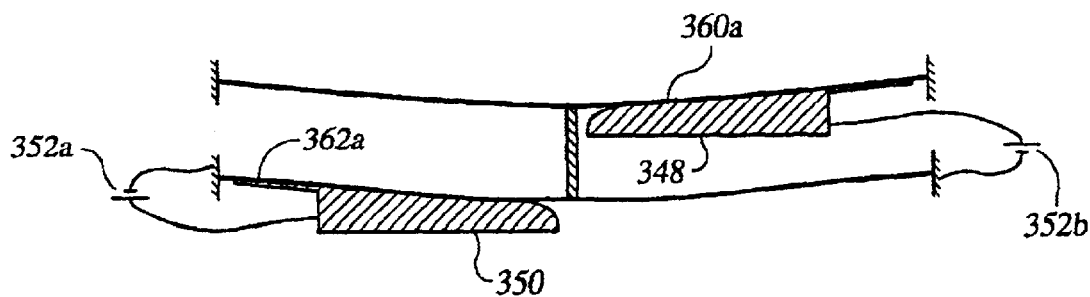

FIGS. 28A–B 28b are schematic side views of a further alternative configuration of an electrostatic "zipper-actuated" bistable structure. Here a bistable double beam structure 340 includes a first beam 342 and a second beam 344 connected together by a central clamp 346. For clarity, the first beam 342 is given as two first beam sections 360a, 360b, and the second beam 344 is given as two second beam sections 362a, 362b. Between the two beams is located a first rigid attraction electrode 348, and adjacent to the second beam is located a second rigid attraction electrode 350. Each rigid attraction electrode is provided with a corresponding deflectable beam 352 or 354.

In an initial condition, the double beam structure 340 is provided in a curved shape that prohibits development of the second bending mode and that is a first stable position. Here the attraction electrode beams 352, 354 are separated from the corresponding beam section 360a, 362a. When voltages 352a, 352b are applied between the rigid attraction electrodes 348, 350, and the double beam structure, held at ground potential, as shown in FIG. 28B, the electrode beams 352, 354 deflect toward a corresponding first or second beam section 360a, 362a. This causes those beam sections to "zipper" along the corresponding attraction electrodes 348, 350, due to the increased electrostatic force of the reduced separation. This "zippering" of one beam section in turn causes the opposite beam section of each beam to deflect, reaching "snap-through" and a second stable position.

It is found that with this configuration, the center clamp 346 effectively serves to suppress the second bending mode of the structure during deflection. The first section 360a of the first beam and the second section 362b of the second beam are found to develop the first bending mode, while the second section 360b of the first beam and the first section 362a of the second beam are found to develop the third bending mode. Because the third mode shape causes a wave on the electrode surface that can interfere with zipping, it is preferred to apply the electrodes only on the first mode beam sections. The double beam structure can be actuated back to its initial stable position by employing fixed electrode configuration like that shown but located on the topside of the two beams 31a and 31d.

Figure 29A:
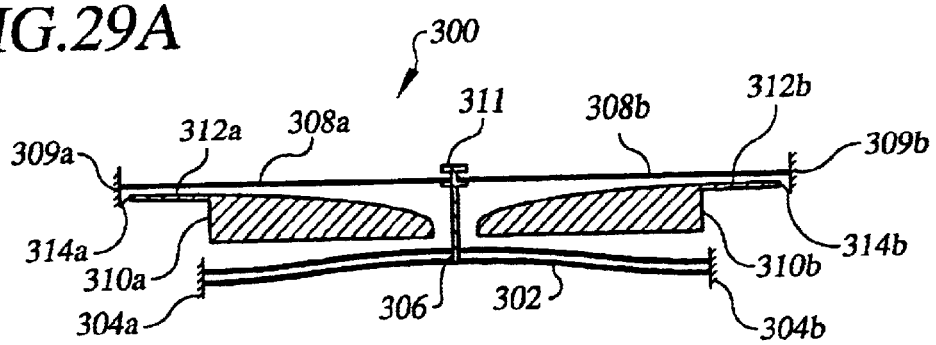
FIGS. 29A–29B are schematic views of an alternative bistable double beam structure provided by the invention actuated by an electrostatic "zipper" actuation mechanism, showing the structure in its first stable, and unstressed position, and in the second stable position, respectively.
Figure 29B:
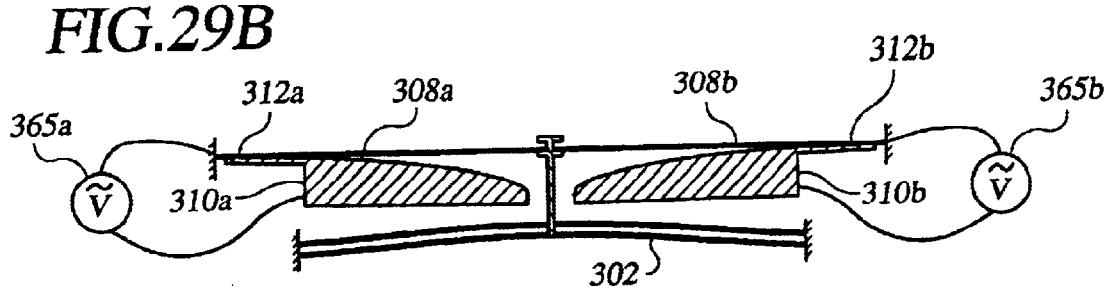

The invention contemplates adaptation of the electrostatic "zipper" actuation configuration to enable application of a varying electrostatic force. FIGS. 29A and 29B are schematic views the structure 300 first shown in FIGS. 23A–E, here having such an adaptation. FIG. 29A, like FIG. 23A, shows a double beam structure 3 in an initial, first stable position that is selected to aid in prohibiting development of the second bending mode. A center clamp 306 is provided between the beams in the manner described above. Without the application of an actuation voltage, the two actuation beams 308a, 308b are separated from the beams 312a, 312b of the rigid attraction electrodes 310a, 310b by an actuation distance 314a, 314b.

Referring to FIG. 29B, here an AC voltage 365a, 365b is applied between the actuation beams 308a, 308b and the attraction electrodes 310a, 310b. In a manner like that shown in FIG. 23B, this voltage application causes the attraction beams 312a, 312b to deflect to the actuation beams 308a, 308b. Then, in the manner described above, the actuation beams "zipper" with the attraction electrodes and the double beam structure is actuated to its second stable position. The frequency of the applied AC voltage 365a, 365b is preferably the natural frequency of the whole system. This enables a condition whereby with even a very low voltage, i.e., a very small electrostatic force, that alternates at the natural frequency of the system, the double beam structure is easily actuated. With this advantage, this actuation technique can be preferred for many applications. Indeed, this actuation technique can be applied to most of the other example structures here described.

Figure 30A:
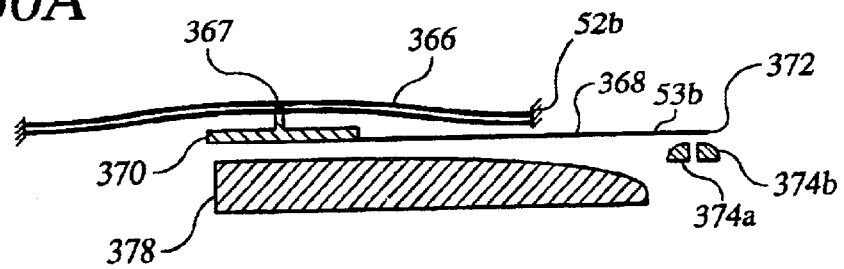
FIGS. 30A–30C are schematic views of a bistable double beam structure provided by the invention, actuated by an electrostatic "zipper" actuation mechanism, showing the structure it its first stable, and unstressed position, in the second stable position, and with the actuation mechanism engaged to close a relay contact, respectively.
Figure 30B:
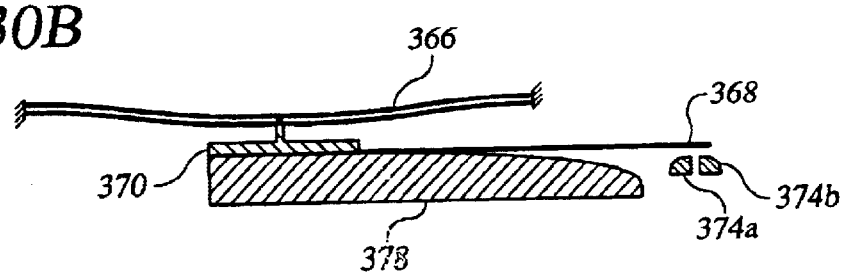
Figure 30C:
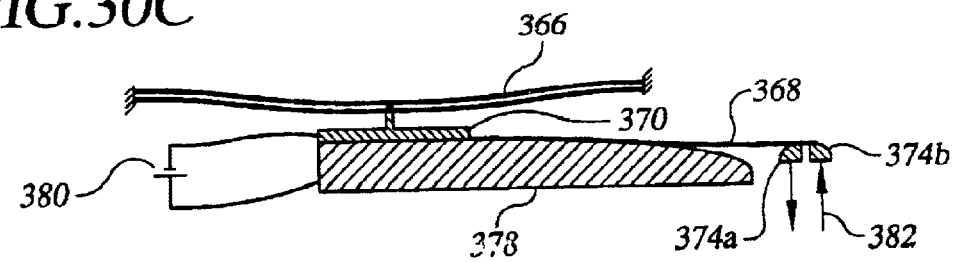

The invention contemplates the application of the bistable structures of the invention for actuation of other structures or to maintain a selected actuator configuration. An example of such an application is shown in FIGS. 30A–30C. Referring to FIG. 30A, there is shown a double beam structure 366 having a center clamp 367 to prohibit second mode bending of the structure. Further to prevent second mode bending, the double beam structure is provided in an initial curve of a first stable position. A "zipper-actuated," electrically conductive cantilever beam 368 is connected to the double beam structure 366 through a connecting element 370. The tip 372 of the cantilever beam 368 is in the proximity of an actuation application, e.g., two relay contacts 374a, 374b. In the as-fabricated configuration, a gap 376 separates the connecting element 370 from an adjacent, electrically conducting attraction electrode 378.

Referring to FIG. 30B, the double beam structure 366 is actuated from its initial stable position to its second stable position, causing the cantilever beam 368 and its connecting element 370 to be in contact with a region of the attraction electrode 378. The structure is then in-position for actuation of the cantilever beam 368 to close and open the relay contacts 374a, 374b. Referring to FIG. 30c, when a voltage 380 is applied between the attraction electrode 378 and the cantilever beam 368, e.g., by way of the connecting element 370, the cantilever beam will "zipper" along an edge of the attraction electrode to produce a closed relay path through the relay contacts 374a, 374b, enabling a working current to be directed through the relay path.

This configuration is particularly advantageous in that it provides an initial actuation configuration in which the cantilever beam contacts the rigid electrode at a clamped end, i.e., there is no actuation gap between the cantilever and the electrode, while having an opposite free tip 372. With this configuration, the voltage required to "zipper" the beam to the electrode is very low and remains low when the relay is closed. In addition, due to the cantilever beam design, the "zippering" of the cantilever down to its tip produces a lever arm amplification of force applied to the relay contacts. When the actuation voltage is removed, the cantilever beam opens the relay connection by bending back to its initial position.

Figure 14A:
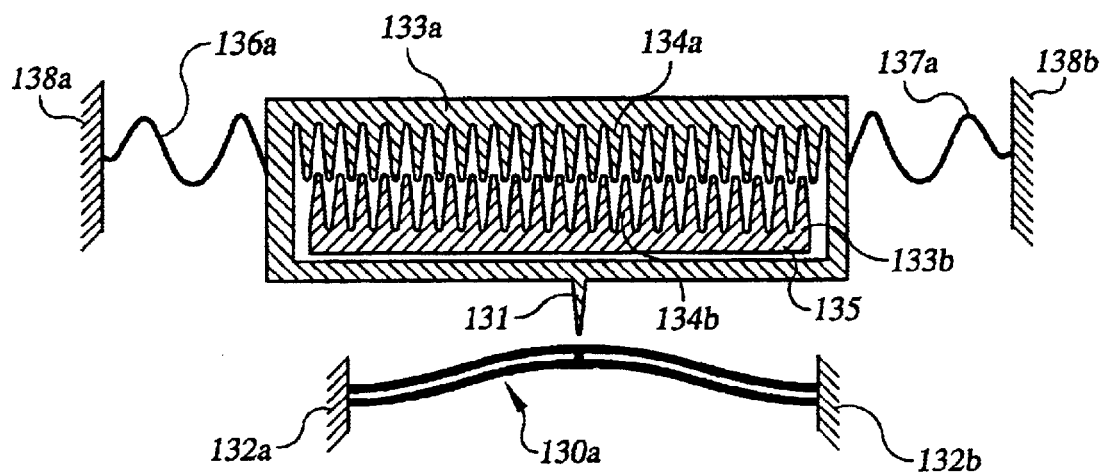
FIGS. 14A–14G are schematic views of a bistable double beam structure provided by the invention, actuated by application of an electrostatic force generated by a comb drive structure in accordance with the invention, showing the initial unstressed stable position, a deflection position, the second stable position, an unstressed stable position relative to relay contacts, a deflection position relative to relay contacts, the second stable position, closing relay contacts, and a planar layout view of the structure, respectively.
Figure 14B:
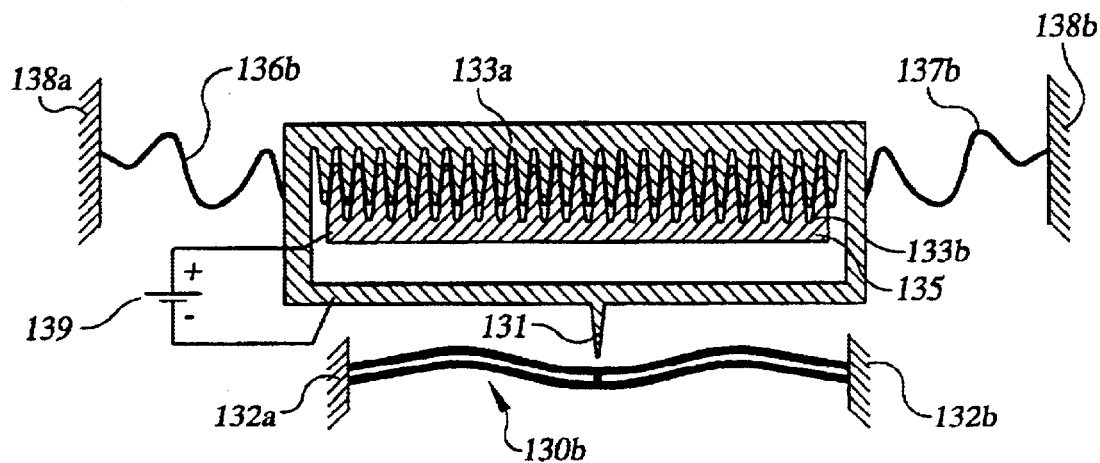
Figure 14C:
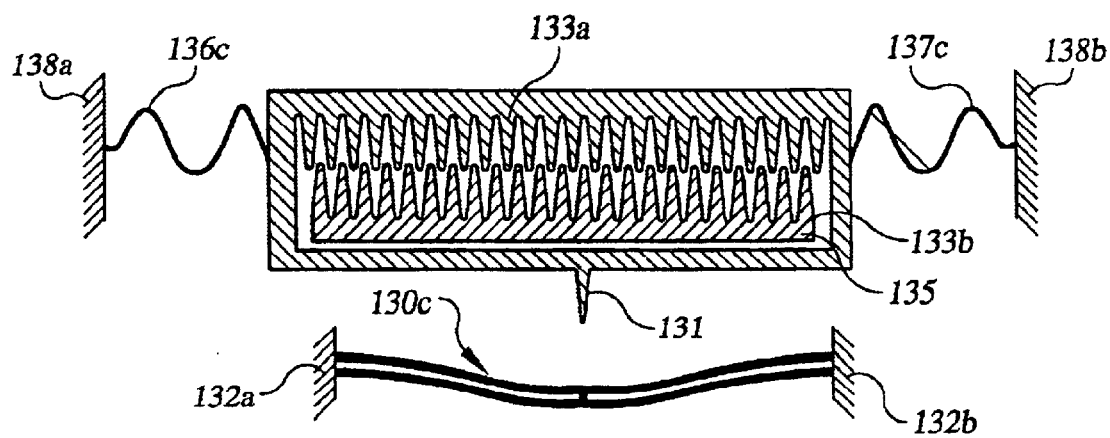

Turning to other bistable mechanism actuation configurations, FIGS. 14A–C are schematic views of a double beam structure of the invention here actuated by an electrostatic tapered comb drive actuator. As shown in FIG. 14A, the double beam structure is provided in an initially curved first stable position 130a that aids in prohibiting the second bending moment; a central clamp is also provided in the manner described above. Clamped boundary points 132a and 132b are provided for the structure. An electrostatic comb drive is provided adjacent to the double beam structure, with a fixed section 133b including an array of tapered teeth 134b. Mechanical grounding of this section is provided at a mechanical boundary 135. A moving section 133a of the comb drive is likewise provided with an array of tapered teeth 134b, but is supported by flexure beams in an initial configuration 136a 136b. A thin dielectric layer is preferably provided the facing edges of the two arrays of teeth 134a 134b, to guard against electrical shorting between the teeth when they make contact.

Referring to FIG. 14B, given that both comb drive sections are formed of an electrically conducting material, when a voltage 139 is applied to the taper comb drive, an electrostatic attractive force is generated between the two sets of comb drive teeth, causing the movable section 133a to move toward the fixed section 134b. The plunger 131 connected to the moveable section 133a moves in manner corresponding to the comb drive motion, and when positioned above the double beam structure as shown, will push the double beam structure downward into a deflected position 130b. Once the "snap-through" position of deflection is reached, the double beam structure will automatically move to its second stable position 130c shown in FIG. 14C. The voltage 139c an then be removed, releasing the comb drive structure back to its initial condition while the double beam structure maintains its second stable position. The double beam structure can be actuated back to its initial stable position 130a by employing a similar comb drive configuration as that shown, but located instead on the bottom side of the double beam structure.

Figure 14D:
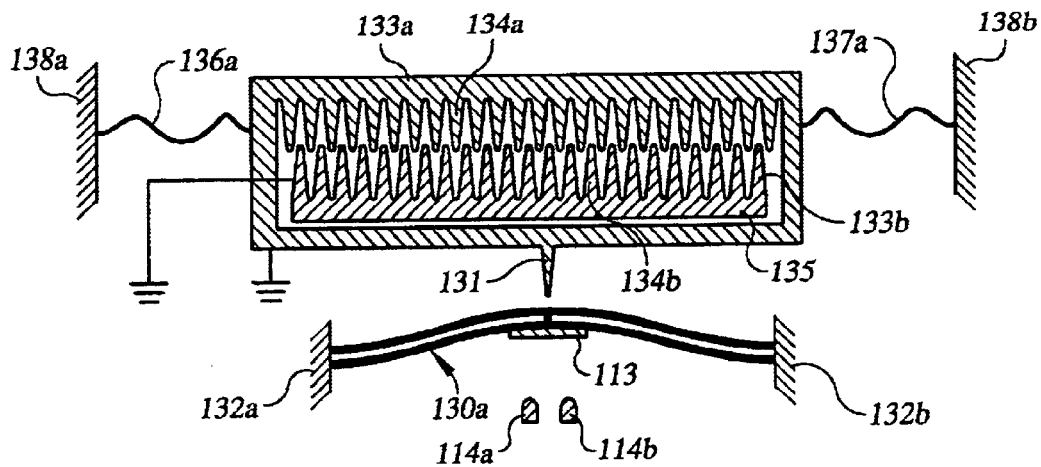
Figure 14E:
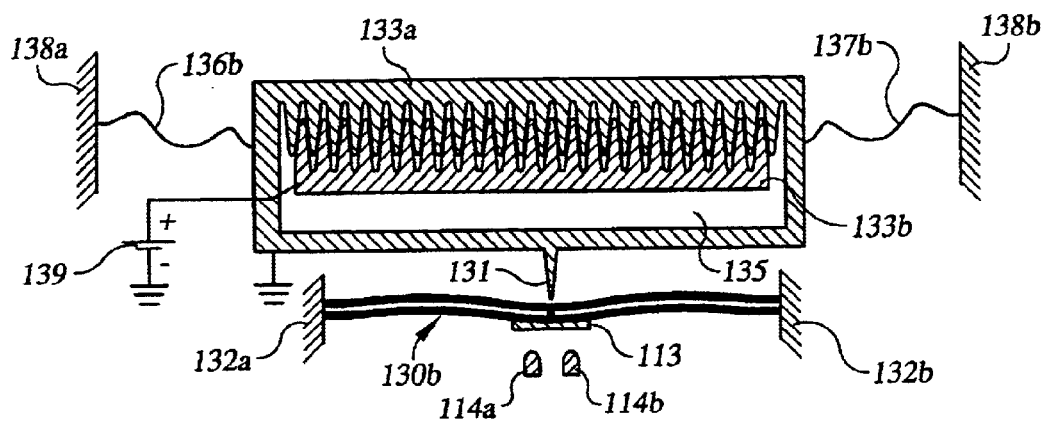
Figure 14F:
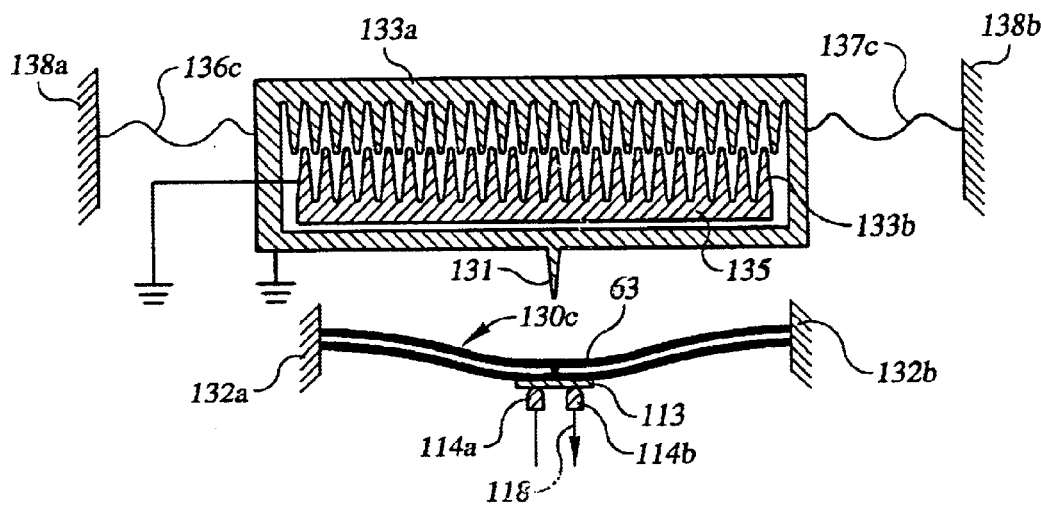

FIGS. 14D–F are schematic views of the double beam structure of FIGS. 14A–C, here employed as an electrical relay with the electrostatic comb drive of FIGS. 14A–C. In this application, the fixed section 135 of the comb drive is connected to electrical ground as shown. The moving section of the comb drive, in its initial position 133a is supported by flexure beams 136a, 136b, and is electrically grounded when the structure is not being electrostatically actuated. As in the examples described above, here the double beam structure is either provided itself as a conducting material or includes a metal layer 113 for conducting a working current 118 between two electrical contacts 114a, 114b, when the double beam structure is in its second stable position such that the relay is closed and "on." The double beam structure is shown in its initial, un-actuated position 130a in FIG. 14D. When a voltage 139 is applied to the fixed comb section 133b, then as in FIG. 14E the moving section of the comb drive 133a moves toward the fixed comb section, causing the double beam structure to deflect 130b. The relay is then turned "on" when the double beam structure "snaps-through" to its second stable position as shown in FIG. 14F.

Figure 14G:
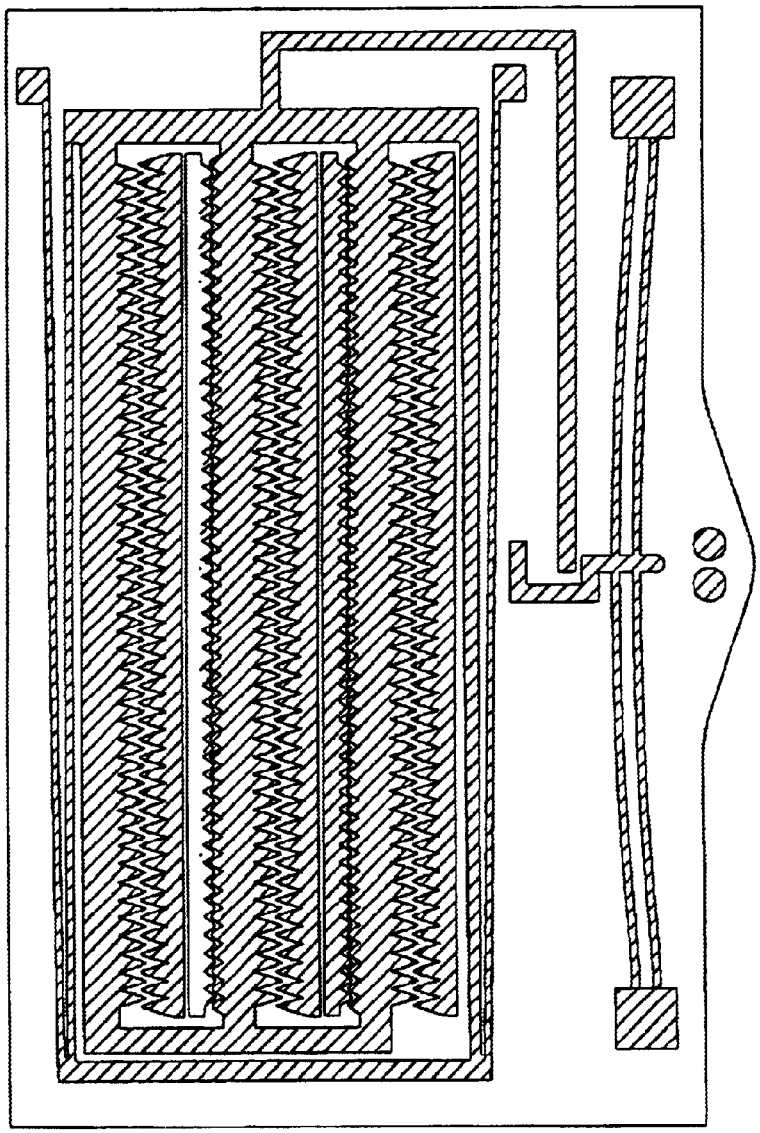

FIG. 14g is a schematic view of a comb drive actuation configuration 139 for a silicon double beam structure designed in accordance with the invention as a relay. In this further example design, note that an actuating arm is connected to the moveable section of the comb drive and extends to a mating feature connected to the double beam structure. Here multiple pairs of electrostatically-deflectable comb drive teeth are provided to increase the force of attraction between the fixed and moveable sections.

It is to be recognized that there is no requirement that the "on" position of a relay formed by a bistable structure of the invention be located at the second bistable position of the structure. Alternatively, the first bistable position of the structure can be configured as the "on" position of the relay. In addition, actuation mechanisms, optionally of varying type, can be provided on both sides of the bistable structure, in the manner described above, to enable the switching on and off of the relay.

Figure 15A:
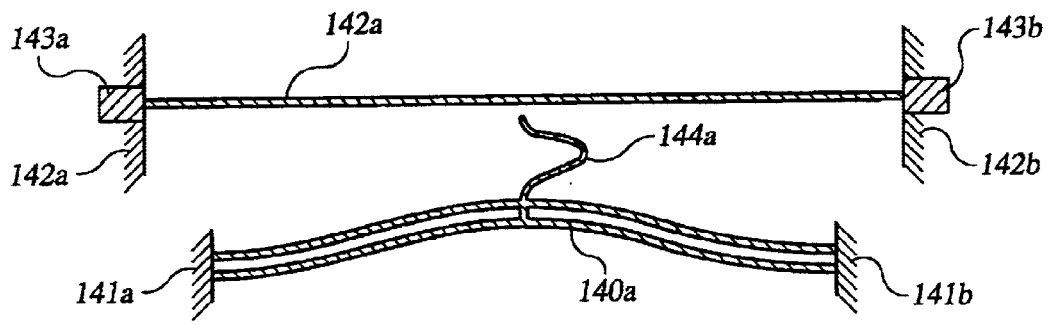
FIGS. 15A–15C are schematic views of a bistable double beam structure provided by the invention, actuated by a force applied from a thermally-buckled beam, in accordance with the invention, showing the initial unstressed stable position, a deflection position, and the second stable position, respectively.
Figure 15B:
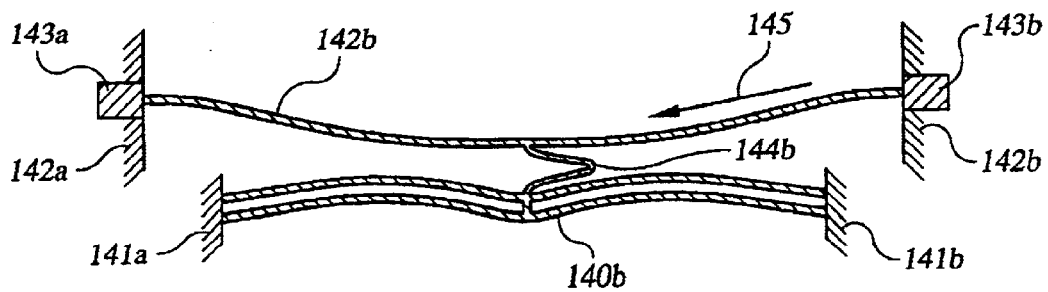
Figure 15C:
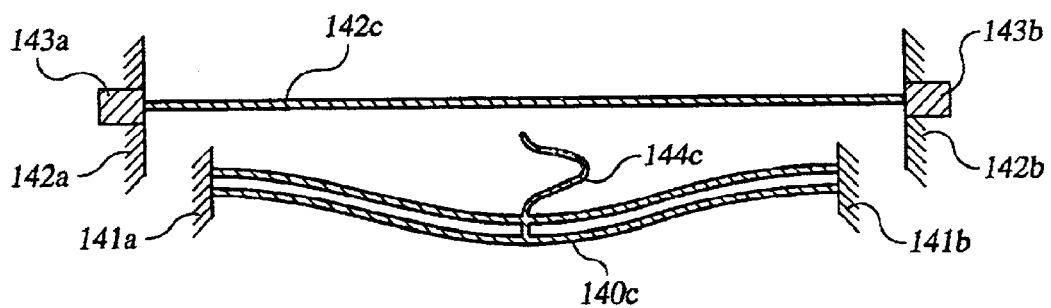

FIGS. 15A–15C are schematic views of an initially curved, unpreloaded double beam structure provided by the invention in a first stable position 140a, here actuated by a thermally buckled beam actuator. The figures show the initial as-fabricated position 140a of the structure, the position of the structure as it is being actuated 140b, and the second stable structural position 140c, respectively. The double beam structure has clamped boundaries 141a and 141b. An initially nearly straight actuation beam 142a is arranged adjacent to the double beam structure with clamped boundaries 142a and 142b. The actuation beam 142a is formed of electrically conducting material, or is provided with a layer of conducting material, and is electrically connected to the two electrical connection pads 143a and 143b. Connected to the center of the double beam structure and between the double beam structure and the actuation beam is a soft spring 144a.

To actuate the double beam structure, a current 145 is passed through the actuation beam 142a, causing the beam to thermally buckle to a buckled position 142b, due to thermally-induced stress. This buckling action in turn pushes the double beam structure to position 140b via the deflected soft spring 144b. Once the point of "snap-through" is reached, the double beam structure then automatically moves to its second stable position 140c. At this point, the actuation current 145 can be turned off, enabling the actuation beam to return to its initial condition, while the double beam structure maintains its second stable position. The double beam structure can then be actuated back to its initial stable position 140a by employing a similar thermally-buckled beam arrangement as 142a and soft spring 144a, on either side of the double beam structure, or other selected configuration.

Figure 16A:
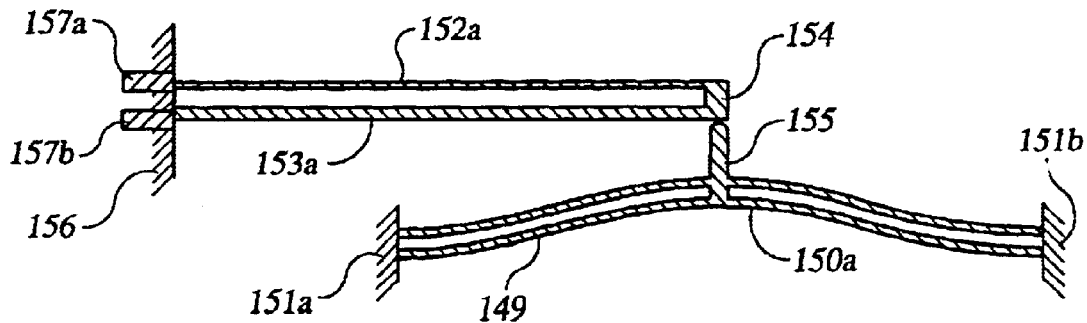
FIGS. 16A–16C are schematic views of a bistable double beam structure provided by the invention, actuated by a force applied from a thermally-controlled pseudo-bimorph mechanism, showing the initial unstressed stable position, a deflection position, and the second stable position, respectively.
Figure 16B:
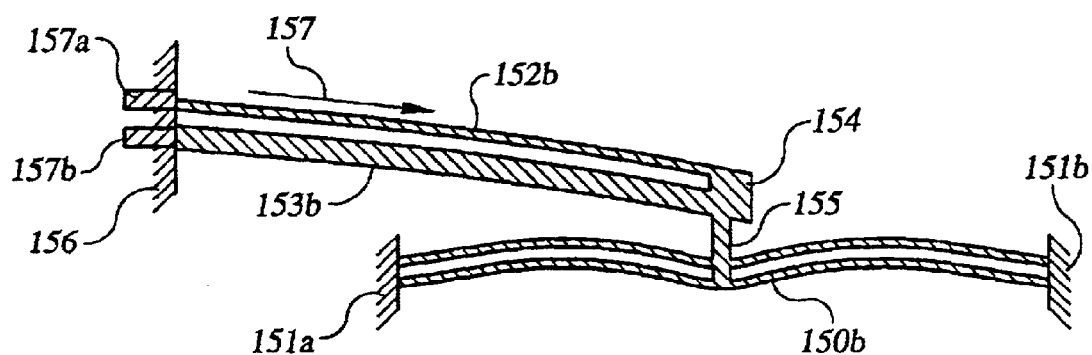
Figure 16C:
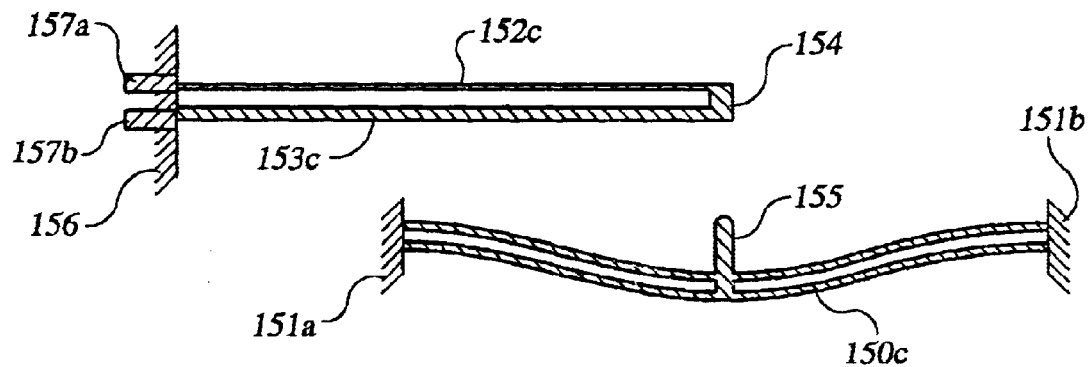

FIGS. 16A–16C are schematic views of a bistable structure provided by the invention, here also implemented as a double beam structure 149, actuated by a pseudo-bimorph configuration. Referring to FIG. 16A, the double beam structure is initial provided in a configuration 150a, that is a first stable position and that aids in prohibiting development of the second bending mode. The double beam structure has clamped boundaries 151a and 151b. A pseudo-bimorph actuator is arranged above the double beam structure. The actuator includes, e.g., a thin beam 152a and a thick beam 153a, here shown in initial positions, each beam being electrically conductive or having an electrically conductive layer thereon. Each of the beams are clamped at one end 156 and connected together at the other end by a connecting member 154. Provided at the center of the double beam structure between the double beam structure and the pseudo-bimorph actuator is a push bar 155.

Referring to FIG. 16B, to actuate the configuration, a current 157 is passed through the thin beam, the connecting member 154, and the thick beam via electrical contacts 157a, 157b. As current is passed through the structure, there is more heat generated in the thin beam than in the thicker beam, resulting in the two beams bending into bent configurations 152b, 153b. This cantilever bending action in turn pushes the push bar 155 of the double beam structure, producing the deflected position 150b of the double beam structure through the push bar 155, and enabling eventual "snap-through" of the double beam structure to the second stable position 150c, shown in FIG. 16C. At this point, the current 157 can be removed, whereby the actuator moves to rest positions 152c, 153c but the double beam structure remains in its second stable position. The double beam structure can then be actuated back to its initial stable position 150a with a similar pseudo-bimorph actuator configuration provided in appropriate relation to the structure.

An adaptation of this bimorph actuation configuration is shown in FIGS. 31–32. Here a double beam structure 410 is configured with mechanically clamped boundaries 412a, 412b. Two thermal actuator structures 400, 500 are provided for moving the double beam structure back and forth between its first and second stable positions; no additional actuator is required to move the structure from the second back to the first position. The first actuator 400 includes two beams 444a and 446a having a gap 445a between them and each mechanically clamped to an electrically isolated electrical pad 463a, 463b, respectively, and connected together at the other end 466a. Similarly, the second actuator 500 includes two beams 444b, 44b having a gap 445b between them and each mechanically clamped to an electrically isolated electrical pad 464a, 464b, respectively, and connected together at the other end 466b. All of the beams and their interconnections are electrically conductive or are provided with an electrically conductive layer.

An actuating post structure 462 is provided connected generally central to the double beam structure 410, and includes actuation push bars 461a, 461b for applying force and enabling actuation from the first to the second stable position, or from the second to the first stable position. More specifically, the two actuators 400, 500 are controlled to push on a selected one of the push bars 461a, 461b to push the double beam structure between its two stable positions. When the second actuator 500 is actuated, it pushes on a corresponding push bar 461b, causing the double beam structure to deflect from its first stable position 460a to its second stable position 460b. This action can be employed, e.g., to close contacts 510a and 510b of a relay. An electrically conducting layer is in this case to be provided on the corresponding side of the double beam structure, or the double beam structure is itself electrically conducting. Referring to FIG. 32, to return the double beam structure back to its first stable position, the first actuator 400 is actuated, pushing on the corresponding, opposite push bar 461a. When in its second stable position 460b, the double beam structure positions this push bar 461a adjacent to the first actuator 400, thereby automatically in-position for this actuation.

Like the example pseudo-bimorph actuation configuration of FIGS. 16A–C, the actuation configuration here relies on a difference in thermal expansion between the two beams of each of the two actuators 400, 500. This thermal expansion difference can be imposed by, e.g., a difference in beam cross section area, as in the example of FIGS. 16A–C, by different metallization resistivities on the two beams, or by other selected technique. For any of these configurations, when a current is passed through the two beams, one beam gets hotter than the other, and thus expands more. This difference in expansion causes the connected end of the two beams to move sideways towards the cold beam side, and thus to provide actuation force and displacement in that direction.

Considering the design of the actuator in more detail, the two outer beams 444a, 444b, are maintained relatively cold during actuation, while the inner beams 446a, 446b are maintained relatively hot. Then the actuators 400, 500 deflect toward the outer beams, enabling pushing on the corresponding push bar 461a, 461b. With this configuration, the two inner, hotter beams 446a, 446b can be provided with separate electrical contact pads 463b, 464b, as shown in FIG. 31, or they can share one pad. The two outer, colder beams 444a, 446b, each preferably are provided with separate contact pads 463a, 464a. During actuation, it is preferred that the positive potential of the voltage be applied to the center beam pad 463b or 464b, so that the thermal actuator tips, which will contact the push bar structure connected to the double beam structure, are at a low, or close-to-zero electrical potential.

It is recognized that due to reliance of this actuation mechanism on thermal heating, the efficiency of the thermal actuator may not be significantly high, but with design optimization, the efficiency can be sufficient for a wide range of applications. Both beam equation analysis and finite element analysis can be conducted to optimize the shape and configuration of the beams. For example, in the beam analysis, two beams can be first modeled separately as clamped-free beams. The beam tip axial, lateral, and rotational displacements are related to the tip force and moment by conventional beam equations. Then the force and moment relation and geometry compatibility at the connected beam tips can be modeled.

With these models, the mechanical behavior of the thermal actuator can be determined for a given thermal expansion difference between two adjacent beams. The equation array is a highly nonlinear one, due to the fact that an axially compressed, or tensioned, beam behaves in a nonlinear way; but with the model, the actuator configuration can be optimized as needed. For example, the shape and the thickness of the actuation beams can be optimized. The hotter beams 446a, 446b can be fabricated with holes there through, producing a truss-like structure that is mechanically equivalent to a solid beam, but requires much less energy to be heated. Further, the beams need not be of equal lengths. Similarly, the conductivity of the beams can be separately adjusted to achieve selected actuation voltage-current characteristics for a given application.

In optimization of the structure, it is to be recognized that the expansion of the beam that is maintained hotter, e.g., 446a, 446b, is constrained by the cold beam 444a, 446b, in the two actuators 400, 500, respectively. This constraint of the hotter beams produces compressive axial force inside the hotter beams. With this axial force, the centers of the hotter beams tend to bow toward the side opposite of the intended bending direction. If not well-controlled, this bowing behavior can significantly lower the effective expansion difference between the hot and cold beams and possibly prevent the thermal actuator from producing sufficient actuation displacement for a given application.

It is recognized that such bowing behavior can be reduced by providing the beams to all be made hotter with a thickness that is similar to the thickness of the beams to be maintained colder. As a result of this desirable design constraint, it is not for all applications preferable to produce the desired expansion difference by a difference in cross sectional area. An alternative technique that can be preferred for many applications is the selective metallization of the beams. For example, the beams to be maintained cooler can be provided with a metallization layer that is "better" than that provided for the beams to be maintained hotter.

It is further preferable to control the heating dynamics of the beam in an effort to maintain a maximum thermal expansion difference between hot and cold beams. Because the hotter and colder beams are connected together at their tips, heat flows from the hotter beams 446a, 446b to the colder beams 444a, 446b, and as a thermal equilibrium is reached between the beams, the expansion difference becomes smaller. To reduce this heat flow effect, it can be preferable to employ a relatively short heating and actuation time. Specifically, the materials and geometry of the beams are preferably selected such that sufficient heating can be achieved before a significant amount of heat can flow from the hot beam to the cold beam, whereby the actuator can complete the desired actuation cycle before thermal equilibrium is reached between the beams.

In an experimental example of this actuator optimization, a structure like that of FIGS. 31–32 was fabricated of silicon, with an actuator beam length of about 1.2 cm, a beam thickness of about 125 $\mu$m, a gap between two beams of about 50 μm, and a beam depth of about 300 μm. The two beams could be made of equal or unequal lengths. A layer of gold of about 1 μm in thickness was applied to the outer beams 444a, 446b, to enhance those beams' conductivity and hence reduce their temperature relative to the inner beams. It was found that hundreds of degrees of heat were required to cause actuation of the structure such that a peak force of ~10 mN and a peak displacement of ~200 μm could be produced. A heating period of about 2 ms was employed; during this time the heat could flow almost evenly through the depth of the beams. A period of about ~100 ms was required for the beams to cool down after a heating cycle.

Figure 33:
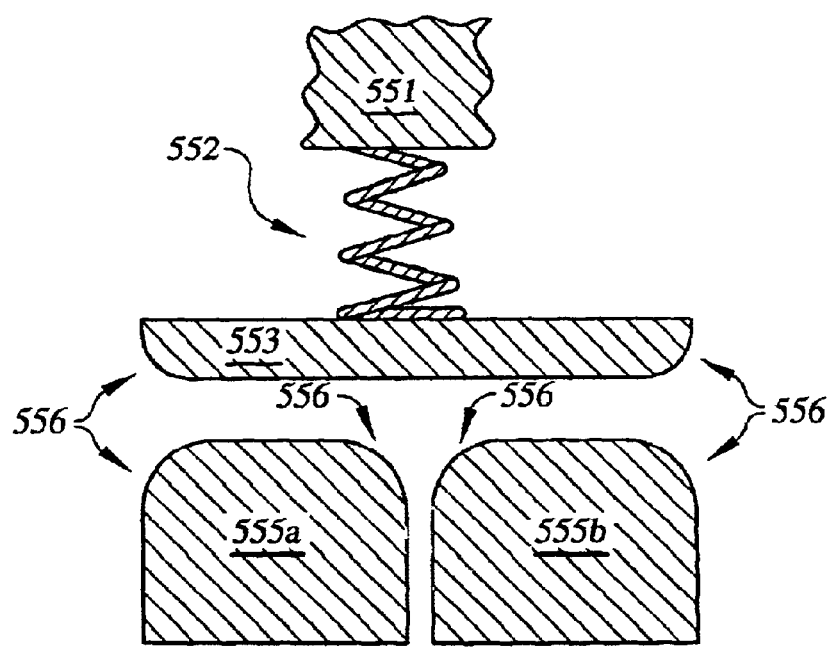
FIG. 33 is a schematic view of a relay contact configuration provided by the invention for use with a bistable structure of the invention.

The bistable beam actuation configuration of FIGS. 31–32 can be particularly advantageous for applications, such as electrical relays, in that only a single actuation structure, required on only on one side of the double beam structure, both opens and closes the relay. This actuation mechanism can be provided on the side opposite the relay contacts, thereby accommodating space for, e.g., electronics associated with the relay. Referring to FIG. 33, for many relay applications, it can be preferred to employ a relay contact configuration like that shown schematically in FIG. 33. Here are provided two relay contacts 555a and 555b separated across an actuation distance from a relay contact cross bar 553 attached to a soft spring 552. The spring 552 attached to the cross bar is in turn connected to an attachment region 551 of that beam in the double beam structure that is closest to the spring.

While the cross bar 553 can be attached to the bistable beam structure directly, this configuration may not be preferably for many applications in that manufacturing errors in the double beam structure geometry could result in uneven force contact of the cross bar with the relay contacts, producing a high contact resistance. The use of an intermediate soft spring attachment 552, as shown in the figure, can thus be preferable due to its ability to compensate for uneven geometric features in the double beam structure or the relay contacts. The spring is shown schematically in the figure as a coil spring, but as a fabricated structure it can be provided as, e.g., a cantilever beam, double beam, or other flexible structure. Because most fabrication processes produce some degree of sidewall taper through the thickness of the parts, it is preferred that the spring 552 be sufficiently compliant to accommodate out-of-plane angular errors in movement of the double beam structure.

Preferably the cross bar 553 is provided as a rigid flat, a rigid wedge, or a flexible flat, depending the contact profile desired for a given relay application. It is preferable to make empirical observations of the contact action to adjust the cross bar geometry as necessary to provide the type of contact needed with a minimum of resistance for a specified metallization, as well as to meet the required current, voltage, and frequency parameters of the relay application. A rigid and flat cross bar can be preferred for many applications in that, in conjunction with the soft spring, this configuration ensures balanced force on both of the relay contacts, a large contact area, and a short electrical path. A cross bar provided without the soft spring would not provide sufficient force balance for many applications. In addition, a non-flat cross bar could not be expected to provide as large a contact area and a flexible, flat cross bar would not likely provide as short an electrical path. It is preferable that the corners 556 of the cross bar and the relay contacts facing each other be rounded. This ensures contact at the flat sections as well as it reducing tendency of sparking between the cross bar and relay contacts.

Figure 17:
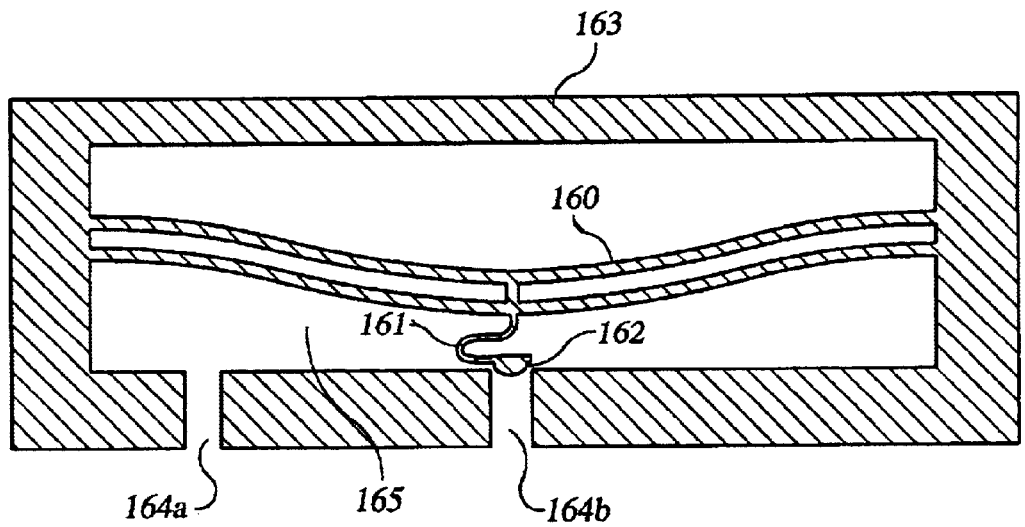
FIG. 17 is a schematic view of a bistable double beam structure provided by the invention employed in a configuration as a valve component.

Turning to other applications of the bistable structures of the invention, FIG. 17 is a schematic view of a bistable double beam structure here configured as a valve component. This figure illustrates a condition in which the double beam structure 160 is at its second stable position, and the valve is closed. Two fluid channels 164a and 164b, are provided into a cavity 165 which is sealed by a wall 163 as well as from top and bottom, in the plane of the page. The double beam structure 160 closes one channel 164b, by pushing a seal 162 against the channel opening through a soft spring 161. The channel thus can be opened and closed by the double beam structure being "snapped-through" between its initial first stable position and the second stable position by a suitable actuation mechanism such as the examples mechanisms described above.

Figure 18:
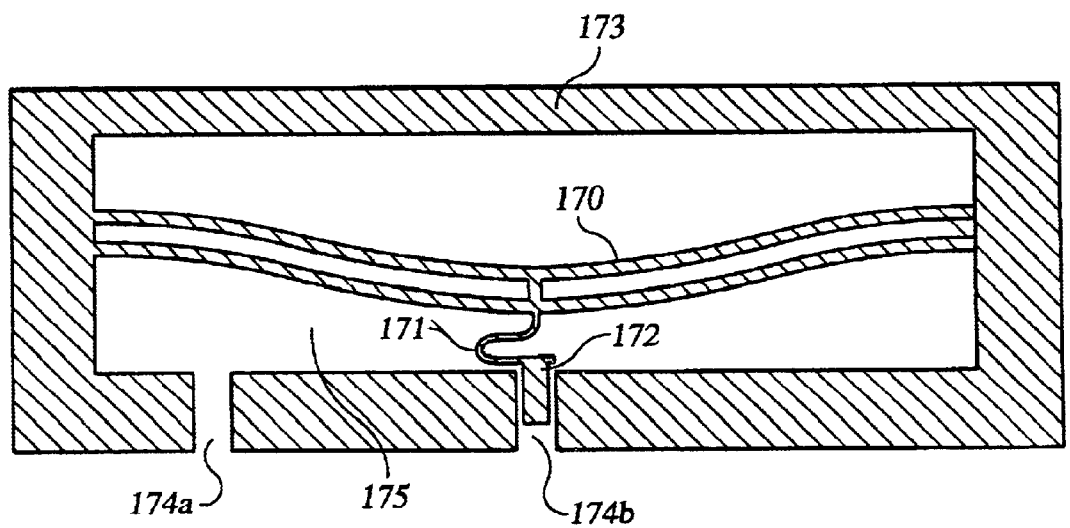
FIG. 18 is a schematic view of a bistable double beam structure provided by the invention employed in a configuration as a valve component, here as a threshold valve component.

FIG. 18 is a schematic view of a bistable double beam structure here configured as a threshold valve component. This figure illustrates a condition in which the double beam structure 170 is at the second stable position, and the valve is closed. Two fluid channels 174a and 174b, are provided into a cavity 175 which is sealed by a wall 173 as well as from top and bottom in the plane of the page. The double beam structure closes one channel 174b by pushing a plug 172 into the channel opening through a soft spring 171. Thus, as with the application of FIG. 17, here the channel can be opened and closed as the double beam moves between its first and second stable positions. The actuation mechanisms described above can here be employed for this actuated movement. In this particular application, when the difference in pressure between inside the cavity and outside the channel 174b, is sufficiently large, the double beam can be "snapped-through" to the opposite stable position, thus opening the valve automatically. This mode of operation can be particularly useful in enabling threshold valve operation.

Figure 19:
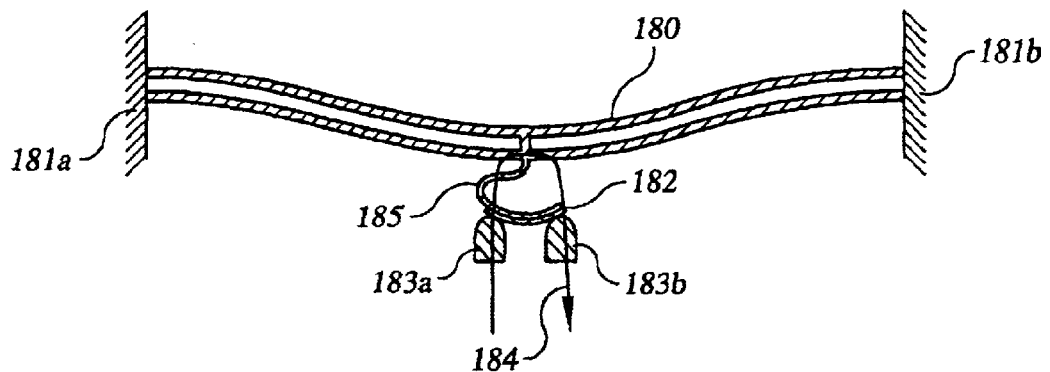
FIG. 19 is a schematic view of a bistable double beam structure provided by the invention employed as an electrical switch or memory cell component.

FIG. 19 is a schematic of a bistable double beam structure of the invention here configured as a switch or memory cell component. The figure illustrates a condition in which the double beam structure 180 is at its second stable position, and the current path is closed. Two electrical contacts 183a and 183b are provided. As in the relay application examples described above, a conducting layer 182 is provided on the double beam structure configuration, here on the bottom of a soft spring 185 connected at the clamping member of the structure, for conducting working current between the contacts. Alternatively the soft spring can itself be provided as electrically conducting.

The double beam structure closes the connection between the two contacts 183a and 183b by pushing the soft spring 185, with metal layer 182 coated on it, against the contacts. Thus a current 184 can flow between the contacts 183a 183b via the metal layer. The current path can be opened and closed with the double beam structure being "snapped-through" between the initial, as-fabricated position and the second stable position by a suitable actuation means such as those described above. The open and closed positions of the switch can be reversed from that shown in the figure. This design can be particularly advantageous when employed as, e.g., a component of a bistable electrical switch or alternatively, as a bistable memory cell, where electrical resistance represents a bit of information.

Figure 20:
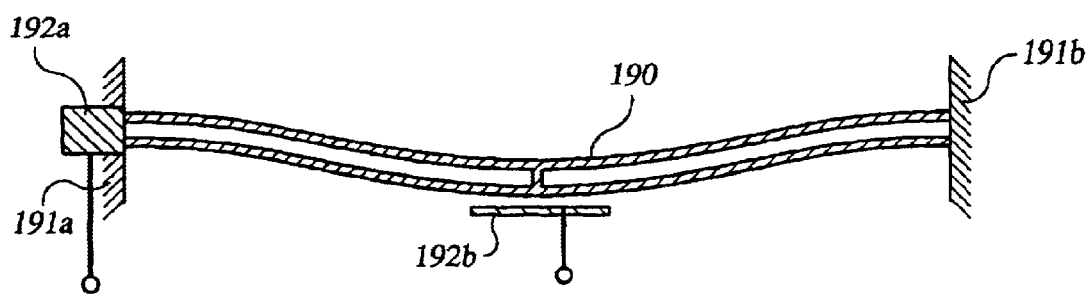
FIG. 20 is a schematic view of a bistable double beam structure provided by the invention employed as a capacitive memory cell component.

FIG. 20 is a schematic view of a bistable double beam structure provided by the invention, here configured as a memory cell component with capacitance measurement capabilities. The figure illustrates a condition in which the double beam structure 190 is at its second stable position, and the capacitance is high. Electrically conducting pads 192a and 192b form two plates of a capacitor; the double beam structure is here sufficiently electrically conducting that it forms an extension of the first conducting pad 192a.

The second pad 192b is positioned a distance from the double beam structure that is sufficient for defining two capacitances corresponding to the two bistable positions; it is this distance that defines the capacitive gap. When the double beam structure is deflected from its first stable position to the second stable position, the gap between the two capacitor plates 192a 192b is thereby reduced. This configuration thereby enables a two-state capacitive structure that can be mechanically actuated between capacitive states. Such a configuration can therefore be employed as component of a bistable memory cell, where capacitance represents a bit of information.

Figure 21:
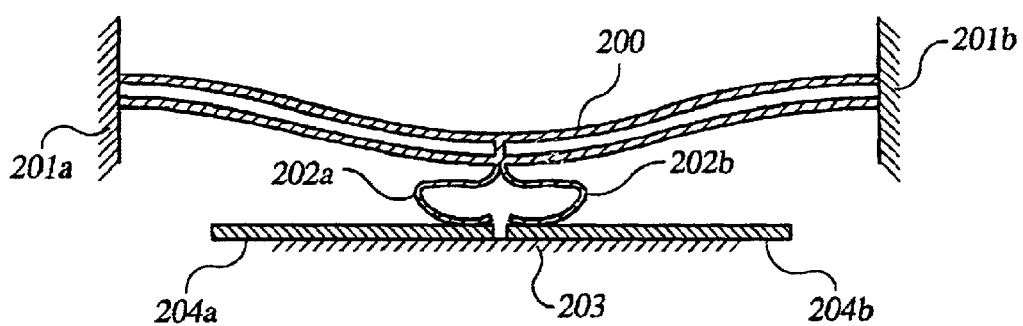
FIG. 21 is a schematic view of a bistable double beam structure provided by the invention employed as an optical fiber clipper component.

FIG. 21 is a schematic view of a bistable double beam structure provided by the invention, here configured as an optical fiber clip component. The figure illustrates a condition in which the double beam structure 200 is at its second stable position, and the clip is "on," clipping, i.e., holding, two optical fibers 204a and 204b, in place. When the double beam structure is actuated to deflect from its first stable position to its second stable position, the double beam structure pushes the fibers, through soft springs 202a and 202b, against a mechanical ground plane 203. The fibers can be locked and released into and out of position by actuating the double beam structure to "snap-through" between its initial, as-fabricated position and the second stable position by suitable actuation mechanisms like those described above. Such design can be particularly advantageous as component of a bistable micro clip for optical fibers or other components.

Turning now to example techniques for manufacturing the class of bistable structures of the invention, the structures can be produced of any suitable material or material composite that meets the requirements of the design analysis given above. For example, steel, aluminum, plastic, or other selected material or material combination can be employed. Conventional machining, extruding, three-dimensional printing, or other manufacturing technique can be employed. Whatever manufacturing technique is employed, it is required in accordance with the invention to produce the deflection region of the structure in one of its two stable positions as-fabricated.

It is found that many applications well-suited for the bistable structures of the invention are on the microscale, employing microelectromechanical systems, or MEMs. For such applications, it is preferred to micromachine the bistable structure of microelectronic materials and thus to employ microfabrication batch processing techniques. Silicon is an exemplary mechanical material that meets the requirements of the bistable structure design analysis while enabling the efficiencies of microfabrication.

In an example microfabrication process provided by the invention, the bistable structure and associated actuation mechanisms are etched into a selected substrate, e.g., a silicon wafer, in a specified one of the two stable positions of the structure, with the substrate then bonded to a handle substrate or other support structure, providing a mechanical anchor and a cavity for actuation. Metal coatings, interconnects, and input/output pads are then provided by application of a metal layer with, e.g., a shadow mask. With this fabrication, the substrate provides the mechanically constrained end points of the deflectable structure, such that the deflection of the structure is in the plane of the substrate.

Figure 34A:
FIGS. 34A–34O are schematic cross sectional views corresponding to a sequence of microfabrication process steps provided by the invention for microfabricating a bistable structure of the invention.
Figure 34B:
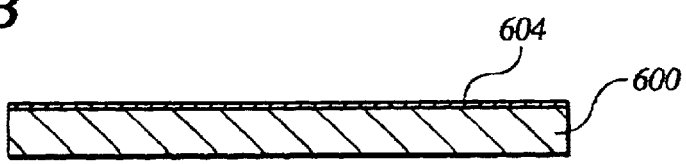

Referring to FIG. 34A, in an example of such a process, first the handle wafer 600 is prepared. The handle wafer can be provided as, e.g., a 4-inch diameter 7740 Pyrex™ wafer, having a thickness of about 500 $\mu$m, or as a 4-inch diameter silicon wafer or other suitable substrate. Because Pyrex™ is characterized by a relatively low Young's modulus, a silicon wafer can be more preferred for some applications. Preferably the handle wafer is first cleaned, e.g., employing a conventional piranha cleaning process for about 30 min. In the case of a Pyrex™ wafer, then a 50 Å-thick layer of titanium and a 300 Å-thick layer of chromium 604, or other selected materials, are evaporated or sputtered on the handle wafer, as in FIG. 34B. These metal layers are employed as a hard mask for etching the Pyrex™ handle wafer to form a cavity in one side of the handle wafer over which the bistable structures of the invention are suspended for actuation. If silicon is employed as a handle wafer, then a suitable etch mask material, such as oxide, nitride, or photoresist, is applied.

Figure 34C:
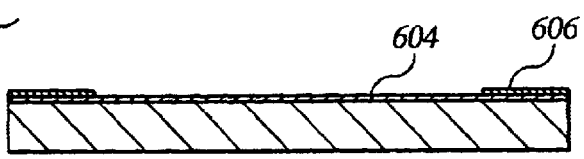
Figure 34D:
Figure 34E:
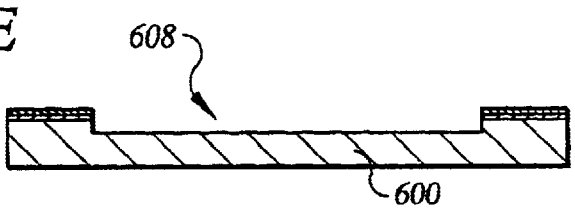

To complete the handle wafer etch process, photolithography and etching are first carried out to pattern the titanium and chromium or other selected hard mask layers. For example, a 40 $\mu$m-thick layer of AZ4620 photoresist can here be employed, preferably in two spin coats at about 1.5 krpm. After exposure and development of the masking pattern in the photoresist 606, as shown in FIG. 34C, the chromium and titanium, or other mask material, are etched with, e.g., CR-7 etchant or other suitable etchant, as in FIG. 34D. With the patterned hard mask in place, the handle wafer is then etched, e.g., a Pyrex™ wafer is etched in a liquid solution of 49% HF, and a silicon wafer can be etched in KOH or by a plasma etch process. An actuation cavity 608 produced by the etch, as shown in FIG. 34E, need not be more than about 100 $\mu$m in depth. With the cavity etch complete, the handle wafer is cleaned, e.g., in a conventional piranha cleaning process.

Figure 34F:

In the next phase of the fabrication, the device wafer 610 is processed, as shown in FIG. 34F. A very low resistance, p-type silicon wafer is preferred for device fabrication, because with such low resistance, the required actuation voltage is minimized. In addition, p-type, low resistivity silicon enables good ohmic contact with metal probes. In one example, a 4-inch diameter, p-type, <100> silicon wafer of about 300 $\mu$m in thickness and having a resistivity of about $1\times10^{16}$ cm$^{-3}$ is employed. The wafer is preferably double-side polished to enable device fabrication as well as fusion and/or anodic bonding.

Figure 34G:
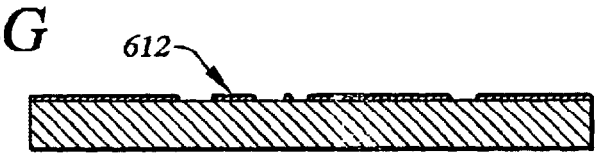
Figure 34H:

After a conventional cleaning process, the wafer is patterned and etched through its thickness to form the mechanical features of the bistable structure and associated actuation mechanisms. In one example process, an oxide hard mask and photoresist soft mask can be employed, e.g., AZ4620 photoresist 612 applied to the wafer at a thickness of between about 10 $\mu$m and 15 $\mu$m and photolithographically patterned, as shown in FIG. 34G, to define the bistable structure and associated features in a selected one of the two bistable positions of the structure as shown in FIG. 34H. The wafer is then etched through its thickness employing a suitable etch technique, e.g., deep reactive ion etching. For many applications, a plasma etch technique can be here preferred. The photoresist is then removed and the wafer cleaned. Upon completion of the etch process, the structure is formed in one of the two bistable positions of the structure; i.e., the initial curve of the structure selected for imposing bistability is provided with this etch step. No additional positioning or control is required to provide the structure in a stable position.

It can be preferred to control the etch mask as well as the etch process to produce fillets at locations where sharp corners could be formed in the bistable structure. The fillet features are found to effectively lower mechanical stress concentration at such corners. It can also be preferred to include a halo on the etch mask, so that the etch space is consistent across the mask. This can be particularly preferable for enabling a common etch rate at all locations across the mask. Finally, it can be preferred to employ a second etch step to smooth out sidewall surface roughness created by the deep reactive ion etch process. For example, a plasma etch process can here be employed. This technique is found to significantly increase the fracture stress of the structure. With the etch completed, the bistable structure is free to be actuated in the plane of the wafer.

Figure 34I:
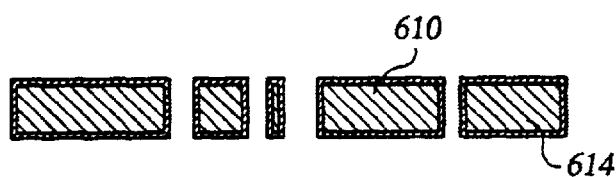

Referring to FIG. 34I, in a next optional but often preferred process step, an insulating layer 614 is provided; e.g., as a layer of about 0.2 $\mu$m in thickness of thermal oxide grown on all surfaces of the etched wafer, employing, e.g., an $O_2$, $O_2/H_2$ recipe. This oxide layer can be preferable for reducing arcing between structures during operation.

Figure 34J:
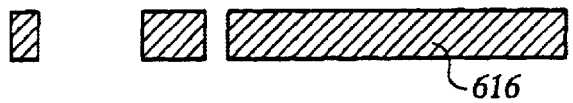

Referring to FIG. 34J, to enable patterned deposition of conducting regions on the bistable structure and associated mechanisms, it can be preferred to employ a shadow mask 616, formed, e.g., from a silicon wafer. In the production of such a mask, a silicon wafer, e.g., of 4-inch diameter, p-type, <100> orientation, having a resistivity of about $1\times10^{16}$ cm$^{-3}$ and a thickness of about 300 $\mu$m, is provided. After a conventional cleaning process, the shadow mask wafer is patterned and etched through its thickness in the manner described above, here for producing a selected shadow mask pattern.

Figure 34K:
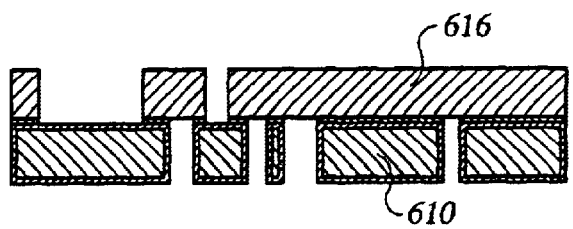
Figure 34L:
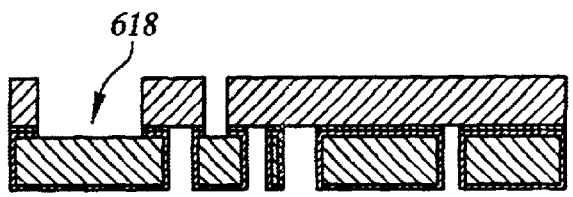
Figure 34M:

Referring to FIG. 34K, with the shadow mask 616 thus produced, the device wafer 610 is adhered to the shadow mask wafer. This can for many scenarios be accomplished simply by bringing the two wafers together; the attractive surface forces of the wafers are sufficient. Alternatively, dots of, e.g., photoresist, can be employed. Whatever technique is employed, preferably IR alignment marking is employed to ensure correct wafer alignment. Referring to FIG. 34L, with the shadow mask facing up, the oxide layer is then etched off of the device wafer in the regions 618 at which metal is to be deposited, e.g., with a directional plasma etch process; here the shadow mask wafer is employed as a handle wafer. A conventional piranha cleaning process is then employed to dismount the device wafer, strip the bonding photoresist layer, and clean the device wafer 610, as shown in FIG. 34M.

Figure 34N:
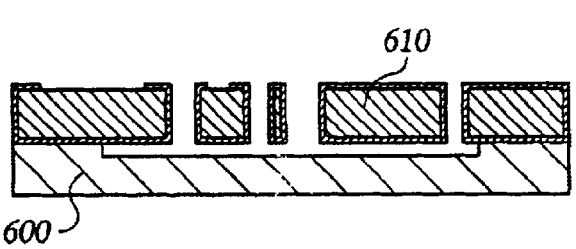

Referring to FIG. 34N, at this point, the device wafer 610 and handle wafer 600 can be bonded together. Both the device and handle wafers are preferably first cleaned, e.g., with a conventional piranha cleaning process. Then the two wafers are aligned, e.g., employing IR alignment marks. Anodic bonding of silicon and Pyrex™ wafers can be carried out, e.g., at a voltage of about 800 V and a temperature of about 400° C. Fusion bonding of two silicon wafers can be carried out in the conventional manner.

Figure 34O:
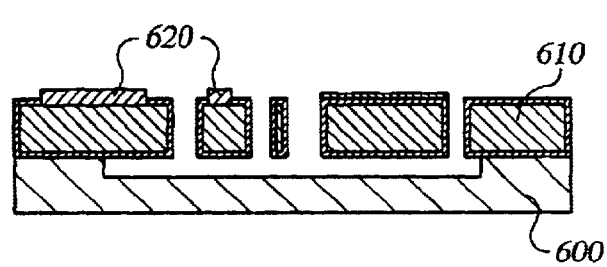

Referring to FIG. 34O, with the device and handle wafers bonded together, the shadow mask is then employed to provide metallization 620 of selected areas of the bistable structure. Preferably the regions to be metallized are well-cleaned prior to metallization such that good surface adhesion of the metallization is obtained; e.g., an ashing step can be here carried out to clean the wafer. Then metal is deposited by a suitable technique. In one example technique, chromium and gold layers are sputtered employing the shadow mask to define the metallization regions. With the metallization complete, the structure is ready for application as a bistable mechanism.

It is recognized in accordance with the invention that the mechanical characteristics of the fabricated structure can vary from fabrication run to run due, e.g., drift in fabrication process parameters and material properties. It is therefore preferred in accordance with the invention that the force-displacement characteristics of the fabricated structure be determined to verify its expected operation. In one particularly well-suited characterization technique, deflection of the fabricated structure in the plane of the substrate is transmitted to a compliant reference structure for measurement by displacement sensors. The compliant reference structure is calibrated such that the displacement measurement enables a determination of the corresponding force of the fabricated structure.

Based on the description and many examples provided above, it is clear that the class of bistable structures provided by the invention can address a very wide range of applications that require, or would benefit from, mechanical bistability, or mechanical memory. For example, relays for electrical signals or power can employ the bistable structure to maintain the open-circuit and/or closed-circuit connection of their contacts. Once the bistable structure is actuated from its first stable position to its second stable position, the contact connection or disconnection is maintained, even with the actuation stimulus removed. This property is particularly important in that it minimizes required actuation power and preserves an actuation state even in the event of loss of power.

The bistable structures of the invention are also well-suited for applications of mechanical memory. While such memory is generally larger than its more common electronic counterpart, mechanical memory has the advantage that it is radiation hardened, and therefore appropriate for some special purpose space-based or military applications. The bistable structures of the invention are also well-suited for valve applications. Just as a bistable structure could be employed to maintain and alter electrical contact connection and disconnection, the bistable structure can be employed as a poppet to open and close a valve. Here the advantages brought to electrical relay applications are brought to valve applications. Finally, one or more bistable structures could be employed as fastener clips to hold objects in place, for example to hold an optical fiber in correspondence with a microstructure or optical component. Alternatively, such fasteners could be used as interlocking fasteners of larger blocks.

The bistable structures provided by the invention generally are found to enable the ability to accurately and repeatable provide a prespecified amount of force and/or displacement, to produce, e.g., a prespecified position, volume, energy, or other parameter of the system. It is therefore to be recognized that the examples described above are not intended to be limiting but rather to present various alternatives in a wide range of operative configurations that are enabled by the invention.

Appendix A: MATLAB Bistable Structure Design

```
Q=6;
pnts=10;
%Defines how detailed do we calculate for the f-d curve maxj=10;
%Consider only the first 10 modes k=2;
Nk=4*pi;
%Assume the second mode is suppressed i=1;
% i is index for the data points for N=Nk*0.01:Nk*0.01+Nk/pnts:Nk*0.99
% this for loop is for when N is smaller than N2.
a=4/(2*pi)^2;
for j=1:maxj
a=a+4*(N^2-(2*pi)^2)^2/( ((2+4*j)*pi)^2 * ( N^2- ((2+4*j)*pi)^2 )^2 );
end b=-(2*pi)^2;

c=N^2*(N^2-(2*pi)^2)^2/(12*Q^2)-(2*pi)^2*(N^4-2*N^2*(2*pi)^2)/16;

Fl1(i)=-b/(2*a)+sqrt(b^2-4*a*c)/(2*a);
Fl2(i)=-b/(2*a)-sqrt(b^2-4*a*c)/(2*a);
%the above solves the F A0l1(i)=-(2*pi)^2/(2*( N^2- (2*pi)^2 ))+4*Fl1(i)/((2*pi)^2* (N^2- (2*pi)^2)
);
A0l2(i)=-(2*pi)^2/(2*( N^2- (2*pi)^2 ))+4*Fl2(i)/((2*pi)^2* (N^2- (2*pi)^2)
);
%the above solves for mode amplitude Ddl1(i)=1-2*A0l1(i);
Ddl2(i)=1-2*A0l2(i);
for j=1:maxj
A4jl1(i,j)=4*Fl1(i)/( ((2+4*j)*pi)^2 * ( N^2- ((2+4*j)*pi)^2 )^2 );

A4jl2(i,j)=4*Fl2(i)/( ((2+4*j)*pi)^2 * ( N^2- ((2+4*j)*pi)^2 )^2 );
```

```
Ddl1(i)=Ddl1(i)-2*A4jl1(i,j);
Ddl2(i)=Ddl2(i)-2*A4jl2(i,j);
end
% the above solves for Delta i=i+1;
end Akmax=sqrt(0.062-0.333/Q^2);

i=1;

a=0;
for j=0:maxj
a=a+4/( ((2+4*j)*pi)^2 * ( Nk^2- ((2+4*j)*pi)^2 )^2 );
end b=-(2*pi)^2/( Nk^2- (2*pi)^2 )^2;

for Ak=0:Akmax/pnts:Akmax
%this for loop is for when N=N2
c=Nk^2/(12*Q^2)-(2*pi)^2*(Nk^4-2*Nk^2*(2*pi)^2)/(16*( Nk^2- (2*pi)^2 )^2)
+Ak^2*Nk^2/4;

Fe1(i)=-b/(2*a)+sqrt(b^2-4*a*c)/(2*a);
Fe2(i)=-b/(2*a)-sqrt(b^2-4*a*c)/(2*a);
% the above solves for F A0e1(i)=-(2*pi)^2/(2*( Nk^2- (2*pi)^2 ))+4*Fe1(i)/((2*pi)^2* (Nk^2-
(2*pi)^2) );
A0e2(i)=-(2*pi)^2/(2*( Nk^2- (2*pi)^2 ))+4*Fe2(i)/((2*pi)^2* (Nk^2-
(2*pi)^2) );
% the above solves for mode amplitude Dde1(i)=1-2*A0e1(i);
Dde2(i)=1-2*A0e2(i);
for j=1:maxj
A4je1(i,j)=4*Fe1(i)/( ((2+4*j)*pi)^2 * ( Nk^2- ((2+4*j)*pi)^2 )^2 );
A4je2(i,j)=4*Fe2(i)/( ((2+4*j)*pi)^2 * ( Nk^2- ((2+4*j)*pi)^2 )^2 );
Dde1(i)=Dde1(i)-2*A4je1(i,j);
Dde2(i)=Dde2(i)-2*A4je2(i,j);
end
% the above solves for Delta
```

```
i=i+1;
end

Dd=[Ddl1 Ddl2 Dde1 Dde2];
F=[Fl1 Fl2 Fe1 Fe2];
% the above combines segments of f-d curve data points together

[Y,I]=sort(Dd);
Dd=Dd(I);
F=F(I);
% the above sort the data points so Delta is in a increasing order
```

Appendix B: MATLAB Thickness Optimization

```
%%%%%%%%%% opt.m : the entrance program %%%%%%%%%%%
%opt.m
%optimization routine
% uses eigenvalue solver
%
% optimizes ratio of lambda2/lambda1 global x0
global N
N=100
x0=0:1/N:1;

% set up beam thickness
t0=ones(N+1,1);
t0=t0*10;

dt0=deriv(x0,t0);
ddt0=deriv(x0,dt0);
tmin=0.5;
for i=1:80
   tos(i,:)=t0';
[m,b]=getmatrix(t0,dt0,ddt0);

[v,d]=eig(m,b);

[dd,id]=sort(abs(diag(d)));

%first mode
yy=v(:,id(3));

[w1,y1]=getval(yy);
w1psum=0;
for j=2:N
   w1psum=w1psum+(w1(j+1)-w1(j-1))^2/(x0(j+1)-x0(j-1))/2;
end
% second mode
yy=v(:,id(1));
[w2,y2]=getval(yy);
w2psum=0;
for j=2:N
   w2psum=w2psum+(w2(j+1)-w2(j-1))^2/(x0(j+1)-x0(j-1))/2;
end
```

```
dum=(y1'.^2/w1psum/dd(1)-y2'.^2/w2psum/dd(1)^2*dd(3)).*abs(t0-tmin);

del=dum/abs(max(dum))*0.04;
t0=t0+del;
t0=max(t0,tmin);
t0=project_vol(t0);
tt(i,:)=t0';

cost(i)=dd(3)/dd(1)
c1(i)=dd(1);
w1c(i,:)=w1;
c2(i)=dd(3);
w2c(i,:)=w2;
dt0=deriv(x0,t0);
ddt0=deriv(x0,dt0);
end % save solution.

% construct "lowest mode + derivatives"
yy=v(:,id(1));
[w0,y0]=getval(yy);

w0p=deriv(x0,w0);
w0ppp=deriv(x0,y0);
w0pppp=deriv(x0,w0ppp);

%%%%% deriv.m %%%%%%%
function dt=deriv(x,t)

n=size(t,1);
m=size(t,2);
n=max(n,m);
for i=2:n-1
    dt(i)=(t(i+1)-t(i-1))/(x(i+1)-x(i-1));
end
dt(1)=(t(2)-t(1))/(x(2)-x(1));
dt(n)=(t(n)-t(n-1))/(x(n)-x(n-1));

dt(1)=dt(2);
dt(n)=dt(n-1);

%%%%%% getmatrix.m %%%%%%%
```

```
function [m,b]=getmatrix(t0,dt0,ddt0)

%form eigenvalue problem for beam equation
% (Iw")" = -T w"
% use formulation: y=w";  (I y)" +T y= Iy"+2I'y'+I"y+ Ty=0
% number of grid points=N+1
% ordering (w_1,y_1,w_2,y_2,....w_N,y_N)
global N dx=1/N;
x0=0:1/N:1;
m=zeros(2*N+2,2*N+2);
b=m;
% left boundary:  w=w"=0
m(1,1)=1;
%clamp
m(2,2)=-1;
m(2,1)=-2/dx^2;
m(2,3)=2/dx^2;
b(2,2)=-0;
for i=2:N
   tx=t0(i);
   txp=dt0(i);
   txpp=ddt0(i);
   if i==2
      txpp=ddt0(3);
   end
   if i==N
      txpp=ddt0(N-1);
   end
   j=2*(i-1)+1;
   b(j+1,j+1)=-1;
   m(j,j)=-2/dx^2;
   m(j,j+2)=1/dx^2;
   m(j,j-2)=1/dx^2;
   m(j,j+1)=-1;
   m(j+1,j+1)=tx*(-2/dx^2)+txpp;
   m(j+1,j+3)=tx/dx^2+txp/dx;
   m(j+1,j-1)=tx/dx^2-txp/dx;
end
j=2*(N)+1
b(j+1,j+1)=-0;
m(j,j)=1;
% clamp
```

```
m(j+1,j+1)=-1;
m(j+1,j)=-2/dx^2;
m(j+1,j-2)=2/dx^2;

%%%%% getval.m %%%%%%%%%
function [w,y]=getval(yy)

j=1;
n=size(yy,1)
for i=1:n/2
   w(j)=yy(2*(i-1)+1);
   y(j)=yy(2*i);
   j=j+1;
end %%%%% project_vol.m %%%%%%%%%%
function out=project_vol(input)
% volume conservation
% preserve volume = \int (sqrt(I))=1
global x0;
n=size(input,2);

isqrt=input.^0.5;

integral=quad(@funct,0,1,1e-6,0,isqrt);

n=size(input,2);
out=input/integral^2;

function ll=funct(x,isqrt)
global x0;

ll=interp1(x0,isqrt,x);
%%%%%%%%%%%%%%%%%%%
```

We claim:

1. A bistable structure comprising:
 a deflection element including mechanically constrained end points and a compliant span between the end points that is substantially free to deflect between two stable positions when a force is applied to the span;
 wherein the deflection element span is provided, as-fabricated, curved in one of the two stable positions;
 wherein the as-fabricated curve of the deflection element span includes a curve maxima at a point along span length that is at least about ¼ of the span length from the end points of the span;
 wherein the deflection element span is characterized by a thickness that is modulated along the span; and
 wherein the deflection element span is configured to substantially prohibit development of a second bending mode that is characteristic for the span as the element deflects between the two stable positions.

2. The bistable structure of claim 1 wherein the deflection element comprises a beam.

3. The bistable structure of claim 1 wherein the deflection element comprises two beams connected together at a point along the spans of the beams by an interconnecting clamp that limits development of a second bending mode that is otherwise characteristic for the spans as the element deflects between the two stable positions.

4. The bistable structure of claim 1 wherein the deflection element comprises a plate constrained at its outside diameter.

5. The bistable structure of claim 1 wherein the deflection element comprises a diaphragm constrained at its outside diameter.

6. The bistable structure of claim 1 wherein the constrained end points of the span are rigidly constrained to prevent angular deflection.

7. The bistable structure of claim 1 wherein the constrained end points of the span are hinged to allow angular deflection.

8. The bistable structure of claim 1 wherein the constrained end points of the span comprises torsional spring elements.

9. The bistable structure of claim 1 wherein the span comprises aluminum.

10. The bistable structure of claim 1 wherein the span comprises silicon.

11. The bistable structure of claim 9 wherein the curve of the deflection element span corresponds to a lithographic mask defining the curve as-fabricated.

12. The bistable structure of claim 11 wherein the lithographic mask defines an etch mask pattern for etching the curve of the deflection element span.

13. The bistable structure of claim 1 wherein the curve of the deflection element span comprises a trajectory along the span length corresponding to a first bending mode characteristic for the span.

14. The bistable structure of claim 1 wherein the curve of the deflection element span comprises a trajectory along the span length defined as $$\frac{\bar{d}(1 - \cos(2\pi x/l))}{2},$$

where $\bar{d}$ is the curve maxima value and $x$ is the distance along the span length between 0 and $l$.

15. The bistable structure of claim 1 wherein the maxima of the curve of the deflection element span is located at substantially the center of the span.

16. The bistable structure of claim 1 further comprising a plurality of electrically conductive relay contacts disposed at positions that are separated from the deflection element by a separation distance selected such that an electrical connection is provided between the relay contacts when the deflection element is in one of the two stable positions.

17. The bistable structure of claim 16 wherein the electrical connection provided between the relay contacts comprises mechanical contact of each relay contact with an electrically conducting cross bar that is compliantly connected to the deflection element.

18. The bistable structure of claim 1 further comprising a force generation actuator including a mechanical force applicator that is disposed relative to the deflection element to apply a force to the deflection element span and that is connected to receive an electrical stimulus for applying the force.

19. The bistable structure of claim 18 wherein the electrical stimulus comprises an electrostatic actuation voltage.

20. The bistable structure of claim 18 wherein the electrical stimulus comprises a thermal actuation voltage.

21. The bistable structure of claim 1 wherein the modulated element thickness comprises a gradual variation in thickness lengthwise along the deflection element span.

22. The bistable structure of claim 21 wherein the gradual variation in thickness comprises a sinusoidal variation.

23. The bistable structure of claim 1 wherein the deflection element thickness modulation produces a ratio in force required to move from a first stable position to a second stable position and from the second stable position back to the first stable position that is less than 1.5.

24. The bistable structure of claim 4 wherein the deflection element comprises two plates connected together at a point between the plates by an interconnecting feature that limits development of a second bending mode that is otherwise characteristic for the plates as the element deflects between the two stable positions.

25. The bistable structure of claim 5 wherein the deflection element comprises two diaphragms connected together at a point between the diaphragms by an interconnecting feature that limits development of a second bending mode that is otherwise characteristic for the diaphragms as the element deflects between the two stable positions.

26. The bistable structure of claim 1 wherein the span comprises a material characterized by a constant Young's modulus, obeying Hooke's Law.

27. The bistable structure of claim 1 wherein the span comprises a microelectronic material.

28. The bistable structure of claim 1 wherein the span is configured to support passage of an electrical current along the span in a direction corresponding to an applied magnetic field for generating a magnetic deflection force on the deflection element.

* * * * *